(12) United States Patent
Fujii et al.

(10) Patent No.: US 8,083,956 B2
(45) Date of Patent: Dec. 27, 2011

(54) DISPLAY DEVICE AND METHOD FOR MANUFACTURING DISPLAY DEVICE

(75) Inventors: Gen Fujii, Kanagawa (JP); Erika Takahashi, Kanagawa (JP); Erumu Kikuchi, Kanagawa (JP); Sachiko Kawakami, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 455 days.

(21) Appl. No.: 12/246,947

(22) Filed: Oct. 7, 2008

(65) Prior Publication Data

US 2009/0096364 A1    Apr. 16, 2009

(30) Foreign Application Priority Data

Oct. 11, 2007    (JP) .................................. 2007-265334

(51) Int. Cl.
*H01L 21/302* (2006.01)
(52) U.S. Cl. ................ 216/24; 216/83; 438/29; 438/70; 438/700
(58) Field of Classification Search .......................... None
See application file for complete search history.

(56) References Cited

U.S. PATENT DOCUMENTS

| | | | |
|---|---|---|---|
| 7,115,434 B2 | 10/2006 | Yamazaki et al. | |
| 7,192,859 B2 | 3/2007 | Yamazaki et al. | |
| 7,226,819 B2 | 6/2007 | Maekawa et al. | |
| 7,273,773 B2 | 9/2007 | Yamazaki et al. | |
| 7,332,432 B2 | 2/2008 | Nakamura et al. | |
| 7,365,805 B2 | 4/2008 | Maekawa et al. | |
| 7,417,373 B2 | 8/2008 | Yamazaki | |
| 7,879,390 B2 * | 2/2011 | Salleo et al. | 427/162 |
| 2005/0043186 A1 | 2/2005 | Maekawa et al. | |
| 2005/0158665 A1 * | 7/2005 | Maekawa et al. | 430/313 |
| 2005/0202348 A1 * | 9/2005 | Nakayama et al. | 430/311 |
| 2006/0040435 A1 | 2/2006 | Morisue et al. | |
| 2006/0121745 A1 | 6/2006 | Fujii | |
| 2006/0158482 A1 | 7/2006 | Nakamura et al. | |
| 2006/0166411 A1 | 7/2006 | Morisue et al. | |
| 2007/0066078 A1 * | 3/2007 | Kugler et al. | 438/716 |
| 2007/0196962 A1 | 8/2007 | Morisue et al. | |
| 2007/0264899 A1 * | 11/2007 | Kumagai | 445/24 |
| 2008/0099878 A1 | 5/2008 | Yukawa et al. | |
| 2009/0008667 A1 * | 1/2009 | Fujii et al. | 257/98 |
| 2009/0072225 A1 * | 3/2009 | Koo et al. | 257/40 |
| 2009/0101892 A1 * | 4/2009 | Dimitrakopoulos et al. | 257/40 |
| 2009/0109388 A1 * | 4/2009 | Takahashi et al. | 349/126 |
| 2011/0014389 A1 * | 1/2011 | Ito | 427/535 |

FOREIGN PATENT DOCUMENTS

| | | |
|---|---|---|
| EP | 1 793 650 A2 | 6/2007 |
| EP | 0 989 778 B1 | 9/2008 |
| JP | 2000-353594 | 12/2000 |

* cited by examiner

*Primary Examiner* — Anita Alanko
(74) *Attorney, Agent, or Firm* — Husch Blackwell LLP

(57) ABSTRACT

To provide a display device with higher image quality and reliability or a large-sized display device with a large screen at low cost with high productivity. A function layer (such as a coloring layer or a pixel electrode layer) used in the display device is formed by discharging a liquid function-layer-forming material to an opening formed with a layer including a first organic compound which has a C—N bond or a C—O bond in the main chain as a base and a layer including a second organic compound as a partition. The fluorine density exhibiting liquid repellency to the liquid function-layer-forming material, which is attached to a surface of the layers including organic compounds, is controlled, whereby a liquid repellent region and a lyophilic region can be selectively formed.

20 Claims, 20 Drawing Sheets

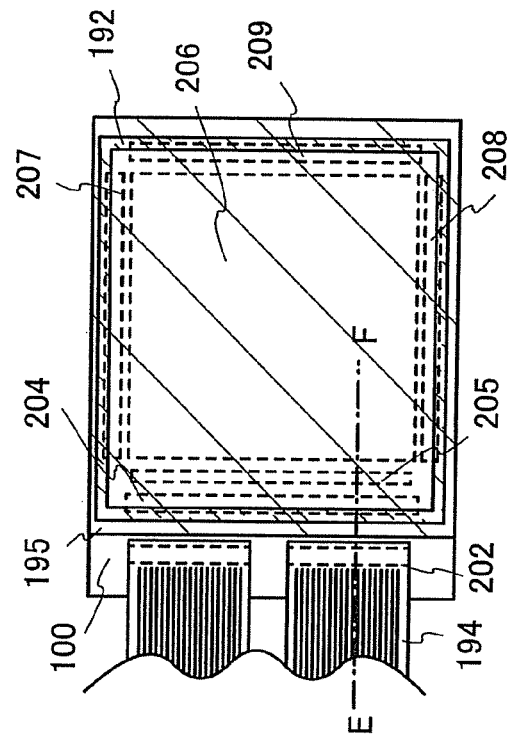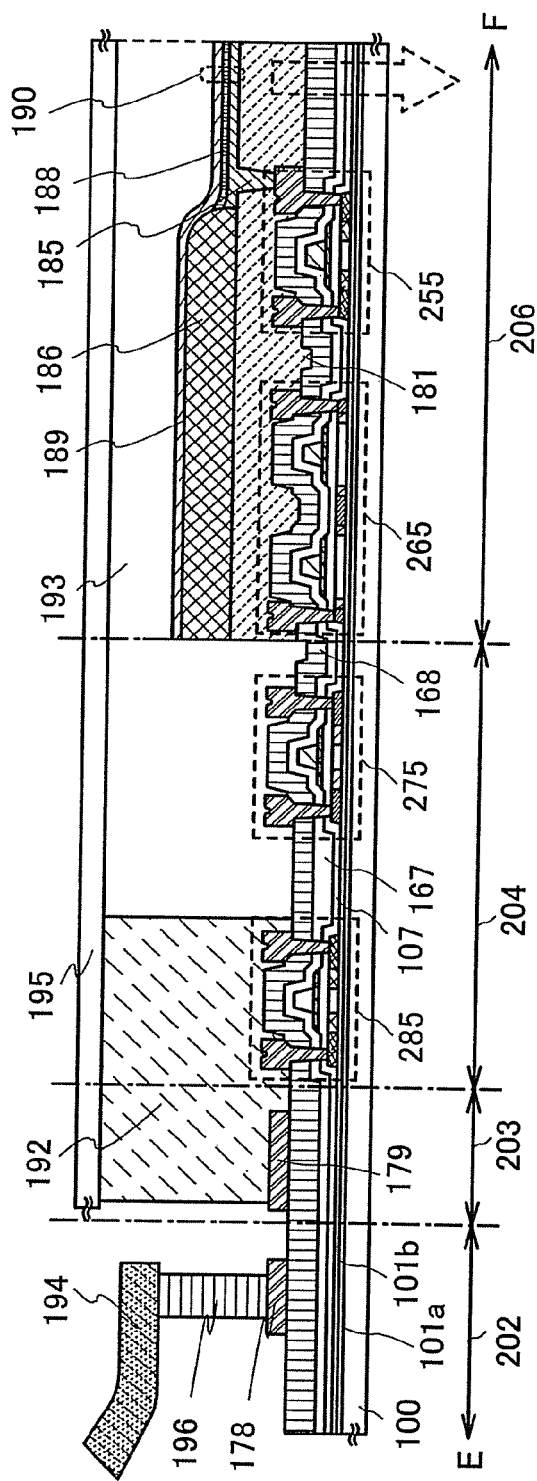
FIG. 9A
FIG. 9B

DISPLAY DEVICE AND METHOD FOR MANUFACTURING DISPLAY DEVICE

BACKGROUND OF THE INVENTION

1. Field of the Invention

The present invention relates to a display device which has a display element and a method for manufacturing the display device.

2. Description of the Related Art

When a function layer such as a color filter used in a display device is formed by an inkjet method, a liquid repellent region and a lyophilic region, where modification treatment is performed with respect to a thin-film material liquid are used in a region where a thin film is to be formed in order to make the thin film have a high definite micropattern.

For example, a bank which is a partition member of the thin film has a stacked structure of a bank formed of an inorganic material and a bank formed of an organic material, and only a surface of the bank formed of an organic material is made to have liquid repellency by plasma treatment using a fluorine-based gas, whereby a liquid repellent region and a lyophilic region with respect to the thin-film material liquid are formed (for example, see Reference 1: Japanese Published Patent Application No. 2000-353594).

SUMMARY OF THE INVENTION

However, in order to perform liquid repellent treatment by the above method, a large expensive vacuum apparatus is necessary. Further, in the case where a lyophilic region is formed using a bank formed of an inorganic material, an inorganic film that forms a bank is required to be formed in accordance with the thickness of a thin film to be formed. However, in the case where a thin film with a thickness of several micrometers, such as a color filter is formed, there is a problem in that a long time is needed for formation of an inorganic film and an etching process, which is not practical.

Accordingly, it is an object of the present invention to form a thin film having a variety of functions by forming a modified region selectively and by forming a lyophilic region and a liquid repellent region each having a desired shape without using an expensive vacuum apparatus.

It is another object of the present invention to provide a display device with high image quality and reliability or a large-sized display device with a large screen at low cost with high productivity.

A thin film (referred to as a function layer) having a variety of specific functions, such as a coloring layer or a pixel electrode layer, used in a display device is formed using a liquid composition including a function-layer-forming material by a wet process. Since the liquid composition including a function-layer-forming material has fluidity, the liquid composition is discharged to an inner side of a partition (also called a bank) which is provided to surround a region where a function layer is to be formed so that the inner side will be filled with the composition. Then, the liquid composition is solidified by drying and baking, whereby a function layer is formed.

The region where the composition including a function-layer-forming material is discharged includes a base region of an opening and a partition region surrounding the opening. Liquid repellent treatment is performed so that the partition region can have higher liquid repellency to the composition including a function-layer-forming material than the base region of the opening. This liquid repellent treatment is performed so that a function layer can be formed at a desired region in the opening without the function-layer-forming material flowing over the partition and flowing out to the outside of the region where a function layer is to be formed.

In the present invention, the base of the opening and the partition surrounding the opening are formed using two kinds of layers including organic compounds, the level (height and lowness) of liquid repellency of which can be varied to at least the function-layer-forming material. The control of the liquid repellency to the liquid function-layer-forming material can be performed by controlling the fluorine density exhibiting liquid repellency to the liquid function-layer-forming material which is attached to surfaces of the layers including organic compounds.

The fluorine density can be controlled depending on solubility of an oxide layer to an organic solvent after formation of a carbon fluoride layer. The higher solubility of the oxide layer is, the more easily the oxide layer is removed together with the carbon fluoride layer, and as the thickness of the oxide layer is decreased, the fluorine density is reduced.

In liquid repellent treatment of the present invention, an ultraviolet-ray irradiation step in the oxidative atmosphere, a carbon-fluoride-layer formation step, and a washing step using an organic solvent are performed on the layers including organic compounds.

When a carbon fluoride layer which includes fluoride exhibiting liquid repellency to the layers including organic compounds is formed, the carbon fluoride layer is provided over an oxide layer that is formed by oxidizing surfaces of the layers including organic compounds.

The oxide layer is formed by irradiating the layers including organic compounds with an ultraviolet ray in the atmosphere containing oxygen and by oxidizing the surfaces of the layers including organic compounds. In the organic compound which has a carbon-nitrogen (C—N) bond or a carbon-oxygen (C—O) bond in the main chain, bonds at the C—N bond or the C—O bond are divided by ultraviolet-ray irradiation, and an oxide layer of low molecules with a molecular weight of about 100 to 10000 is formed. In that case, the carbon fluoride layer is formed over the oxide layer of low molecules formed on the surface of the layer including an organic compound.

Since the oxide layer on the surface of the organic compound which has a carbon-nitrogen (C—N) bond or a carbon-oxygen (C—O) bond in the main chain has low molecules, it is possible to remove the oxide layer together with the carbon fluoride layer in the washing step using an organic solvent, so that the fluorine density of the surface of the layer including an organic compound which has a C—N bond or a C—O bond in the main chain can be reduced, and the surface can have a lyophilic property.

Accordingly, as the liquid repellency treatment of the present invention, with use of layers including organic compounds provided with, on their surfaces, oxide layers having different solubility to the organic solvent, regions having different liquid repellency to each other can be formed, and liquid repellency can be controlled.

Accordingly, when the liquid repellent treatment is performed using a layer including a first organic compound for a base of an opening and a layer including a second organic compound for a partition, regions which have different levels of liquid repellency to a composition including a function-layer-forming material can be selectively formed. The layer including a first organic compound is provided with, on its surface, an oxide layer having high solubility to an organic solvent, and the layer including a first organic compound has a carbon-nitrogen (C—N) bond or a carbon-oxygen (C—O) bond in the main chain.

Note that in this specification, in the case of comparing two or more kinds of regions, a region having lower liquid repellency is called a lyophilic region to a region having higher liquid repellency. In this specification, an opening includes a base of the opening and side surfaces of partitions.

Among oxide layers formed by irradiation with an ultraviolet ray in the atmosphere containing oxygen, the oxide layer on the surface of the layer including a first organic compound which has a carbon-nitrogen (C—N) bond or a carbon-oxygen (C—O) bond in the main chain has higher solubility to an organic solvent than the oxide layer on a surface of the layer including a second organic compound.

Further, after the liquid repellent treatment, the thickness of the oxide layer provided on the surface of the layer including a first organic compound which has a carbon-nitrogen (C—N) bond or a carbon-oxygen (C—O) bond in the main chain is smaller than the thickness of the oxide layer provided on the surface of the layer including a second organic compound.

When the liquid composition including a function-layer-forming material is discharged to the opening that is subjected to the liquid repellent treatment selectively in such a manner, the lyophilic region at the base of the opening is filled with the composition, and the composition does not flow over the partition that is the liquid repellent region and does not flow out to the outside of the region where a function layer is to be formed. Thus, a function layer can be formed at a desired region where a function layer is to be formed in the opening.

Accordingly, a liquid repellent region can be selectively formed without using an expensive vacuum apparatus. Since both the liquid repellent region and the lyophilic region can be formed using organic materials, the thickness of the regions can be easily increased, and processability is favorable. Therefore, the range of selection of shapes of the liquid repellent region and the lyophilic region are expanded, so that a function layer having a variety of functions can be formed with high controllability.

Since expensive facilities such as a large vacuum apparatus can be reduced and a function layer having functionality used for a display element can be manufactured using a wet process, material use efficiency is higher, and reduction in cost and high productivity can be achieved. Thus, according to the present invention, highly reliable display devices and electronic devices can be manufactured at low cost with improved productivity.

One aspect of a display device of the present invention includes a layer including a first organic compound, a layer including a second organic compound which has an opening over the layer including the first organic compound, and a function layer in the opening. The function layer and the layer including the second organic compound are contacted with a carbon fluoride layer interposed between the function layer and the layer including the second organic compound. The first organic compound has a carbon-nitrogen bond or a carbon-oxygen bond is included in a main chain.

Another aspect of a display device of the present invention includes a layer including a first organic compound, a layer including a second organic compound which has an opening over the layer including the first organic compound, and a function layer in the opening. The function layer, and the layer including the first organic compound and the layer including the second organic compound are contacted with a carbon fluoride layer interposed between the function layer, and the layer including the first organic compound and the layer including the second organic compound. The first organic compound has a carbon-nitrogen bond or a carbon-oxygen bond in the main chain. In the carbon fluoride layer, a fluorine density of a region provided over the layer including the first organic compound is lower than a fluorine density of a region provided over the layer including the second organic compound.

In the above structure of another aspect of a display device of the present invention, a first oxide layer is provided between the layer including the first organic compound and the carbon fluoride layer, and a second oxide layer is provided between the layer including the second organic compound and the carbon fluoride layer.

An aspect of a method for manufacturing a display device of the present invention includes the following steps of: forming a layer including a first organic compound; forming a layer including a second organic compound which has an opening over the layer including the first organic compound; irradiating the layer including the first organic compound and the layer including the second organic compound with an ultraviolet ray in an atmosphere containing oxygen; forming a carbon fluoride layer over the layer including the first organic compound and the layer including the second organic compound which have been irradiated with the ultraviolet ray; removing the carbon fluoride layer over the layer including the first organic compound by using an organic solvent; and discharging a composition including a function-layer-forming material to the opening, so that a function layer is formed. The first organic compound has a carbon-nitrogen bond or a carbon-oxygen bond in a main chain.

Another aspect of a method for manufacturing a display device of the present invention includes the following steps of: forming a layer including a first organic compound; forming a layer including a second organic compound which has an opening over the layer including the first organic compound; irradiating the layer including the first organic compound and the layer including the second organic compound with an ultraviolet ray in an atmosphere containing oxygen, whereby an oxide layer is formed over the layer including the first organic compound and the layer including the second organic compound; forming a carbon fluoride layer over the oxide layer; removing the oxide layer and the carbon fluoride layer over the layer including the first organic compound by using an organic solvent; and discharging a composition including a function-layer-forming material to the opening, so that a function layer is formed. The first organic compound has a carbon-nitrogen bond or a carbon-oxygen bond in a main chain.

Another aspect of a method for manufacturing a display device of the present invention includes the following steps of: forming a layer including a first organic compound; forming a layer including a second organic compound which has an opening over the layer including the first organic compound; irradiating the layer including the first organic compound and the layer including the second organic compound with an ultraviolet ray in an atmosphere containing oxygen; forming a carbon fluoride layer over the layer including the first organic compound and the layer including the second organic compound, which have been irradiated with the ultraviolet ray; removing the carbon fluoride layer selectively by using an organic solvent, so that in the opening, a surface of the layer including the second organic compound has higher liquid repellency than a surface of the layer including the first organic compound; and discharging a composition including a function-layer-forming material to the opening, so that a function layer is formed. The first organic compound has a carbon-nitrogen bond or a carbon-oxygen bond in a main chain.

Another aspect of a method for manufacturing a display device of the present invention includes the following steps of: forming a layer including a first organic compound; forming a layer including a second organic compound which has an opening over the layer including the first organic compound; irradiating the layer including the first organic compound and the layer including the second organic compound with an ultraviolet ray in an atmosphere containing oxygen, whereby an oxide layer is formed over the layer including the first organic compound and the layer including the second organic compound; forming a carbon fluoride layer over the oxide layer; removing the oxide layer and the carbon fluoride layer selectively by using an organic solvent, so that in the opening, a surface of the layer including the second organic compound has higher liquid repellency than the layer including the first organic compound; and discharging a composition including a function-layer-forming material to the opening, so that a function layer is formed. The first organic compound has a carbon-nitrogen bond or a carbon-oxygen bond in a main chain.

As the organic solvent, alcohol or the like can be used.

As described above, a thin film having functionality can be formed by a wet process using the function-layer-forming material which is dissolved as a liquid composition, in a solvent. In the wet process, a material that is to form a thin film is dissolved in a solvent, the liquid composition is attached to a region where a function layer is to be formed, the solvent is removed, and the resulting material is solidified, whereby the thin film is formed. In this specification, solidification refers to elimination of fluidity to keep a fixed shape.

For the wet process, any of the following methods can be employed: a spin coating method, a roll coat method, a spray method, a casting method, a dipping method, a droplet discharge (ejection) method (an inkjet method), a dispenser method, a variety of printing methods (a method by which a thin film can be formed in a desired pattern, such as screen (stencil) printing, offset (planographic) printing, letterpress printing, or gravure (intaglio) printing), or the like. Note that the wet process is not limited to the above-described methods as long as a liquid composition of the present invention is used.

In a wet process, compared with a dry process such as an evaporation method or a sputtering method, a material is not scattered in a chamber, and therefore, material use efficiency is higher. Further, since film formation can be performed at atmospheric pressure, facilities such as a vacuum apparatus can be reduced. Furthermore, since the size of a substrate which is processed is not limited by the size of a vacuum chamber, it is possible to use a larger substrate, whereby low cost and improvement in productivity can be achieved. Since heat treatment needed in a wet process is performed at a temperature at which a solvent of a composition can be removed, a wet process is a so-called low temperature process. Accordingly, even substrates and materials which may degrade or deteriorate by heat treatment at a high temperature can be used.

Further, since a thin film is formed using a liquid composition having fluidity, materials are easily mixed, and coverage to a function layer is to be formed with the material a region where is favorable.

The thin film can be selectively formed by a droplet discharge method in which the composition can be discharged into a desired pattern, a printing method in which the composition can be transferred or drawn into a desired pattern, or the like. Therefore, a loss of a material is further prevented, and a material can be efficiently used, resulting in a reduction in manufacturing cost. Furthermore, such methods do not require shaping of the thin film by a photolithography process, and thus the present invention has the effects of simplifying the process and improving the productivity.

Accordingly, a liquid repellent region can be formed selectively without using an expensive vacuum apparatus. Since both a liquid repellent region and a lyophilic region can be formed using organic materials, the thickness of the regions can be easily increased and processability is high. Therefore, the range of selection of shapes of the liquid repellent region and the lyophilic region is expanded, so that a thin film having a variety of functions can be formed with high controllability.

Since expensive facilities such as a large vacuum apparatus can be reduced and a function layer having functionality which is used for a display element can be manufactured by a wet process, material use efficiency is higher, and reduction in cost and high productivity can be achieved. Thus, according to the present invention, highly reliable display devices and electronic devices can be manufactured at low cost with improved productivity.

BRIEF DESCRIPTION OF THE DRAWINGS

FIG. 9A is a plan view illustrating a display device of the present invention and FIG. 9B is a cross-sectional view thereof.

DETAILED DESCRIPTION OF THE INVENTION

Figure 1A:
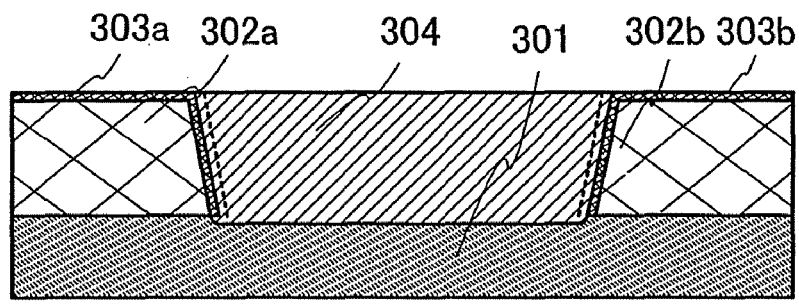
FIGS. 1A to 1D are cross-sectional views each illustrating a function layer in a display device of the present invention.
Figure 1B:
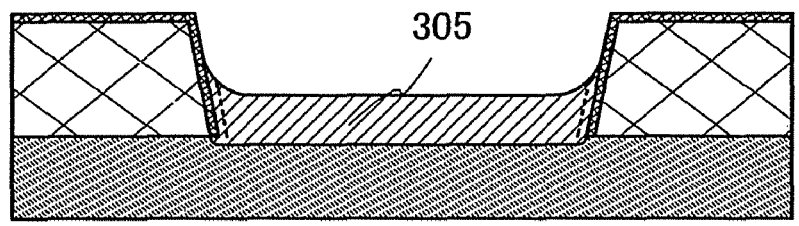
Figure 1C:
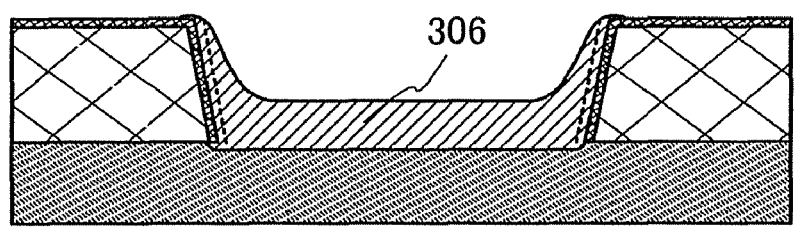
Figure 1D:
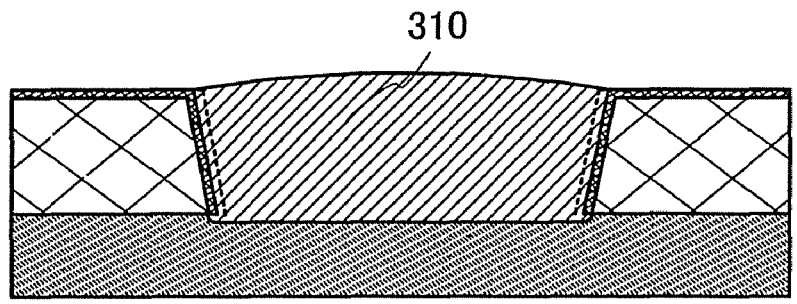

Embodiment modes of the present invention will hereinafter be described based on the accompanying drawings. However, the present invention can be embodied in many different modes and it is easily understood by those skilled in the art that the mode and detail can be variously changed without departing from the scope and spirit of the present invention. Therefore, the present invention should not be interpreted as being limited to the description of Embodiment Mode. In the drawings for describing the embodiment modes, the same reference numerals are commonly given to like components, and the components will not be described repeatedly.

Embodiment Mode 1

This embodiment mode will describe an example of a function layer in a display device aimed at higher image quality and higher reliability, which can be manufactured at low cost with high productivity.

FIGS. 1A to 1D and FIGS. 2A to 2C show an example of a function layer of the present invention. FIG. 1A shows an example in which in an opening formed with a layer 301 including an organic compound (a first organic compound) and layers 302a and 302b including an organic compound (a second organic compound), a function layer 304 is formed so that the opening can be filled with the function layer 304. Oxide layers 303a and 303b are formed on surfaces of the layers 302a and 302b including an organic compound to be interposed between the function layer 304 and the layers 302a and 302b. The layer 301 including an organic compound at a base of the opening is a region with the small thickness and a depressed portion is formed because an oxide layer formed on a surface of the layer 301 by oxidation treatment is removed by etching using an organic solvent. Hereinafter, a manufacturing method is described with reference to FIGS. 3A to 3E.

In this embodiment mode, a variety of specific function layers such as a coloring layer, a pixel electrode layer, or the like used in a display device are formed using a liquid composition including a function-layer-forming material by a wet process. Since the liquid composition including a function-layer-forming material has fluidity, the liquid composition is discharged to a partition (also called bank) which is provided to surround a region where a function layer is to be formed, so that an inner side of the partition is filled with the liquid composition. Then, the discharged composition is solidified by drying or baking, whereby a function layer is formed.

A region to which the composition including a function-layer-forming material is discharged includes a base region of the opening and a partition region surrounding the opening. Liquid repellent treatment is performed so that the partition region can have higher liquid repellency to the composition including a function-layer-forming material than the base region of the opening. This liquid repellent treatment is performed so that a function layer can be formed at a desired region in the opening without the function-layer-forming material flowing over the partition and flowing out to the outside of the region where the function layer is to be formed.

In this embodiment mode of the present invention, the base of the opening and the partition surrounding the opening are formed using two kinds of layers including organic compounds, the levels (height and lowness) of liquid repellency, of which can be varied, to at least the function-layer-forming material. Liquid repellency to the function-layer-forming material can be controlled by control of the fluorine density exhibiting liquid repellency to the liquid function-layer-forming material which is attached to the surface of the layer including an organic compound.

The fluorine density can be controlled depending on solubility of an oxide layer to an organic solvent after formation of a carbon fluoride layer. The higher solubility of the oxide layer is, the more easily the oxide layer is removed together with the carbon fluoride layer, and as the thickness of the oxide layer is decreased, the fluorine density is reduced.

Figure 3A:
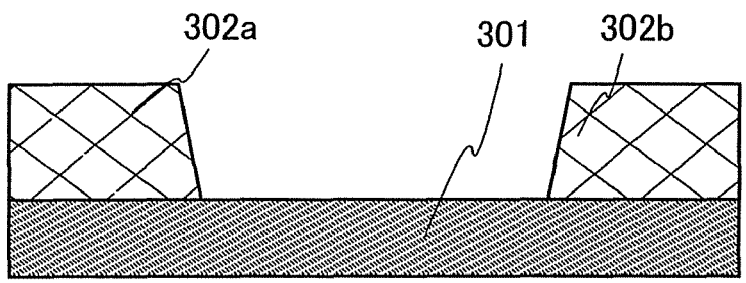
FIGS. 3A to 3E are cross-sectional views illustrating a manufacturing method of a function layer in a display device of the present invention.
Figure 3B:
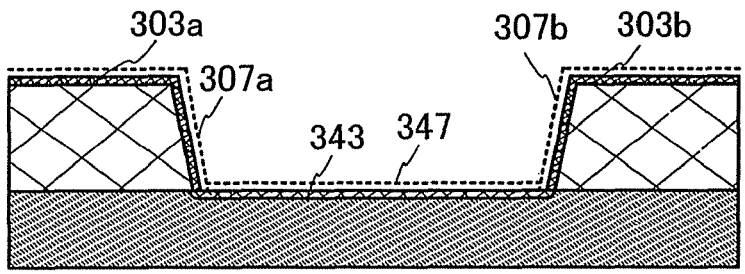

In this embodiment mode, a layer 301 including an organic compound which has a C—N bond or a C—O bond in the main chain is formed, and layers 302a and 302b including an organic compound, which have an opening, are formed over the layer 301 including an organic compound (see FIG. 3A). The opening reaches the layer 301 including an organic compound, and the layer 301 including an organic compound is exposed at a base of the opening. Oxide layers 343, 303a, and 303b are formed on surfaces of the layer 301 including an organic compound which is exposed in the opening, the layer 302a including an organic compound, and the layer 302b including an organic compound, respectively. Carbon fluoride layers 347, 307a, and 307b are formed over the oxide layers 343, 303a, and 303b (see FIG. 3B).

In the liquid repellent treatment of this embodiment mode of the present invention, the following steps are performed on the layers including organic compounds: an ultraviolet-ray irradiation step in the oxidative atmosphere; a carbon-fluoride-layer formation step; and a washing step using an organic solvent.

In the case where carbon fluoride layers including fluorine exhibiting liquid repellency are formed over the layers including organic compounds, the surfaces of the layers including organic compounds are oxidized to form oxide layers, and the carbon fluoride layers are provided thereover.

The oxide layer is formed by irradiating the layer including an organic compound with an ultraviolet ray in the atmosphere containing oxygen and by oxidizing the surface of the layers including organic compounds. In the organic compound which has a carbon-nitrogen (C—N) bond or a carbon-oxygen (C—O) bond in the main chain, the bonds at the C—N bond or the C—O bond are divided by ultraviolet-ray irradiation, and an oxide layer of low molecules with a molecular weight of about 100 to 10000 is formed. The carbon fluoride layer is formed over the oxide layer of low molecules which is formed on the surface of the layer including an organic compound.

Since the oxide layer on the surface of the organic compound which has a carbon-nitrogen (C—N) bond or a carbon-oxygen (C—O) bond in the main chain has low molecules, it is possible to remove the oxide layer together with the carbon fluoride layer in the washing step using an organic solvent. Further, the fluorine density of the surface of the layer including an organic compound which has a C—N bond or a C—O bond in the main chain is reduced so that the surface can have a lyophile property.

The oxide layers 343, 303a, and 303b and the carbon fluoride layers 347, 307a, and 307b formed on the surfaces of the layer 301 including an organic compound and the layers 302a and 302b including an organic compound are removed selectively using an organic solvent. In this embodiment mode, washing is performed using alcohol as an organic solvent. The oxide layer and the carbon fluoride layer over the layer 301 including an organic compound which has a C—N bond or a C—O bond in the main chain are easily removed among the oxide layers 343, 303a, and 303b and the carbon fluoride layers 347, 307b, and 307c. Therefore, the oxide layer 343 and the carbon fluoride layer 347 on the surface of the layer 301 including an organic compound are more removed selectively.

Figure 3C:
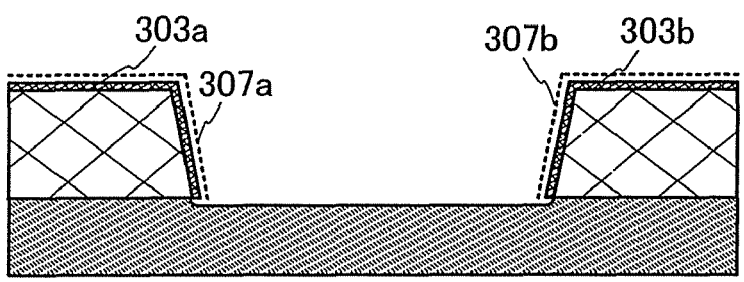

In accordance with removal of the oxide layer 343 and the carbon fluoride layer 347 which is formed over the oxide layer by etching, a depressed portion is formed in the surface of the layer 301 including an organic compound at the base of the opening as if were hollowed (see FIG. 3C). Although the oxide layer 343 is all removed schematically in FIG. 3C, the oxide layer 343 is not necessarily all removed, and the oxide layer may be etched so that the fluorine density in the carbon fluoride layer formed on the surface of the oxide layer 343 can be reduced. Thus, the oxide layer 343 remaining after etching can have the smaller thickness than the oxide layers 303a and 303b.

As the density of carbon fluoride included in the carbon fluoride layers is compared, the surfaces of the layers 302a and 302b including an organic compound have higher density of carbon fluoride than the surface of the layer 301 including an organic compound. Therefore, the surfaces of the layers 302a and 302b including an organic compound can be liquid repellent regions (high liquid repellent regions), and the surface of the layer 301 including an organic compound can be a lyophilic region (a low liquid repellent region).

Figure 3D:
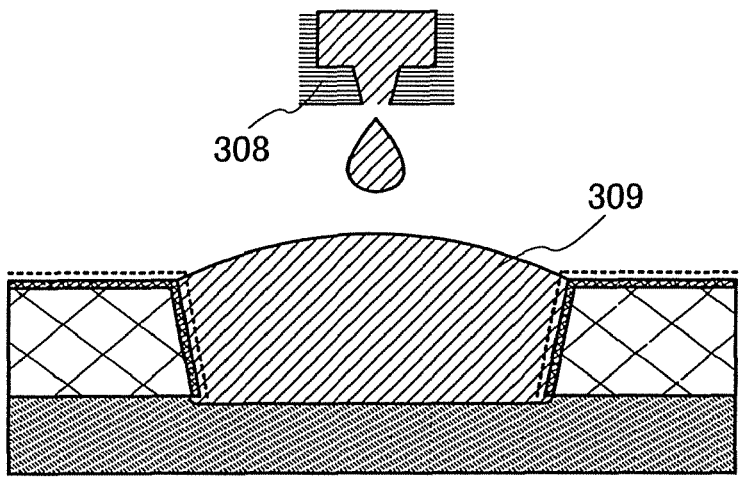
Figure 3E:
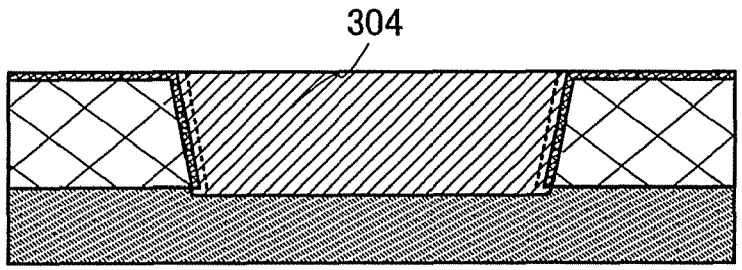

When the liquid composition including a function-layer-forming material is discharged from a droplet discharge apparatus 308 to the opening that is subjected to the liquid repellent treatment selectively as described, the lyophilic region at a base of the opening is filled with a composition 309, and the composition 309 does not flow over the partitions which are the liquid repellent regions and does not flow out to the outside of the region where the function layer is to be formed (see FIG. 3D). Thus, a function layer 304 can be formed at a desired region where the function layer is to be formed in the opening (see FIG. 3E).

In such a manner, with use of layers including organic compound provided with, on their surfaces, oxide layers having different solubility to an organic solvent, regions which have different liquid repellency from each other can be formed, and liquid repellency can be controlled.

Accordingly, by performance of liquid treatment where the layer 301 including an organic compound is used at the base of the opening, and the layers 302a and 302b including an organic compound as the partitions, regions having different levels of liquid repellency to the composition including a function-layer-forming material can be selectively formed. Note that the layer 301 including an organic compound has a carbon-nitrogen (C—N) bond or a carbon-oxygen (C—O) bond in the main chain and is provided with, on its surface, the oxide layer having high solubility to the organic solvent.

Among the oxide layers which are formed by irradiation with an ultraviolet ray in the atmosphere containing oxygen, the oxide layer 343 on the surface of the layer 301 including an organic compound which has a carbon-nitrogen (C—N) bond or a carbon-oxygen (C—O) bond in the main chain has higher solubility to the organic solvent than the oxide layers 303a and 303b on the surfaces of the layers 302a and 302b including an organic compound.

Further, after the liquid repellent treatment, the oxide layer on the surface of the layer 301 including an organic compound which has a carbon-nitrogen (C—N) bond or a carbon-oxygen (C—O) bond in the main chain has a smaller thickness than the oxide layers on the surfaces of the layers 302a and 302b including an organic compound.

Accordingly, the liquid repellent region can be formed selectively without using an expensive vacuum apparatus. Since both the liquid repellent region and the lyophilic region can be formed using organic materials, the thickness of the regions can be easily increased and processability is high. Thus, the range of the selection of shapes of the liquid repellent region and the lyophilic region is expanded, so that a function layer having a variety of functions can be formed with high controllability.

Since expensive facilities such as a large vacuum apparatus can be reduced and a function layer having functionality which is used for a display element can be manufactured by a wet process, material use efficiency is higher, and reduction in cost and high productivity can be achieved. Thus, according to the present invention, highly reliable display devices and electronic devices can be manufactured at low cost with improved productivity.

The function layer can be controlled to have a variety of shapes depending on the level of liquid repellency; viscosity, solidification conditions, or the amount of discharge of the composition including a function-layer-forming material; or the like. Examples of the shape of the function layer will be described with reference to FIGS. 1A to 1D. FIG. 1A shows an example in which the function layer 304 is formed to have the same or substantially the same height as the layers 302a and 302b including an organic compound which are partitions of an opening, so that the opening is filled with the function layer 304. However, an example of FIG. 1B in which a function layer 305 is formed to have a lower height than the layers 302a and 302b including an organic compound which are partitions may be employed. Alternatively, an example of FIG. 1C in which a function layer 306 is formed so that part of the function layer 306 will be extended from the opening over the layers 302a and 302b including an organic compound which are partitions may be employed. Alternatively, an example of FIG. 1D in which a function layer 310 is formed to have a projection may be employed.

Figure 2A:
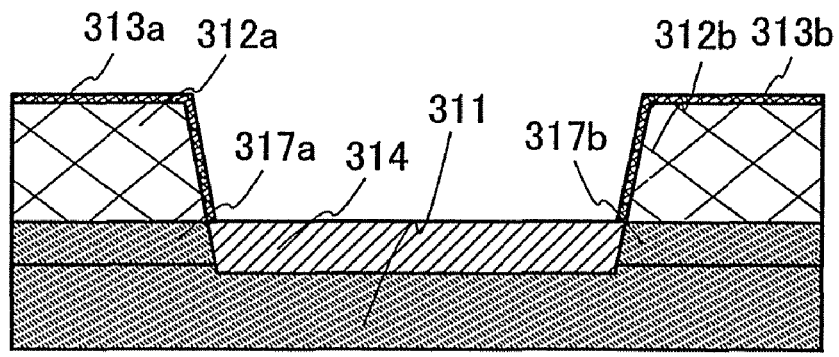
FIGS. 2A to 2C are cross-sectional views each illustrating a function layer in a display device of the present invention.
Figure 2B:
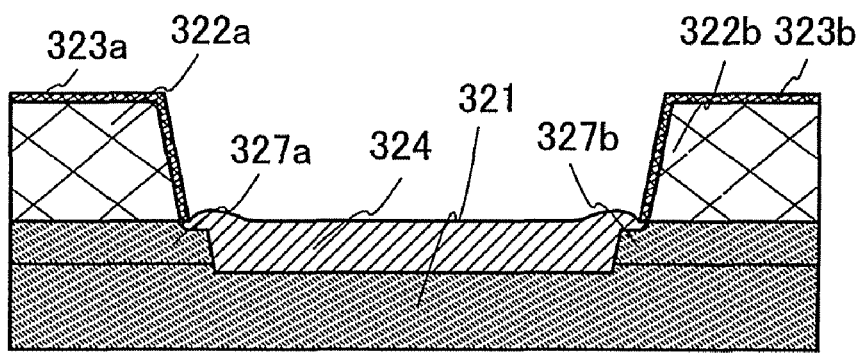
Figure 2C:
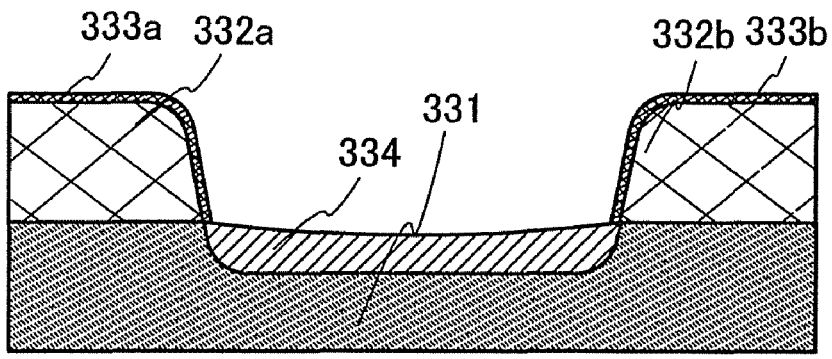

A layer including an organic compound which is to be a partition of an opening may have a stacked structure. In that case, a depressed portion may be selectively formed in the layer including a first organic compound, and the depressed portion may be filled with a function layer. FIG. 2A shows an example in which layers 317a, 317b, 312a, and 312b including organic compounds, whose ends to be partitions have a continuous opening, are formed over a layer 311 including an organic compound, and in which a function layer 314 is formed in the opening which is formed with the layer 311 including an organic compound and the layers 317a and 317b including an organic compound. The layer 311 including an organic compound and the layers 317a and 317b including an organic compound are formed of the same material and have lower liquid repellency than the layers 312a and 312b including an organic compound. The function layer is difficult to be formed on surfaces of oxide layers 313a and 313b having high liquid repellency. FIG. 2B shows an example in which layers 327a and 327b including an organic compound and layers 322a and 322b including an organic compound have discontinuous ends. A function layer 324 is difficult to be formed on surfaces of oxide layers 323a and 323b having high liquid repellency. By formation of the function layers as shown in FIGS. 2A and 2B, the thickness of the function layers can be accurately controlled. FIG. 2C shows an example in which a depressed portion is formed selectively in a layer 331 including an organic compound and the depressed portion is filled with a function layer 334. The function layer is difficult to be formed on surfaces of layers 332a and 332b including an organic compound, which have high liquid repellency, and oxide layers 333a and 333b thereover, and the function layer can be formed in the depressed portion in the layer 331 including an organic compound with high controllability.

As each of the layers 301, 311, 317a, 317b, 321, 327a, 327b, and 331 including an organic compound, an organic compound which has a C—N bond or a C—O bond in the main chain can be used, such as polyimide, polyamic acid, polyamide, or aromatic polyamide.

As each of the layers 302a, 302b, 312a, 312b, 322a, 322b, 332a, and 332b including an organic compound, an organic compound can be used, such as an acrylic resin, a siloxane resin, a vinyl resin, a phenol resin, or a novolac resin.

Difference of the regions having liquid repellency or lyophilic indicates difference in wettability. This difference in wettability indicates a relative relation of both regions. The base of the opening and the partition may have a difference at substantially the same level of wettability to the composition including a function-layer-forming material. The regions having different wettabilities are regions whose contact angles with a composition including a function-layer-forming material are different from each other. A region which has a large contact angle with the composition including a function-layer-forming material has low wettability (a region having high liquid repellency and low lyophilic), and a region which has a small contact angle has high wettability (a region having low liquid repellency and high lyophilic). With a large contact angle, a liquid composition having fluidity does not spread over a region surface, and the surface repels the composition and is not wetted thereby. With a small contact angle, a composition having fluidity spreads over a surface, and the surface is wetted well thereby. Accordingly, the regions having different wettabilities have also different surface energy. The surface energy of a region having low wettability is low, and the surface energy of a region having high wettability is high.

The carbon fluoride layer can be formed using organosilane having a hydrolyzable group. The organosilane having a hydrolyzable group is expressed by the chemical formula: $R_n$—Si—$X_{(4-n)}$ (wherein n=1, 2, 3) or $R_3$—Si—NR—Si—$R_3$. Here, R represents a material containing a relatively inert group such as an alkyl group. X represents a hydrolyzable group such as halogen, a methoxy group, an ethoxy group, or an acetoxy group which is bondable by a condensation of a hydroxyl group or adsorbed water on a base material surface.

As a typical example of organosilane having a hydrolyzable group, an organosilane having a fluorine-based hydrolyzable group which has a fluoroalkyl group for R, (fluoroalkylsilane (hereinafter also referred to as FAS)), can be used. The fluoroalkyl group R of FAS has a structure of $(CF_3)(CF_2)_x (CH_2)_y$, where x is an integer from 0 to 10 and y is an integer from 0 to 4. When a plurality of Rs or Xs are coupled with Si, all of the Rs or Xs may be the same or different. Representatively, FAS is fluoroalkylsilane such as heptadecafluoro tetrahydro decyl triethoxysilane, heptadecafluoro tetrahydro decyl trichlorosilane, tridecafluoro tetrahydro octyl trichlorosilane, or trifluoropropyl trimethoxysilane.

As a solvent for organosilane having a hydrolyzable group, a hydrocarbon-based solvent, such as n-pentane, n-hexane, n-heptane, n-octane, n-decane, dicyclopentane, benzene, toluene, xylene, durene, indene, tetrahydronaphthalene, decahydronaphthalene, or squalene; tetrahydrofuran; or the like can be used.

Note that in the case of forming a carbon fluoride layer using any of the aforementioned materials, the above material may be chemically adsorbed on a surface of the oxide layer by a gas phase method, so that the carbon fluoride layer is formed. The chemical adsorption allows a monomolecular layer to be formed. Alternatively, the carbon fluoride layer may be formed using any of the aforementioned materials by a droplet discharge method, a coating method, or the like.

In order to obtain the monomolecular layer, a substrate is placed in an airtight container containing organosilane to chemically adsorb organosilane onto the surface of the oxide layer. Then, the monomolecular layer is obtained by washing with alcohol, and the carbon fluoride layer of the monomolecular layer can be formed. As an alternative, a substrate may be dipped in a solution containing organosilane, so that organosilane is chemically adsorbed onto the surface of the oxide layer to be a monomolecular film used for the carbon fluoride layer of the monomolecular layer.

The organosilane film having a hydrolyzable group may be extremely thin depending on its formation conditions, and the film does not necessarily maintain the form of a film.

The organosilane having a hydrolyzable group formed for the liquid repellent treatment may be left or the unnecessary portion of the organosilane may be removed after formation of the function layer. When removing the unnecessary portion of organosilane, the function layer can be used as a mask, and the unnecessary portion of organosilane may be removed by ashing with oxygen or the like, etching, plasma treatment, or the like.

As described above, the function-layer-forming material is dissolved in a solvent to be a liquid composition, and using the liquid composition, a thin film having functionality can be formed by a wet process. In the wet process, a material that is to form a thin film is dissolved in the solvent, and the liquid composition is attached to a region where the function layer is to be formed. Then, the solvent is removed, and the resulting material is solidified, whereby the thin film is formed. Further, in the case where a photocurable resin is included in the function-layer-forming material for solidification treatment, light irradiation may be performed. In the case of including a thermosetting resin, heat treatment may be performed.

For the wet process, any of the following methods can be employed: a spin coating method, a roll coat method, a spray method, a casting method, a dipping method, a droplet discharge (ejection) method (an inkjet method), a dispenser method, a variety of printing methods (a method by which a thin film can be formed in a desired pattern, such as screen (stencil) printing, offset (planographic) printing, letterpress printing, or gravure (intaglio) printing, or the like. Note that the wet process is not limited to the above-described methods as long as a liquid composition of the present invention is used.

In a wet process, compared with a dry process such as an evaporation method or a sputtering method, a material is not scattered in a chamber, and therefore, material use efficiency is higher. Further, since film formation can be performed at atmospheric pressure, facilities such as a vacuum apparatus can be reduced. Furthermore, since the size of a substrate which is processed is not limited by the size of a vacuum chamber, it is possible to use a larger substrate, whereby low cost and improvement in productivity can be achieved. Since heat treatment needed in a wet process is performed at a temperature at which a solvent of a composition can be removed, a wet process is a so-called low temperature process. Accordingly, even substrates and materials which may degrade or deteriorate by heat treatment at a high temperature can be used.

Further, since the thin film is formed using the liquid composition having fluidity, the materials are easily mixed, and coverage to the region where the function layer is to be formed with the material is favorable.

The thin film can be selectively formed by a droplet discharge method in which a composition can be discharged into a desired pattern, a printing method in which a composition can be transferred or drawn into a desired pattern, or the like. Therefore, a loss of a material is further prevented, and a material can be efficiently used, resulting in a reduction in manufacturing cost. Furthermore, such methods do not require shaping of the thin film by a photolithography process, and thus have the effects of simplifying the process and improving the productivity.

Figure 7:
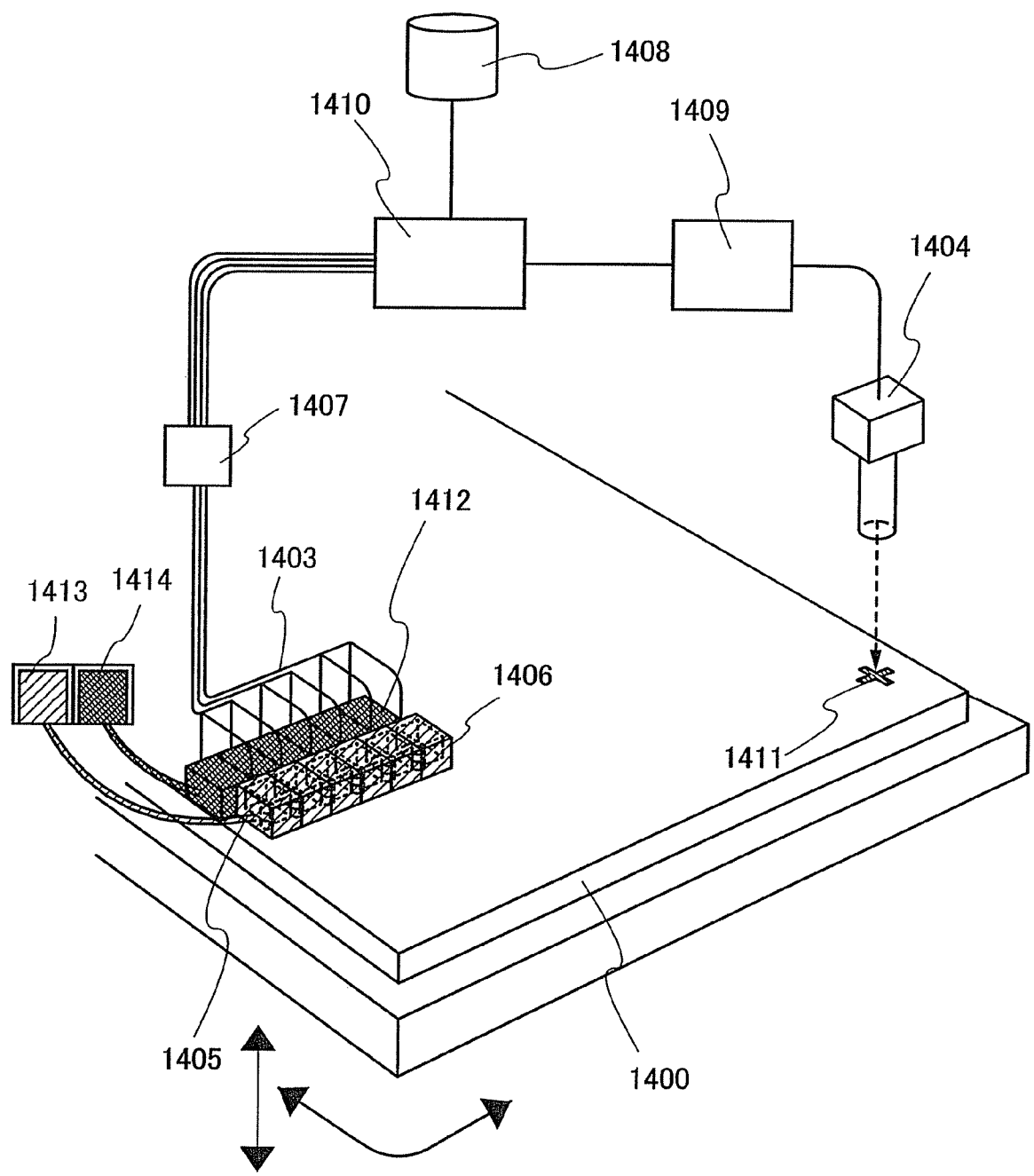
FIG. 7 illustrates a droplet discharge apparatus which can be used in a manufacturing process of a display device of the present invention.

A droplet discharge means is described for an example of a wet process, with reference to FIG. 7. The droplet discharge means is a general term for a means that discharges a droplet, such as a nozzle having a discharge opening of a composition, or a head equipped with a single or plurality of nozzles.

FIG. 7 illustrates a mode of a droplet discharge apparatus used in a droplet discharge method. Each head 1405 and 1412 of a droplet discharging means 1403 are connected to a controlling means 1407. By controlling the respective heads using a computer 1410, a pattern that has been programmed by the computer in advance can be written. A position for drawing a pattern may be determined, for example, by determining a reference point by detecting a marker 1411 formed on a substrate 1400 using an imaging means 1404, an image processing means 1409, and the computer 1410. Alternatively, the reference point may be detected based on an edge of the substrate 1400.

An image sensor or the like using a charge coupled device (CCD) or a complementary metal oxide semiconductor (CMOS) can be used as the imaging means 1404. Naturally, information about a pattern to be formed over the substrate 1400 is stored in a storage medium 1408, and a control signal is transmitted to the control means 1407 based on the information, so that each of the heads 1405 and 1412 of the droplet discharge means 1403 can be individually controlled. A material to be discharged is supplied to the heads 1405, 1412 from material supply sources 1413 and 1414 through a piping.

The head 1405 has an internal structure which includes a space filled with a liquid material as indicated by a dotted line 1406 and a nozzle that is a discharge opening. Although it is not shown, an internal structure of the head 1412 is similar to that of the head 1405. When the nozzle sizes of the heads 1405 and 1412 are different from each other, different materials can be discharged concurrently to have different widths. Thus, plural kinds of materials or the like can be discharged individually from one head to draw a pattern. When a pattern is drawn in a large area, the same material can be discharged at the same time through a plurality of nozzles to improve throughput. In a case of forming a pattern on a large substrate, the heads 1405 and 1412 and a stage provided with the substrate are scanned relatively in the direction of the arrows; thus, the area of the pattern can be set freely. Accordingly, a plurality of the same patterns can be drawn over one substrate.

Further, a step of discharging the composition may be performed under reduced pressure. Also, a substrate may be heated when the composition is discharged. After discharging the composition, either drying or baking or the both is performed. Both the drying step and baking step are heat treatment; however, for example, drying is performed at 80 to 100° C. for 3 minutes and baking is performed at 200 to 550° C. for 15 to 60 minutes, and they are different in purpose, temperature, and time period. The steps of drying and baking are performed under normal pressure or under reduced pressure by laser irradiation, rapid thermal annealing, heating using a heating furnace, or the like. Note that the timing of the heat treatment and the number of times of the heat treatment are not particularly limited. The conditions for favorably performing the steps of drying and baking, such as temperature and time, depend on the material of the substrate and properties of the composition.

After a conductive layer, an insulating layer, or the like is formed by discharging a composition by a droplet discharge method, a surface thereof may be pressed with pressure to be planarized so that the planarity is enhanced. As a pressing method, unevenness may be reduced by moving a roller-shaped object over the surface, or the surface may be pressed with a flat plate-shaped object. A heating step may also be performed at the time of the pressing. Alternatively, the unevenness of the surface may be eliminated with an air knife after softening or melting the surface with a solvent or the like. A CMP method may be also used for polishing the surface. This process may be applied for planarizing a surface when unevenness is caused by a droplet discharge method.

When the liquid composition including a function-layer-forming material is discharged to the opening that is subjected to the liquid repellent treatment selectively as described, the lyophilic region at the base of the opening is filled with the composition, and the composition does not flow over the partition of the liquid repellent region and does not flow out to the outside of the region where the function layer is to be formed. Thus, the function layer can be formed at a desired region where the function layer is to be formed in the opening.

Accordingly, the liquid repellent region can be formed selectively without using an expensive vacuum apparatus. Since both the liquid repellent region and the lyophic region can be formed using organic materials, the thickness of the regions is easily increased, and processability is high. Therefore, the range of selection of shapes of the liquid repellent region and the lyophilic region is expanded, so that the function layer having a variety of functions can be formed with high controllability.

Since expensive facilities such as a large vacuum apparatus can be reduced and a function layer having functionality which is used for a display element can be manufactured by a wet process, material use efficiency is higher, and reduction in cost and high productivity can be achieved. Thus, according to the present invention, highly reliable display devices and electronic devices can be manufactured at low cost with improved productivity.

The present invention can be used for a display device which is a device having a display function. As a display device to which the present invention is applied, there are a light-emitting display device in which a TFT is connected to a light-emitting element including, between electrodes, a layer including an organic material, an inorganic material, or a mixture of an organic material and an inorganic material that exhibits light emission called electroluminescence (hereinafter also referred to as "EL"), a liquid crystal display device which uses a liquid crystal element having a liquid crystal material as a display element, and the like. In the present invention, the display device refers to a device including a display element (such as a liquid crystal element or a light emitting element). The display device may also refer to a display panel provided with a plurality of pixels including display elements like liquid crystal elements or EL elements and a peripheral driver circuit for driving such pixels over a substrate. In addition, the display device may include one which is provided with a flexible printed circuit (FPC) or a printed wiring board (PWB) (such as an IC, a resistor, a capacitor, an inductor, or a transistor). Such a display device may also include an optical sheet such as a polarizing plate or a retardation plate. Further, it may include a backlight unit (which may include a light guide plate, a prism sheet, a diffusion sheet, a reflective sheet, and a light source (e.g., an LED or a cold-cathode tube)).

Note that various modes can be applied to a display element and a display device, and they can have various elements. For example, a display medium whose contrast varies by an electromagnetic action can be used, such as an EL element (e.g., an organic EL element, an inorganic EL element, or an EL element containing an organic material and an inorganic material), a liquid crystal element, or an electronic ink. Note that a display device using an EL element refers to an EL display. A display device using a liquid crystal element refers to a liquid crystal display, a transmissive liquid crystal display, a semi-transmissive liquid crystal display, or a reflective liquid crystal display. A display device using electronic ink refers to an electronic paper.

Embodiment Mode 2

This embodiment mode will describe an example of a display device aimed at higher image quality and higher reliability, which can be manufactured at low cost with high productivity. More specifically, a passive matrix display device is shown.

Figure 4A:
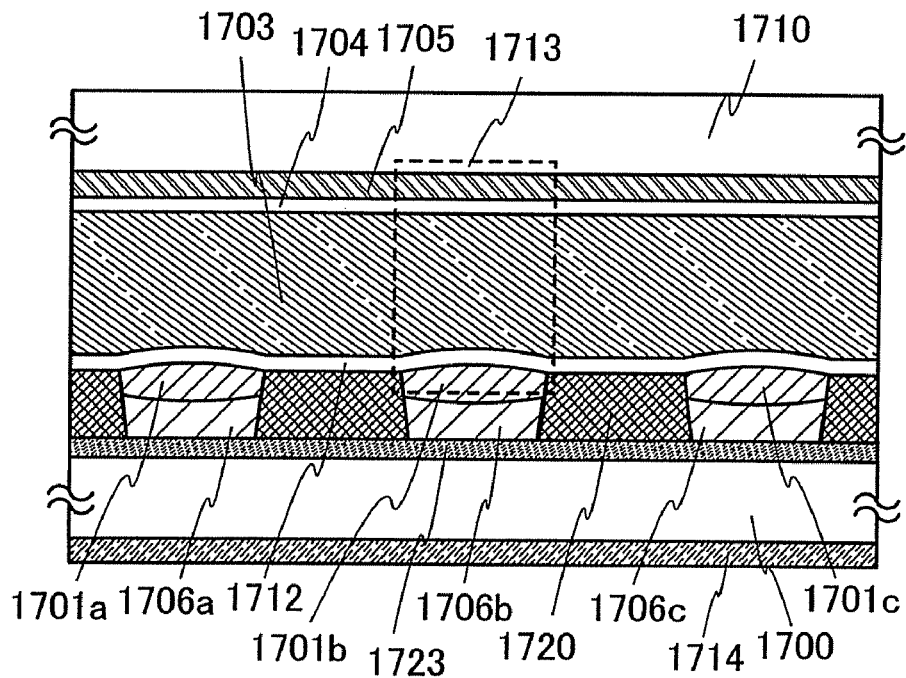
FIGS. 4A and 4B are cross-sectional views each illustrating a display device of the present invention.
Figure 4B:
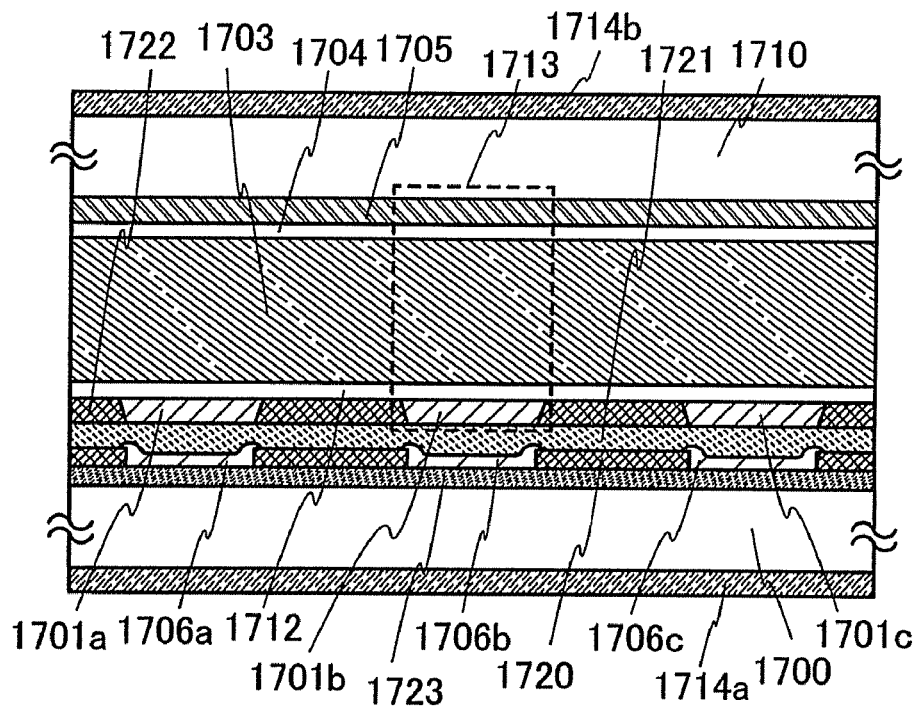

FIGS. 4A and 4B each show a passive matrix liquid crystal display device to which the present invention is applied. FIG. 4A illustrates a reflective liquid crystal display device and FIG. 4B illustrates a transmissive liquid crystal display device. In FIGS. 4A and 4B, a substrate 1700 and a substrate 1710 are provided opposite to each other with a liquid crystal layer 1703 interposed therebetween. The substrate 1700 is provided with electrode layers 1701a, 1701b, and 1701c also referred to as pixel electrode layers, which are used for display elements 1713 and an insulating layer 1712 serving as an alignment film, coloring layers 1706a, 1706b, and 1706c serving as part of a color filter, a layer 1720 including an organic compound, a layer 1723 including an organic compound, and a polarizing plate 1714 (1714a in FIG. 4B). The substrate 1710 is provided with an insulating layer 1704 serving as an alignment film, an electrode layer 1705 also referred to as a counter electrode layer which is used for the display elements, and a polarizing plate 1714 (1714b in FIG. 4B).

The layer 1723 including an organic compound has a light-transmitting property. The layer 1720 including an organic compound has a light-shielding property because the layer 1720 serves as a light-shielding layer.

In the display device of this embodiment mode, the electrode layers 1701a, 1701b, and 1701c and the coloring layers 1706a, 1706b, and 1706c, which are function layers, are formed by discharging compositions including function-layer-forming materials to openings formed with the layer 1720 including an organic compound and the layer 1723 including an organic compound.

In each opening, the layer 1720 including an organic compound is a partition and the layer 1723 including an organic compound is a base region of the opening. By liquid repellent treatment, the layer 1720 including an organic compound to be a partition has higher liquid repellency than the layer 1723 including an organic compound. Thus, the layer 1723 including an organic compound uses a layer including an organic compound which has a carbon-nitrogen (C—N) bond or a carbon-oxide (C—O) bond in the main chain, provided with, on its surface, an oxide layer having high solubility to an organic solvent.

By performance of the liquid repellent treatment where the layer 1723 including an organic compound which has a carbon-nitrogen (C—N) bond or a carbon-oxide (C—O) bond in the main chain, provided with, on its surface, an oxide layer having high solubility to an organic solvent is used at the base of each opening; and the layer 1720 including an organic compound is used as the partition, regions which have different levels of liquid repellency to the composition including a function-layer-forming material can be selectively formed.

The openings are formed with the layer 1723 including an organic compound and the layer 1720 including an organic compound, and then oxidation treatment and ultraviolet-ray irradiation treatment are performed on the openings. In this embodiment mode, the oxidation treatment is performed by irradiation with an ultraviolet ray in the atmosphere containing oxygen. An oxide layer is formed on surfaces of the layer 1720 including an organic compound and the layer 1723 including an organic compound by the oxidation treatment, and then a carbon fluoride layer is formed thereover. In this embodiment mode, an FAS film is used as the carbon fluoride layer. When the carbon fluoride layer is washed with alcohol that is an organic solvent, the oxide layer of low molecules with high solubility on the surface of the layer 1723 including an organic compound is dissolved together with the carbon fluoride layer, and the oxide layer and the carbon fluoride layer on the surface of the layer 1723 including an organic compound which has a C—N bond or a C—O bond in the main bond are selectively removed. Accordingly, the surface of the layer 1720 including an organic compound with higher fluorine density exhibiting liquid repellency has higher liquid repellency, and by removal of the carbon fluoride layer by using an organic solvent, the surface of the layer 1723 including an organic compound with low fluorine density has low liquid repellency (a lyophilic property).

Thus, the opening has the base that is a lyophilic region and the partition that is a liquid repellent region with respect to the liquid composition including a function-layer-forming material. When the liquid composition including a function-layer-forming material is discharged to such an opening, the function layer can be formed with a desired shape in the predetermined region without the composition flowing out over the partition that is the liquid repellent region and flowing out. The display device of FIG. 4A has a structure in which the coloring layers and the electrode layers which are function layers are sequentially stacked in the openings formed with the layer 1723 including an organic compound and the layer 1720 including an organic compound. First, a composition including a coloring-layer-forming material is discharged to the openings to form the coloring layers 1706a, 1706b, and 1706c. Then, a composition including a conductive material (conductive-layer-forming material) is discharged over the coloring layers 1706a, 1706b, and 1706c to form the electrode layers 1701a, 1701b, and 1701c.

The display device of FIG. 4B shows an example in which the coloring layer and the electrode layer are not stacked in the same opening directly but formed independently in openings formed with the layers including organic compounds. The coloring layers 1706a, 1706b, and 1706c are formed in openings formed with the layer 1720 including an organic compound and the layer 1723 including an organic compound which has a C—N bond or a C—O bond in the main chain, in a manner similar to that of FIG. 4A. A layer 1721 including an organic compound is formed over the coloring layers 1706a, 1706b, and 1706c and the layer 1720 including an organic compound, and a layer 1722 including an organic compound is formed over the layer 1721 including an organic compound. In the openings, the layer 1721 including an organic compound is a base, and the layer 1722 including an organic compound is a partition. The layer 1721 including an organic compound uses a layer including an organic compound which has a carbon-nitrogen (C—N) bond or a carbon-oxide (C—O) bond in the main chain, provided with, on its surface, an oxide layer having high solubility to an organic solvent.

In accordance with difference of the fluorine density, the layer 1722 including an organic compound that is the partition becomes a high liquid repellent region and the layer 1721 including an organic compound that is the base becomes a low liquid repellent region (a lyophilic region). The composition including a conductive material is discharged to the openings where liquid repellency is controlled, whereby the electrode layers 1701a, 1701b, and 1701c can be formed with high controllability.

Since the display device in FIG. 4A is a reflective liquid crystal display device, the electrode layer 1705 necessarily has reflectivity. In this case, a thin metal film having reflectivity may be used, or alternatively a laminate of the thin metal film and the electrode layer having a light-transmitting property may be used.

Since the display device in FIG. 4B is a transmissive liquid crystal display device, electrode layers having a light-transmitting property are used for the pairs of electrode layers 1701a, 1701b, and 1701c, and the electrode layer 1705, and the polarizing plates 1714a and 1714b are used.

Figure 5A:
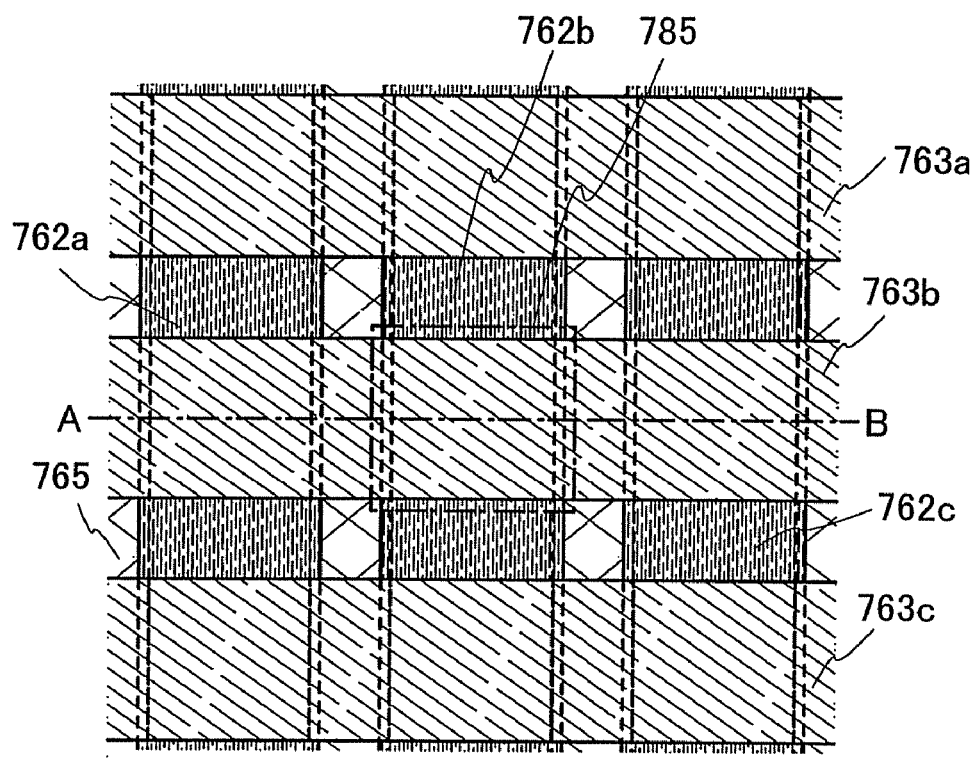
FIG. 5A is a plan view illustrating a display device of the present invention and FIG. 5B is a cross-sectional view thereof.
Figure 5B:
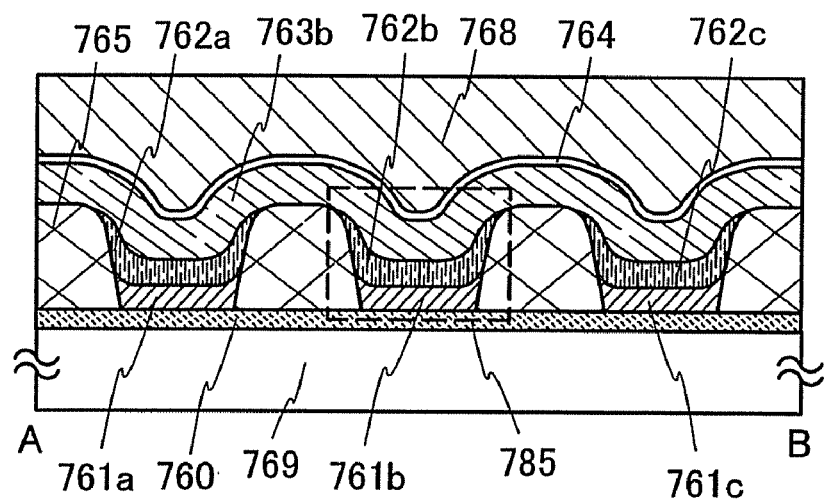

FIGS. 5A and 5B show a display device having a passive matrix light-emitting element (also referred to as a light-emitting display device) to which the present invention is applied. FIG. 5A is a plan view of the display device and FIG. 5B is a cross-sectional view taken along a line A-B in FIG. 5A.

The display device includes first electrode layers 761a, 761b, and 761c which extend in a first direction, which are electrode layers used for the display elements; electroluminescent layers 762a, 762b, and 762c which are provided to cover the first electrode layers 761a, 761b, and 761c; and second electrode layers 763a, 763b, and 763c which extend in a second direction perpendicular to the first direction, which are electrode layers used for the display elements are provided, over a layer 760 including an organic compound provided over a substrate 769. Between the first electrode layers 761a, 761b, and 761c and the second electrode layers 763a, 763b, and 763c, the electroluminescent layers 762a, 762b, and 762c are provided, which are divided by a layer 765 including an organic compound which serves as a partition. In addition, an insulating layer 764 serving as a protective film is provided to cover the second electrode layers 763a, 763b, and 763c (see FIGS. 5A and 5B). Note that, the insulating layer 764 and an insulating layer 768 serving as a sealant are omitted in FIG. 5A. Instead of the insulating layer 768, a filler is provided over a display element 785 and sealing may be performed with a substrate.

In the display device of this embodiment mode, the first electrode layers 761a, 761b, and 761c and the electroluminescent layers 762a, 762b, and 762c which are the function layers are formed by discharging compositions including function-layer-forming materials to openings formed with the layer 760 including an organic compound and the layer 765 including an organic compound.

In each opening, the layer 765 including an organic compound is a partition, and the layer 760 including an organic compound is a base region of the opening. By liquid repellent treatment, the layer 765 including an organic compound to be the partition has higher liquid repellency than the layer 760 including an organic compound. Thus, the layer 760 including an organic compound uses a layer including an organic compound which has a carbon-nitrogen (C—N) bond or a carbon-oxygen (C—O) bond in the main chain, provided with, on its surface, an oxide layer having high solubility to an organic solvent. By performance of the liquid repellent treatment where the layer 760 including an organic compound which has a carbon-nitrogen (C—N) bond or a carbon-oxygen (C—O) bond in the main chain, provided with, on its surface an oxide layer having high solubility to an organic solvent is used as the base of the opening; and the layer 765 including an organic compound is used as the partition, regions which have different levels of liquid repellency to the composition including a function-layer-forming material can be selectively formed.

Oxidation treatment and ultraviolet-ray irradiation treatment are performed on the openings formed with the layer 760 including an organic compound and the layer 765 including an organic compound. In this embodiment mode, the oxidation treatment is performed by irradiation with an ultraviolet ray in the atmosphere containing oxygen. An oxide layer is formed on the surfaces of the layers 760 including an organic compound and the 765 including an organic compound formed by the oxidation treatment, and a carbon fluoride layer is formed thereover. In this embodiment mode, an FAS film is used as the carbon fluoride layer. When the carbon fluoride layer is washed with alcohol that is an organic solvent, the oxide layer of low molecules with high solubility on the surface of the layer 760 including an organic compound is dissolved together with the carbon fluoride layer, whereby the oxide layer and the carbon fluoride layer on a surface of the layer 760 including the organic compound which has a C—N bond or a C—O bond in the main chain are selectively removed. Accordingly, the surface of the layer 765 including an organic compound where the fluorine density with liquid repellency is higher has exhibiting liquid repellency, and the surface of the layer 760 including an organic compound where the carbon fluorine layer is removed using an organic solvent and the fluorine density is low has low liquid repellency (a lyophilic region).

Thus, when the liquid composition including a function-layer-forming material is discharged to the opening where the base is the lyophilic region and the partition is the liquid repellent region with respect to the liquid composition including the function-layer-forming material, the function layer can be formed to have a desired shape in the predetermined region without the composition flowing over the partition that is the liquid repellent region and flowing out. The display device of FIGS. 5A and 5B has a structure in which the first electrode layer and the electroluminescent layer which are the function layers are sequentially stacked in the opening formed with the layer 760 including an organic compound and the layer 765 including an organic compound. First, a composition including a conductive material is discharged to the opening to form the first electrode layers 761a, 761b, and 761c. Then, a composition including an electroluminescent-layer-forming material is discharged over the first electrode layers 761a, 761b, and 761c to form the electroluminescent layers 762a, 762b and 762c.

The electroluminescent layer may be manufactured to have a desired shape using a mask by a dry process such as an evaporation method.

The layer including an organic compound which serves as the partition may have a shape in which an end does not have curvature. In contrast, in the case where the layer including an organic compound has curvature like the layer 765 including an organic compound and a radius of curvature continuously changes, coverage of the layer including an organic compound with an insulating layer and a conductive layer is favorable.

A thin film having functionality can be formed by a wet process using the function-layer-forming material which is dissolved in a solvent, as a liquid composition as described above. In the wet process, a material that is to form a thin film is dissolved in the solvent, and the liquid composition is attached to a region where the function layer is to be formed. Then, the solvent is removed, and the resulting material is solidified, whereby the thin film is formed. Further, as the solidification treatment, in the case of including a photocurable resin in the function-layer-forming material, light irradiation may be performed. In the case of including a thermosetting resin, heat treatment may be performed.

For the wet process, any of the following methods can be employed: a spin coating method, a roll coat method, a spray method, a casting method, a dipping method, a droplet discharge (ejection) method (an inkjet method), a dispenser method, a variety of printing methods (a method by which a thin film can be formed in a desired pattern, such as screen (stencil) printing, offset (planographic) printing, letterpress printing, or gravure (intaglio) printing), or the like. Note that the wet process is not limited to the above-described methods as long as a liquid composition of the present invention is used.

In a wet process, compared with a dry process such as an evaporation method or a sputtering method, a material is not scattered in a chamber, and therefore, material use efficiency is higher. Further, since film formation can be performed at atmospheric pressure, facilities such as a vacuum apparatus can be reduced. Furthermore, since the size of a substrate which is processed is not limited by the size of a vacuum chamber, it is possible to use a larger substrate, whereby low cost and improvement in productivity can be achieved. Since heat treatment needed in a wet process is performed at a temperature at which a solvent of a composition can be removed, a wet process is a so-called low temperature process. Accordingly, even substrates and materials which may degrade or deteriorate by heat treatment at a high temperature can be used.

Since the thin film is formed using the liquid composition having fluidity, the material is easily mixed, and coverage to the region where the function layer is to be formed with the material is favorable.

The thin film can be selectively formed by a droplet discharge method in which a composition can be discharged into a desired pattern, a printing method in which a composition can be transferred or drawn into a desired pattern, or the like. Therefore, a loss of a material is further prevented, and a material can be efficiently used, resulting in a reduction in manufacturing cost. Furthermore, such methods do not require shaping of the thin film by a photolithography process, and thus have the effects of simplifying the process and improving the productivity.

As the substrates 769, 1700, and 1710, a glass substrate, a quartz substrate, or the like can be used. Alternatively, a flexible substrate may be used. The flexible substrate is a substrate that can be bent. For example, a high-molecular compound material elastomer, which can be processed to be shaped in a manner similar to that of plastics by plasticization at high temperatures, and has a property of an elastic body like rubber at room temperature, or the like can be used, as well as a plastic substrate made of polycarbonate, polyarylate, polyethersulfone, or the like. Alternatively, a film (made of polypropylene, polyester, vinyl, polyvinyl fluoride, vinyl chloride, or the like), an evaporation inorganic film, or the like can be used.

As the layers 760, 1720, and 1722 including an organic compound, an organic compound which has a C—N bond or a C—O bond in the main chain can be used, such as polyimide, polyamic acid, polyamide, or aromatic polyamide.

As the layers 765, 1721, and 1723 including an organic compound, an organic compound can be used, such as an acrylic resin, a siloxane resin, a vinyl resin, a phenol resin, or a novolac resin.

The layer including organic compound can be formed by a wet process such as a droplet discharge method, a printing method (a method by which a pattern is formed like screen printing, offset printing, or the like), or a coating method.

As in this embodiment mode, a conductive composition including a conductive high molecule (also called conductive polymer) can be used for the electrode layers (a pixel electrode layer and first and second electrode layers) used in a display element as a function layer. When a thin film of a conductive composition is formed as an electrode layer, the thin film preferably has sheet resistance of equal to or less than 10000 Ω/square and light transmittance of equal to or higher than 70% at a wavelength of 550 nm. In addition, the resistance of the conductive high molecule which is included in the conductive composition is desirably equal to or less than 0.1 Ω·cm.

As the conductive high molecule, a so-called π electron conjugated conductive polymer can be used. For example, polyaniline and/or a derivative thereof, polypyrrole and/or a derivative thereof, polythiophene and/or a derivative thereof, and a copolymer of two or more of those materials can be given.

As specific examples of a conjugated conductive high molecule, the following can be given: polypyrrole; poly(3-methylpyrrole); poly(3-butylpyrrole); poly(3-octylpyrrole); poly(3-decylpyrrole); poly(3,4-dimethylpyrrole); poly(3,4-dibutylpyrrole); poly(3-hydroxypyrrole); poly(3-methyl-4-hydroxypyrrole); poly(3-methoxypyrrole); poly(3-ethoxypyrrole); poly(3-ethoxypyrrole); poly(3-octoxypyrrole); poly(3-carboxypyrrole); poly(3-methyl-4-carboxypyrrole); poly(N-methylpyrrole); polythiophene; poly(3-methylthiophene); poly(3-butylthiophene); poly(3-octylthiophene); poly(3-decylthiophene); poly(3-dodecylthiophene); poly(3-methoxythiophene); poly(3-ethoxythiophene); poly(3-octoxythiophene); poly(3-carboxythiophene); poly(3-methyl-4-carboxythiophene); poly(3,4-ethylenedioxythiophene); polyaniline; poly(2-methylaniline); poly(2-octylaniline); poly(2-isobutylaniline); poly(3-isobutylaniline); poly(2-aniline sulfonic acid); poly(3-aniline sulfonic acid); and the like.

An organic resin or a dopant may be added to the electrode layer including a conductive high molecule. When an organic resin is added, characteristics of the film, such as film strength and the shape can be controlled and a film with a favorable shape can be formed. When a dopant is added, the electrical conductivity of the film can be controlled to improve the conductivity.

The organic resin which is added to the electrode layer including a conductive high molecule may be a thermosetting resin, a thermoplastic resin, or a photocurable resin as long as the organic resin is compatible with the conductive high molecule or the organic resin can be mixed and dispersed into the conductive polymer.

Among examples of a dopant which is added to the electrode layer including a conductive high molecule, a halogen, a Lewis acid, an inorganic acid, an organic acid, a halide of a transition metal, an organic cyano compound, and a nonionic surfactant or the like can be used particularly as an acceptor dopant.

The liquid composition can be obtained by dissolving a conductive composition in water or an organic solvent (such as an alcohol-based solvent, a ketone-based solvent, an ester-based solvent, a hydrocarbon-based solvent, or an aromatic-based solvent).

After the conductive composition is dissolved in a solvent as described above, a film thereof can be formed by a wet process, such as a droplet discharge method (also referred to as an inkjet method).

As the conductive material having a light-transmitting property which is used for the electrode layers (the pixel electrode layer, and the first and second electrode layers) used in the display element as the function layer as in this embodiment mode, indium tin oxide (ITO), indium tin oxide containing silicon oxide (ITSO), organoindium, organotin, zinc oxide, titanium nitride, or the like can be used. Alternatively, indium zinc oxide (IZO) containing zinc oxide (ZnO), zinc oxide (ZnO), ZnO doped with gallium (Ga), tin oxide ($SnO_2$), indium oxide containing tungsten oxide, indium zinc oxide containing tungsten oxide, indium oxide containing titanium oxide, indium tin oxide containing titanium oxide, or the like may be used. Further, as a conductive material having reflectivity to light, a material in which a substance such as gold, silver, or copper is dissolved or dispersed in a solvent can be used, and for example, silver that has low resistance is preferably used.

When the liquid composition including a function-layer-forming material is discharged to the opening that is subjected to the liquid repellent treatment selectively as described, the lyophilic region at the base of the opening is filled with the composition, and the composition does not flow over the partition of the liquid repellent region and does not flow out to the outside of the region where the function layer is to be formed. Thus, the function layer can be formed at a desired region where the function layer is to be formed in the opening.

Accordingly, the liquid repellent region can be formed selectively without using an expensive vacuum apparatus. Since both the liquid repellent region and the lyophic region can be formed using organic materials, the thickness of the regions is easily increased, and processability is high. Therefore, the range of selection of shapes of the liquid repellent region and the lyophilic region is expanded, so that the function layer having a variety of functions can be formed with high controllability.

Since expensive facilities such as a large vacuum apparatus can be reduced and a function layer having functionality which is used for a display element can be manufactured by a wet process, material use efficiency is higher, and reduction in cost and high productivity can be achieved. Thus, according to the present invention, highly reliable display devices and electronic devices can be manufactured at low cost with improved productivity.

This embodiment mode can be combined with Embodiment Mode 1 as appropriate.

Embodiment Mode 3

This embodiment mode will describe an example of a display device aimed at higher image quality and higher reliability, which can be manufactured at low cost with high productivity. Specifically, this embodiment mode illustrates a liquid crystal display device that uses liquid crystal elements as display elements. Note that, this embodiment mode describes an active matrix liquid crystal display device, which is different from Embodiment Mode 2.

Figure 8A:
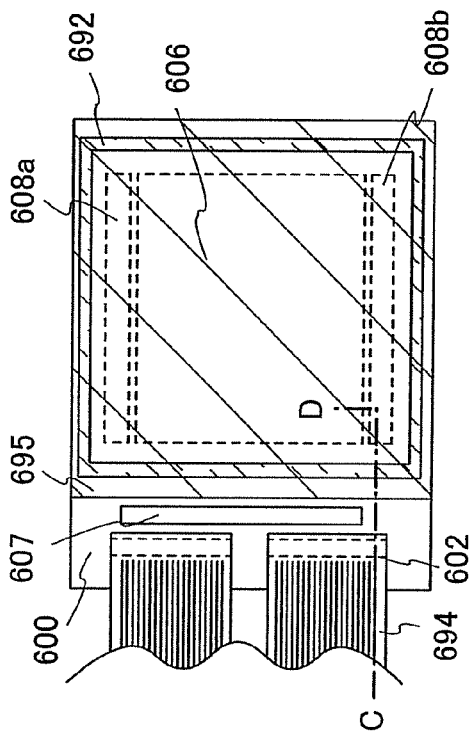
FIG. 8A is a plan view illustrating a display device of the present invention and FIG. 8B is a cross-sectional view thereof.
Figure 8B:
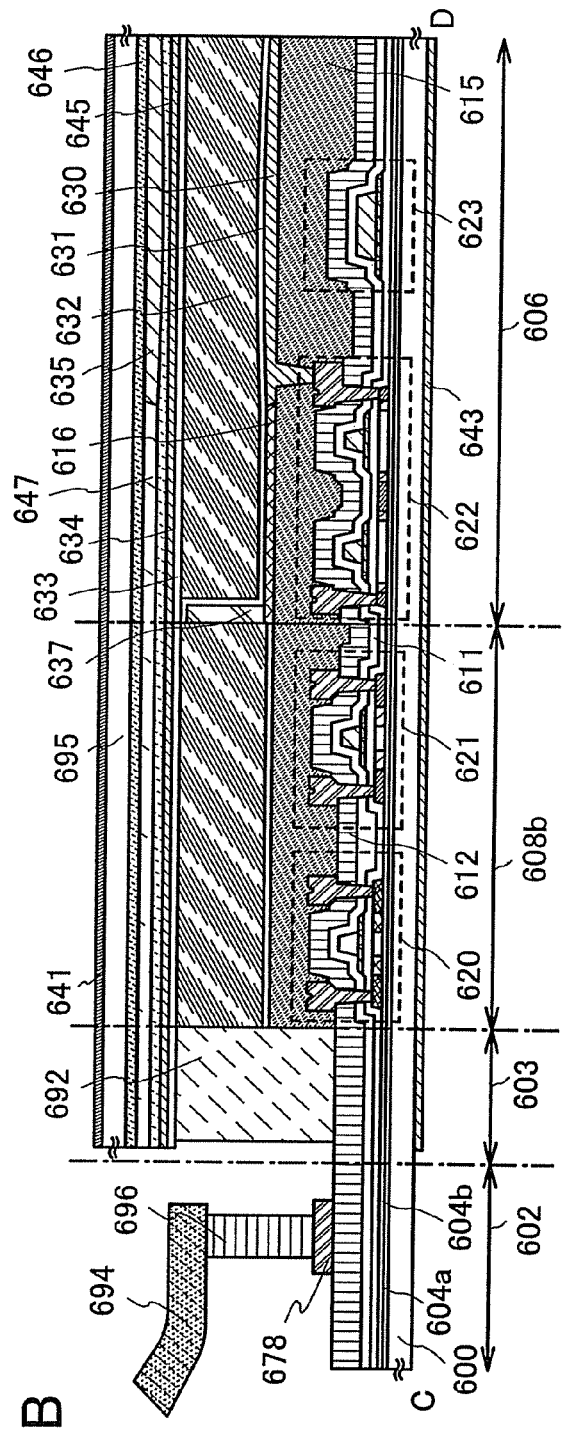

FIG. 8A is a top view of a liquid crystal display device which is one mode of the present invention. FIG. 8B is a cross-sectional view taken along a line C-D in FIG. 8A.

As shown in FIG. 8A, a pixel region 606 and driver circuit regions 608*a* and 608*b* which are scan line driver circuits are sealed between a substrate 600 and a counter substrate 695 with a sealing material 692. In addition, a driver circuit region 607 which is a signal line driver circuit including a driver IC is provided over the substrate 600. In the pixel region 606, a transistor 622 and a capacitor 623 are provided, and in the driver circuit region 608*b*, a driver circuit including a transistor 620 and a transistor 621 is provided. An insulating substrate similar to that of the above embodiment mode can be applied to the substrate 600. However, it is possible to employ a substrate formed from a synthetic resin by transposing substrates after a manufacturing process using a substrate with high heat resistance.

The pixel region 606 is provided with the transistor 622 as a switching element with a base film 604*a* and a base film 604*b* interposed therebetween. In this embodiment mode, the transistor 622 is a multi-gate thin film transistor (TFT) and includes a semiconductor layer including impurity regions that serve as source and drain regions, a gate insulating layer, a gate electrode layer having a stacked structure of two layers, and source and drain electrode layers. The source or drain electrode layer is in contact with and is electrically connected to an impurity region in the semiconductor layer and an electrode layer 630 which is also referred to a pixel electrode layer of the display element.

A material for forming the semiconductor layer can be an amorphous semiconductor (hereinafter also referred to as "AS") formed by a vapor phase growth method or a sputtering method using a semiconductor material gas typified by silane or germane, a polycrystalline semiconductor formed by crystallizing the amorphous semiconductor using light energy or thermal energy, a semi-amorphous semiconductor (also referred to as microcrystal and hereinafter also referred to as "SAS"), or the like. Alternatively, an organic semiconductor material may be used. Note that a single crystal semiconductor may be obtained by using a single crystal semiconductor substrate, an SOI substrate, or the like.

An amorphous semiconductor is typified by hydrogenated amorphous silicon, and a crystalline semiconductor is typified by polysilicon. Polysilicon (polycrystalline silicon) includes so-called high-temperature polysilicon, which is formed using polysilicon formed at process temperatures of equal to or higher than 800° C. as a main material; so-called low-temperature polysilicon, which is formed using polysilicon formed at process temperatures of equal to or lower than 600° C. as a main material; polysilicon which is formed by crystallizing amorphous silicon by using, for example, an element to promote crystallization; and the like. It is needless to say that a semi-amorphous semiconductor or a semiconductor including a crystal phase in a portion of a semiconductor film may also be used as described above.

In a case of using a crystalline semiconductor layer for the semiconductor layer, the crystalline semiconductor layer may be formed by a variety of methods (such as a laser crystallization method, a thermal crystallization method, and a thermal crystallization method using an element such as nickel which promotes crystallization).

The semiconductor layer may be doped with a small amount of an impurity element (boron or phosphorus) in order to control the threshold voltage of thin film transistors.

The gate insulating layer is formed by a plasma CVD method, a sputtering method, or the like. The gate insulating layer may be formed of a material such as an oxide material or a nitride material of silicon, typified by silicon nitride, silicon oxide, silicon oxynitride, or silicon nitride oxide, and may be a stacked layer or a single layer.

The gate electrode layer and the source electrode layer or the drain electrode layer can be formed by forming a conductive film by a sputtering method, a PVD method, a CVD method, an evaporation method, or the like and then etching the conductive film into a desired shape. Alternatively, a conductive layer can be formed as selected in a desired position by a droplet discharge method, a printing method, a dispenser method, an electroplating method, or the like. A reflow method or a damascene method may also be used. The source electrode layer or the drain electrode layer may be formed of a conductive material such as a metal; specifically, a material such as Ag, Au, Cu, Ni, Pt, Pd, Ir, Rh, W, Al, Cr, Nd, Ta, Mo, Cd, Zn, Fe, Ti, Zr, Ba, Si, or Ge, or an alloy or nitride thereof may be used. Further, a stacked-layer structure thereof may also be used.

The impurity regions in the semiconductor layer can be formed as a high concentration impurity region or a low concentration impurity region by controlling the concentration. A structure of such a thin film transistor having such a low concentration impurity region is referred to as an LDD (Lightly doped drain) structure. In addition, the low concentration impurity region can be formed to be overlapped with the gate electrode. A structure of such a thin film transistor is referred to as a GOLD (Gate Overlapped LDD) structure. Polarity of the thin film transistor is to be an n-channel type by using phosphorus (P) or the like in the impurity region. In the case of forming a p-channel TFT, boron (B) or the like may be added. Thereafter, an insulating film 611 and an insulating film 612 covering the gate electrode and the like are formed. A dangling bond of the crystalline semiconductor film can be terminated by a hydrogen element mixed into the insulating film 611 (and the insulating film 612).

For the insulating films 611 and 612, an organic material, an inorganic material, or a stacked structure thereof can be used. For example, the insulating films 611 and 612 can be formed using a material selected from among silicon oxide, silicon nitride, silicon oxynitride, silicon nitride oxide, aluminum nitride, aluminum oxynitride which contains more oxygen than nitrogen, aluminum nitride oxide which contains more nitrogen than oxygen, aluminum oxide, diamond-like carbon (DLC), polysilazane, carbon containing nitrogen (CN), PSG (phosphosilicate glass), BPSG (borophosphosilicate glass), alumina, and other inorganic insulating materials. Also, an organic insulating material may be used, and as the organic material that may be either photosensitive or nonphotosensitive, polyimide, acrylic, polyamide, polyimide amide, resist, benzocyclobutene, a siloxane resin, or the like can be used. Note that the siloxane resin corresponds to a resin containing a Si—O—Si bond. Siloxane is composed of a skeleton structure formed by the bond of silicon (Si) and oxygen (O). As a substituent of siloxane, an organic group containing at least hydrogen (e.g., an alkyl group or an aryl group) is used. An organic group may include a fluoro group.

When a crystalline semiconductor film is used, a pixel region and a driver circuit region can be formed over the same substrate. In this case, a transistor in the pixel portion and the transistor in the driver circuit region 608b are formed at the same time. The transistor used in the driver circuit region 608b constitutes a part of a CMOS circuit. Although the thin film transistor included in the CMOS circuit has a GOLD structure, it may have an LDD structure like the transistor 622.

The thin film transistor is not limited to this embodiment mode, and may have a single gate structure in which one channel formation region is formed, a double gate structure in which two channel formation regions are formed, or a triple gate structure in which three channel formation regions are formed. Further, the thin film transistor in the peripheral driver circuit region may also employ a single gate structure, a double gate structure, or a triple gate structure. Note that the thin film transistor of the present invention can employ in a top-gate structure (such as a staggered structure or a coplanar structure), a bottom-gate structure (such as an inverted staggered structure or an inverted coplanar structure), a dual-gate structure including two gate electrode layers provided above and below a channel region each with a gate insulating film interposed therebetween, or other structures.

Then, an insulating layer 631 which is referred to as an alignment film is formed so as to cover the electrode layer 630 used for the display element, a layer 616 including an organic compound, and a spacer 637 by a printing method or a droplet discharge method. Note that the insulating layer 631 can be selectively formed by using a screen printing method or an offset printing method. Then, a rubbing treatment is performed. The rubbing treatment is not necessarily performed when the mode of liquid crystal is, for example, a VA mode. An insulating layer 633 serving as an alignment film is similar to the insulating layer 631. Subsequently, the sealing material 692 is formed in a peripheral region as a sealing region 603 of the pixels by a droplet discharge method.

After that, the counter substrate 695 provided with the insulating layer 633 serving as the alignment film, an electrode layer 634 of the display element which is also referred to as a counter electrode layer, a coloring layer 635 serving as part of a color filter, and a polarizer (also referred to as a polarizing plate) 641 is attached to the substrate 600 which is a TFT substrate, with a spacer 637 interposed therebetween. A liquid crystal layer 632 is provided in the space. Since the liquid crystal display device of this embodiment mode is of transmissive type, a polarizer (polarizing plate) 643 is provided on a side of the substrate 600 opposite to the side of having elements. The stacked structure of the polarizer and the coloring layer is also not limited to FIGS. 8A and 8B and may be appropriately determined depending on materials of the polarizer and the coloring layer or conditions of a manufacturing process. The polarizer can be provided over the substrate using an adhesive layer. A filler may be mixed into the sealant, and a shielding film (black matrix) or the like may be provided for the counter substrate 695. Note that the color filter or the like may be formed of materials exhibiting red (R), green (G), and blue (B) when the liquid crystal display device performs full color display. When performing monochrome display, the coloring layer may be omitted or formed of a material exhibiting at least one color. Further, an anti-reflection film having an anti-reflection function may be provided on the viewer side of the display device.

Note that the color filter is not provided in some cases where light-emitting diodes (LEDs) of RGB or the like are arranged as a backlight and a successive additive color mixing method (field sequential method) in which color display is performed by time division is employed. The black matrix is preferably provided so as to overlap a transistor and a CMOS circuit for the sake of reducing reflection of external light by wirings of the transistor and the CMOS circuit. Note that the black matrix may be provided so as to overlap a capacitor. This is because the black matrix can prevent reflection due to a metal film forming the capacitor element.

As a method for forming the liquid crystal layer, a dispenser method (dripping method) or an injection method in which the substrate 600 provided with an element and the counter substrate 695 are attached and a liquid crystal is injected with the use of capillary phenomenon can be used.

When handling a large-sized substrate to which the injection method is difficult to be applied, the dripping method may be applied.

The spacer may be provided by spraying particles having a size of several micrometers; however, the spacer in this embodiment mode is formed by forming a resin film over the entire surface of the substrate and etching the resin film. A material of such a spacer is applied by a spinner and then light-exposed and developed to form a predetermined pattern. Further, the pattern is cured by heating at a temperature of 150 to 200° C. with a clean oven. The thus manufactured spacer can have various shapes depending on the conditions of the exposure and development. It is preferable that the spacer have a columnar shape with a flat top so that mechanical strength for the liquid crystal display device can be secured when the counter substrate is attached. The shape of the spacer is not particularly limited and may be conical, pyramidal, or the like.

Then, in an external terminal connection region 602, a terminal electrode layer 678 electrically connected to the pixel region is provided with an FPC 694 that is a wiring board for connection with an anisotropic conductive layer 696 interposed therebetween. The FPC 694 serves to transmit a signal or an electric potential from outside. Through the above-described steps, a liquid crystal display device having a display function can be manufactured.

A retardation film may be stacked between the polarizing plate and the liquid crystal layer.

A layer including an organic compound which serves as an interlayer insulating film for improving planarity is formed. A layer 615 including an organic compound is formed, which has a contact hole reaching the source electrode layer or the drain electrode layer of the transistor 622. Over the layer 615 including an organic compound, a layer 616 including an organic compound having an opening is formed.

The display device of FIGS. 8A and 8B shows an example in which the electrode layer 630 and the coloring layer 635, which are function layers, are each formed in an opening formed with layers including organic compounds. The electrode layer 630 is formed in an opening formed with the layer 616 including an organic compound and the layer 615 including an organic compound which has a C—N bond or a C—O bond in the main chain, which has a contact hole reaching the source electrode layer or the drain electrode layer of the transistor 622.

In the opening, the layer 616 including an organic compound is a partition and the layer 615 including an organic compound is a base region of the opening. By liquid repellent treatment, the layer 616 including an organic compound which is to be the partition has higher liquid repellency than the layer 615 including an organic compound. Thus, the layer 615 including an organic compound uses a layer including an organic compound which has a carbon-nitrogen (C—N) chain or a carbon-oxygen (C—O) bond in the main chain, provided with, on its surface, an oxide layer having high solubility to an organic solvent.

Accordingly, by the liquid repellent treatment, the layer 616 including an organic compound which is to be the partition becomes a higher liquid repellent region, and the layer 615 including an organic compound which is the base becomes a low liquid repellent region (a lyophilic region). By discharge of a composition including a conductive material to the opening where liquid repellency is controlled, the electrode layer 630 can be formed with high controllability. Note that since the electrode layer 630 is in contact with and is electrically connected to the source electrode layer or the drain electrode layer of the transistor 622, the source electrode layer or the drain electrode layer is formed using a conductive material which does not have liquid repellency. In this embodiment mode, since a carbon fluorine layer is formed of an FAS, the source electrode layer or the drain electrode layer is formed of molybdenum to which the FAS is hardly bonded.

In a similar manner, in the case of the coloring layer 635, first, a layer 647 including an organic compound having an opening is formed on a layer 646 including an organic compound provided on the counter substrate 695. The coloring layer 635 is formed in an opening formed with the layer 647 including an organic compound and the layer 646 including an organic compound which has a C—N bond or a C—O bond in the main chain. In the opening, the layer 647 including an organic compound is a partition, and the layer 646 including an organic compound is a base region of the opening. By liquid repellent treatment, the layer 647 including an organic compound which is to be a partition has higher liquid repellency than the layer 646 including an organic compound. Thus, the layer 646 including an organic compound uses a layer including an organic compound which has a carbon-nitrogen (C—N) bond or a carbon-oxygen (C—O) bond in the main chain, provided with, on its surface, an oxide layer having high solubility to an organic solvent.

Accordingly, by the liquid repellent treatment, the layer 647 including an organic compound which is the partition becomes a higher liquid repellent region, and the layer 646 including an organic compound which is the base becomes a lower liquid repellent region (a lyophilic region). By discharge of a composition including a coloring-layer-forming material in the opening where liquid repellency is controlled, the coloring layer 635 can be formed with high controllability. Note that the layer 647 including the organic compound also serves as a light-shielding layer. An insulating layer 645 is formed on the layer 647 including an organic compound and the coloring layer 635.

The electrode layer 630 and the coloring layer 635 which use the present invention may be manufactured using the similar material and process to the description of Embodiment Mode 1, and Embodiment Mode 1 can be applied to manufacturing of the electrode layer 630 and the coloring layer 635.

Figure 13A:
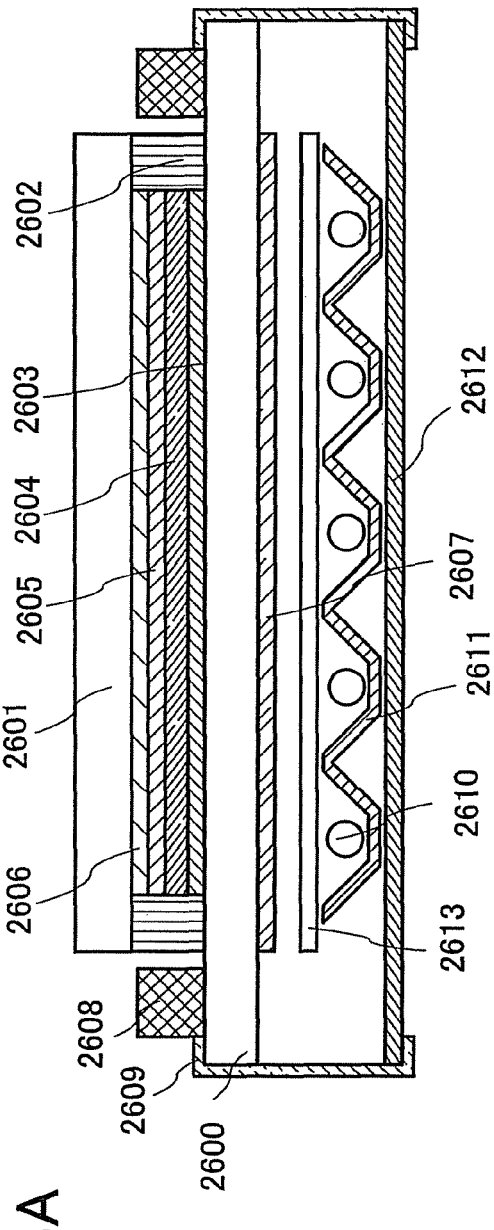
FIGS. 13A and 13B are cross-sectional views each illustrating a display module of the present invention.
Figure 13B:
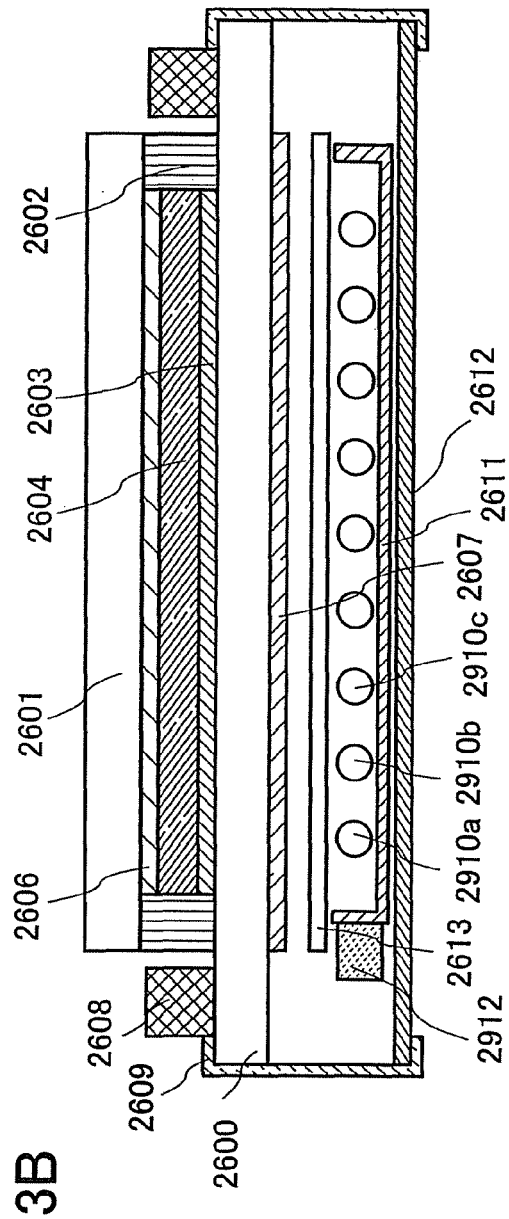

A liquid crystal display module can be manufactured using the display device of FIGS. 8A and 8B. FIGS. 13A and 13B each illustrates an example of a display device (a liquid crystal display module) using a TFT substrate 2600 that is manufactured according to the present invention.

FIG. 13A illustrates an example of a liquid crystal display module, in which the TFT substrate 2600 and a counter substrate 2601 are fixed to each other with a sealant 2602, and a pixel portion 2603 including a TFT and the like, a display element 2604 including a liquid crystal layer, a coloring layer 2605, and a polarizing plate 2606 are provided between the substrates to form a display region. The coloring layer 2605 is necessary to perform color display. In the case of the RGB system, coloring layers corresponding to respective colors of red, green, and blue are provided for respective pixels. The polarizing plate 2606 is provided on an inner side of the counter substrate 2601, and a polarizing plate 2607 and a diffusing plate 2613 are provided outside the TFT substrate 2600. A light source includes a cold cathode tube 2610 and a reflection plate 2611. A circuit board 2612, which has external circuits such as a control circuit and a power supply circuit, is connected to a wiring circuit 2608 of the TFT substrate 2600 with a flexible wiring board 2609. The polarizing plate and the liquid crystal layer may be stacked with a retardation plate interposed therebetween.

The liquid crystal display module can employ a TN (twisted nematic) mode, an IPS (in-plane-switching) mode, an FFS (fringe field switching) mode, an MVA (multi-domain vertical alignment) mode, a PVA (patterned vertical alignment) mode, an ASM (axially symmetric aligned micro-cell) mode, an OCB (optical compensated birefringence) mode, an FLC (ferroelectric liquid crystal) mode, an AFLC (anti ferroelectric liquid crystal) mode, or the like.

FIG. 13B is an example of a field sequential-LCD (FS-LCD) in which an OCB mode is applied to the liquid crystal display module of FIG. 13A. The FS-LCD emits red light, green light, and blue light during one frame period and can perform color display by combining images using a time division method. Also, emission of each color is performed using a light-emitting diode, a cold cathode tube, or the like; hence, a color filter is not required. Thus, it is not necessary to arrange color filters of the three primary colors and limit the display region of each color, and color display of all three colors can be performed in any region. On the other hand, light emission of three colors is performed in one frame period; therefore, high-speed response of liquid crystal is needed. By employing an FLC mode liquid crystal layer, an OCB mode liquid crystal layer, or the like using an FS method to a display device of the present invention, a display device or a liquid crystal television device with high performance and high image quality can be completed.

A liquid crystal layer of the OCB mode includes, so-called a π cell structure. In the π cell structure, liquid crystal molecules are oriented such that pretilt angles of the liquid crystal molecules are symmetrical with respect to the center plane between the active matrix substrate and the counter substrate. An orientation state of a π cell structure becomes sprayed orientation when voltage is not applied between the substrates and shifts to a bent orientation when voltage is applied therebetween. This bent orientation leads to white display. When a voltage is applied further, liquid crystal molecules of bent orientation get orientated perpendicular to the both substrates so that light is not transmitted. Note that approximately ten times as high response speed as that of a conventional TN mode can be achieved with the use of the OCB mode.

Further, as a mode corresponding to the FS system, an HV(HalfV)-FLC, an SS(Surface Stabilized)-FLC in which a ferroelectric liquid crystal (FLC) that can be operated at high speed is used, an SS(Surface Stabilized)-FLC, or the like can also be used. The OCB mode uses a nematic liquid crystal having relatively low viscosity, while the HV-FLC or the SS-FLC can use a smectic liquid crystal that has a ferroelectric phase.

An optical response speed of the liquid crystal display module is increased by narrowing a cell gap of the liquid crystal display module. Alternatively, the optical response speed can be increased by lowering the viscosity of the liquid crystal material. The optical response speed can be further increased by an overdrive method in which an applied voltage is increased (or decreased) only for a moment.

The liquid crystal display module of FIG. 13B is of a transmissive type, in which a red light source 2910a, a green light source 2910b, and a blue light source 2910c are provided as light sources. A control portion 2912 is also provided for switching ON or OFF of the red light source 2910a, the green light source 2910b, and the blue light source 2910c. The control portion 2912 controls light emission of each color, so that light enters the liquid crystal to combine images by time division, thereby performing color display.

When the liquid composition including a function-layer-forming material is discharged to the opening that is subjected to liquid repellent treatment selectively as described, the lyophilic region at the base of the opening is filled with the composition, and the composition does not flow over the partition of the liquid repellent region and flow out to the outside of the region where the function layer is to be formed. Thus, the function layer can be formed at a desired region where the function layer is to be formed in the opening.

Accordingly, the liquid repellent region can be formed selectively without using an expensive vacuum apparatus. Since both the liquid repellent region and the lyophic region can be formed using organic materials, the thickness of the regions is easily increased, and processability is high. Thus, the range of selection of shapes of the liquid repellent region and the lyophilic region is expanded, so that the function layer having a variety of functions can be formed with high controllability.

Since expensive facilities such as a large vacuum apparatus can be reduced and a function layer having functionality which is used for a display element can be manufactured by a wet process, material use efficiency is higher, and reduction in cost and high productivity can be achieved. Thus, according to the present invention, highly reliable display devices and electronic devices can be manufactured at low cost with improved productivity.

This embodiment mode can be combined with Embodiment Mode 1 and Embodiment Mode 2 as appropriate.

Embodiment Mode 4

This embodiment mode will describe an example of a display device aimed at higher image quality and higher reliability, which can be manufactured at low cost with high productivity. More specifically, a light-emitting display device that uses light-emitting elements as display elements will be described. Note that, this embodiment mode describes an active matrix light-emitting display device, which is different from Embodiment Mode 2.

A display device having a light-emitting element can be formed according to the present invention. The light-emitting element emits light by any one of bottom emission, top emission, or dual emission. This embodiment mode will describe examples of a bottom emission type in FIGS. 9A and 9B, a top emission type in FIG. 10, and a dual emission type in FIG. 11.

A display device shown in FIGS. 9A and 9B includes an element substrate 100, a thin film transistor 255, a thin film transistor 265, a thin film transistor 275, a thin film transistor 285, a first electrode layer 185, an electroluminescent layer 188, a second electrode layer 189, a filler 193, a sealant 192, an insulating film 101a, an insulating film 101b, a gate insulating layer 107, an insulating film 167, an insulating film 168, a layer 181 including an organic compound, a layer 186 including an organic compound, a sealing substrate 195, a wiring layer 179, a terminal electrode layer 178, an anisotropic conductive layer 196, and an FPC 194. The display device has an external terminal connection region 202, a sealing region 203, a peripheral driver circuit region 204, and a pixel region 206. Moreover, as shown in FIG. 9A that is a top view of the display device, the display device includes a peripheral driver circuit region 207 and a peripheral driver circuit region 208 that have scan line driver circuits, in addition to the peripheral driver circuit region 204 and a peripheral driver circuit region 209 that have signal line driver circuits.

The display device of FIGS. 9A and 9B is of a bottom emission type, in which light is emitted from the element substrate 100 side in the direction indicated by the arrow. Therefore, the element substrate 100, the insulating films 101a and 101b, the gate insulating layer 107, the insulating film 167, the insulating film 168, the layer 181 including an organic compound, and the first electrode layer 185 each have a light-transmitting property. On the other hand, the second electrode layer 189 has reflectivity in order to reflect light emitted from a light-emitting element 190.

FIGS. 9A and 9B show an example in which the first electrode layer 185 and the electroluminescent layer 188 which are function layers are stacked in an opening formed with layers including organic compounds. The first electrode layer 185 is formed in an opening formed with the layer 186 including an organic compound and the layer 181 including an organic compound provided with a contact hole reaching a source electrode layer or a drain electrode layer of the thin film transistor 255, which has a C—N bond or a C—O bond in the main chain, provided with, on its surface, an oxide layer having high solubility to an organic solvent. In the opening, the layer 186 including an organic compound is to be a partition, and the layer 181 including an organic compound is to be a base, which has a C—N bond or a C—O bond in the main chain, provided with, on its surface, an oxide layer having high solubility to an organic solvent. Accordingly, by liquid repellent treatment including the ultraviolet-ray irradiation step in the atmosphere containing oxygen, the formation step of a carbon fluoride layer, and the etching step using an organic solvent, the layer 186 including an organic compound which is the partition becomes a high liquid repellent region, and the layer 181 including an organic compound which is the base becomes a low liquid repent region (a lyophilic region). By discharge of a composition including a conductive material to the opening where liquid repellency is controlled, the first electrode layer 185 can be formed with high controllability. Note that, since the first electrode layer 185 is in contact with and is electrically connected to the source electrode layer or the drain electrode layer of the thin film transistor 255, the source electrode layer or the drain electrode layer is formed using a conductive material which does not have liquid repellency after the liquid repellent treatment. Since the carbon fluoride layer is formed of an FAS in this embodiment mode, the source electrode layer or the drain electrode layer is formed of molybdenum to which the FAS is hardly bonded.

Figure 10:
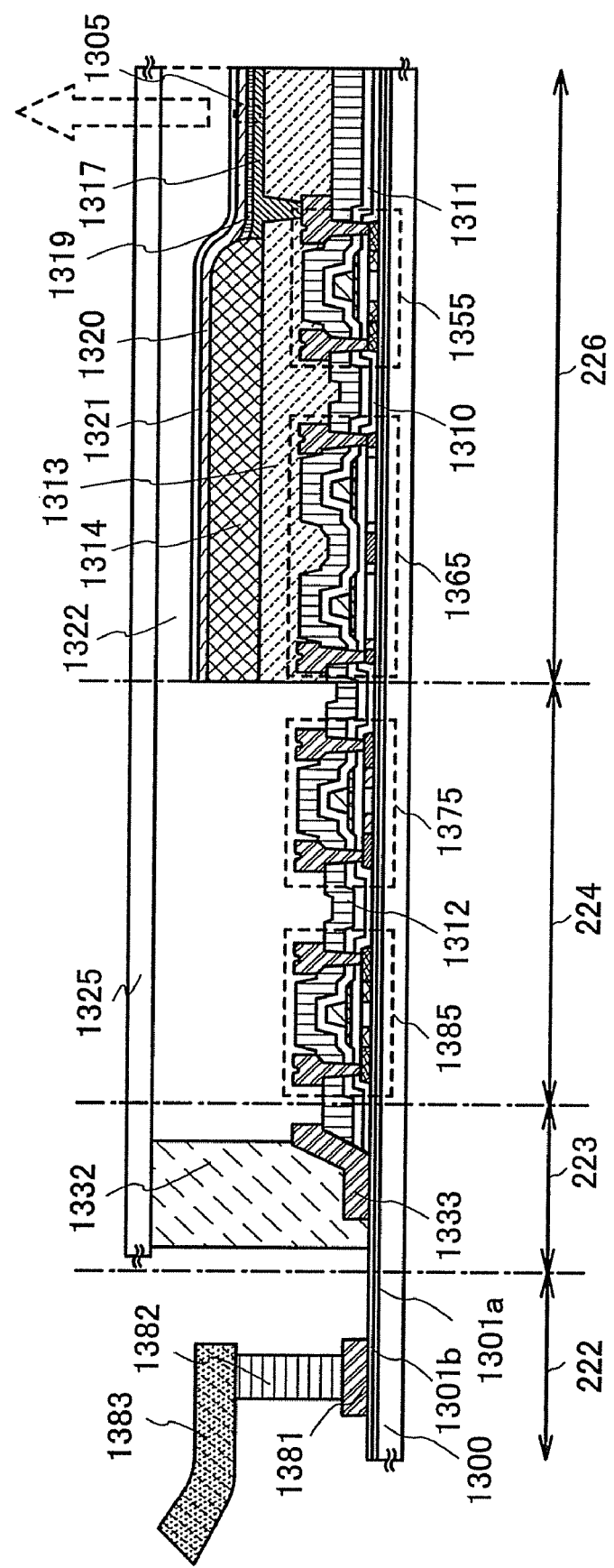
FIG. 10 is a cross-sectional view illustrating a display device of the present invention.
Figure 11:
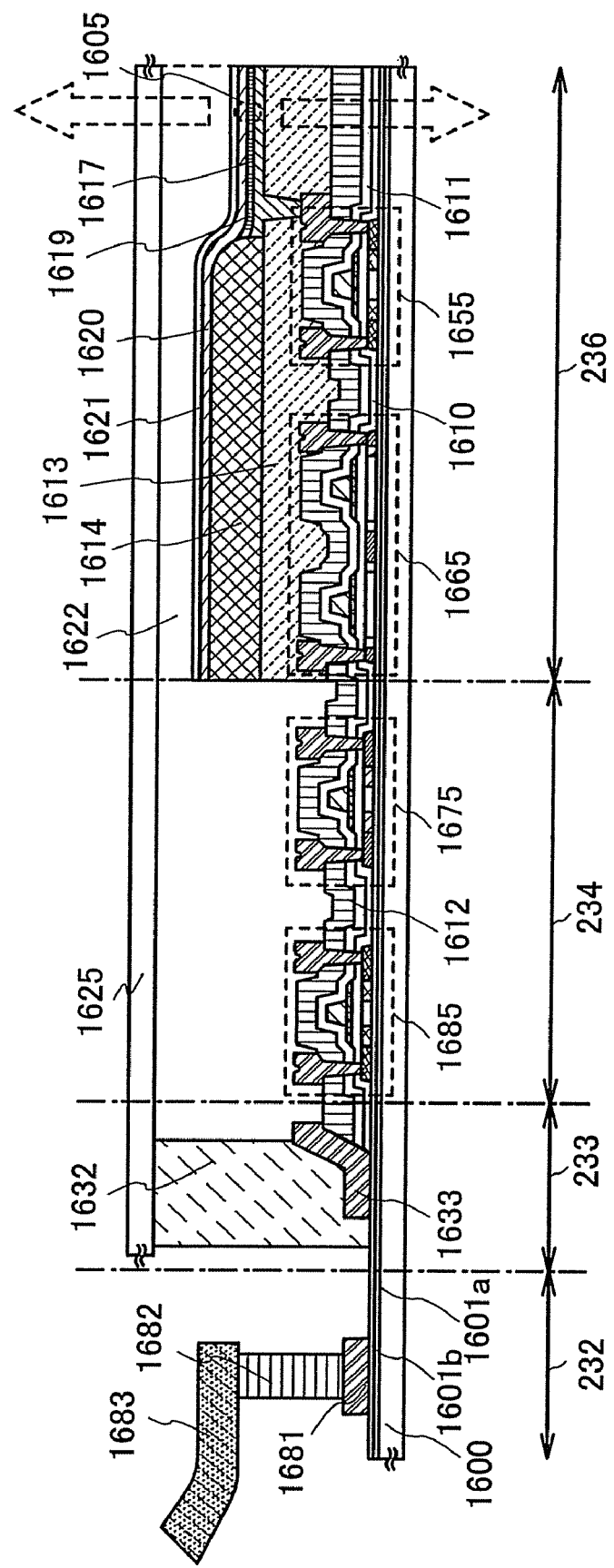
FIG. 11 is a cross-sectional view illustrating a display device of the present invention.

FIG. 10 and FIG. 11 each show an example of a different structure in the display device of FIGS. 9A and 9B, where light is extracted from the light-emitting element.

The display device of top emission type shown in FIG. 10 includes an element substrate 1300, a thin film transistor 1355, a thin film transistor 1365, a thin film transistor 1375, a thin film transistor 1385, a first electrode layer 1317, an electroluminescent layer 1319, a second electrode layer 1320, a protective film 1321, a filler 1322, a sealant 1332, an insulating film 1301a, an insulating film 1301b, a gate insulating layer 1310, an insulating film 1311, an insulating film 1312, a layer 1313 including an organic compound, a layer 1314 including an organic compound, a sealing substrate 1325, a wiring layer 1333, a terminal electrode layer 1381, an anisotropic conductive layer 1382, and an FPC 1383. The display device also includes an external terminal connection region 222, a sealing region 223, a peripheral driver circuit region 224, and a pixel region 226.

The display device of FIG. 10 is of a top emission type, in which light is emitted from the sealing substrate 1325 side in the direction indicated by the arrow. Accordingly, the second electrode layer 1320, the protective film 1321, the filler 1322, and the sealing substrate 1325, each of which transmits light from a light-emitting element 1305, are formed using a material having a light-transmitting property. On the other hand, the first electrode layer 1317 has reflectivity because it reflects light emitted from the light-emitting element.

The display device of FIG. 10 shows an example in which the first electrode layer 1317 and the electroluminescent layer 1319 which are function layers are stacked in an opening formed with layers including organic compounds. The first electrode layer 1317 is formed in an opening formed with the layer 1314 including an organic compound and the layer 1313 including an organic compound provided with a contact hole reaching a source electrode layer or a drain electrode layer of the thin film transistor 1355, which has a C—N bond or a C—O bond in the main chain, provided with, on its surface, an oxide layer having high solubility to an organic solvent. In the opening, the layer 1314 including an organic compound is to be a partition, and the layer 1313 including an organic compound is to be a base, which has a C—N bond or a C—O bond in the main chain, provided with, on its surface, an oxide layer having high solubility to an organic solvent. Accordingly, by liquid repellent treatment including the ultraviolet-ray irradiation step in the atmosphere containing oxygen, the formation step of a carbon fluoride layer, and the etching step using an organic solvent, the layer 1314 including an organic solvent which is the partition becomes a high liquid repellent region, and the layer 1313 including an organic compound which is the base becomes a low liquid repellent region (a lyophilic region). By discharge of a composition including a conductive material in the opening where liquid repellency is controlled, the first electrode layer 1317 can be formed with high controllability. Note that, since the first electrode layer 1317 is in contact with and is electrically connected to the source electrode layer or the drain electrode layer of the thin film transistor 1355, the source electrode layer or the drain electrode layer is formed using a conductive material which does not have liquid repellency after the liquid repellent treatment. Since the carbon fluoride layer is formed of an FAS in this embodiment mode, the source electrode layer or the drain electrode layer is formed of molybdenum to which the FAS is hardly bonded.

The dual emission type display device of FIG. 11 includes an element substrate 1600, thin film transistors 1655, 1665, 1675 and 1685, a first electrode layer 1617, an electroluminescent layer 1619, a second electrode layer 1620, a protective film 1621, a filler 1622, a sealant 1632, an insulating films 1601a, an insulating film 1601b, a gate insulating layer 1610, an insulating film 1611, an insulating film 1612, a layer 1613 including an organic compound, a layer 1614 including an organic compound, a sealing substrate 1625, a wiring layer 1633, a terminal electrode layer 1681, an anisotropic conductive layer 1682, and an FPC 1683. The display device has an external terminal connection region 232, a sealing region 233, a peripheral driver circuit region 234, and a pixel region 236.

The display device shown in FIG. 11 is of a dual emission structure, in which light is emitted through both the element substrate 1600 and the sealing substrate 1625 in directions of arrows. Thus, a light-transmitting electrode layer is used for each of the first electrode layer 1617 and the second electrode layer 1620. Furthermore, the layer 1613 including an organic compound, the insulating film 1612, the insulating film 1611, the gate insulating layer 1610, the insulating films 1601a and 1610b, the element substrate 1600, the protective film 1621, the filler 1622, and the sealing substrate 1625, each of which transmits light from the light-emitting element 1605, are formed using a material having a light-transmitting property.

The display device of FIG. 11 shows an example in which the first electrode layer 1617 and the electroluminescent layer 1619 which are function layers are staked in an opening formed with layers including organic compounds. The first electrode layer 1617 is formed in an opening formed with the layer 1614 including an organic compound and the layer 1613 including an organic compound provided with a contact hole reaching a source electrode layer or a drain electrode layer of the thin film transistor 1655, which has a C—N bond or a C—O bond in the main chain, provided with, on its surface, an oxide layer having high solubility to an organic solvent. In the opening, the layer 1614 including an organic compound is to be a partition, and the layer 1613 including an organic compound is to be a base, which has a C—N bond or a C—O bond in the main chain, provided with, on its surface, an oxide layer having high solubility to an organic solvent. Accordingly, by liquid repellent treatment including the ultraviolet-ray irradiation step in the atmosphere containing oxygen, the formation step of a carbon fluoride layer, and the etching step using an organic solvent, the layer 1614 including the organic compound which is the partition becomes a high liquid repellent region, and the layer 1613 including the organic compound which is the base becomes a low liquid repent region (a lyophilic region). By discharge of a composition including a conductive material in the opening where liquid repellency is controlled, the first electrode layer 1617 can be formed with high controllability. Note that, since the first electrode layer 1617 is in contact with and is electrically connected to the source electrode layer or the drain electrode layer of the thin film transistor 1655, the source electrode layer or the drain electrode layer is formed using a conductive material which does not have liquid repellency after the liquid repellent treatment. Since the carbon fluoride layer is formed of an FAS in this embodiment mode, the source electrode layer or the drain electrode layer is formed of molybdenum to which the FAS is hardly bonded.

As the conductive material having a light-transmitting property which can be used for the first electrode layer and the second electrode layer used in the light-emitting element, indium tin oxide (ITO), indium tin oxide containing silicon oxide (ITSO), organoindium, organotin, zinc oxide, titanium nitride, or the like can be used. Alternatively, indium zinc oxide (IZO) containing zinc oxide (ZnO), zinc oxide (ZnO), ZnO doped with gallium (Ga), tin oxide ($SnO_2$), indium oxide containing tungsten oxide, indium zinc oxide containing tungsten oxide, indium oxide containing titanium oxide, indium tin oxide containing titanium oxide, or the like may be used.

As a conductive material having reflectivity that can be used for the first electrode layer and the second electrode layer in the light-emitting element, a conductive material formed of titanium, tungsten, nickel, gold, platinum, silver, copper, tantalum, molybdenum, aluminum, magnesium, calcium, lithium, or an alloy thereof may be used. A substance which has high reflectivity in a visible light region is preferably used.

Further, an insulating layer may be provided as a passivation film (protective film) over the light-emitting element. The passivation film can be formed in either a single layer or stacked layers, using an insulating film such as a silicon nitride film, a silicon oxide film, a silicon oxynitride film, a silicon nitride oxide film, an aluminum nitride film, an aluminum oxynitride film containing more oxygen than nitrogen, an aluminum nitride oxide film containing more nitrogen than oxygen, an aluminum oxide film, a diamond-like carbon (DLC) film, or a nitrogen-containing carbon film. Moreover, a siloxane resin may also be used.

As the sealant, it is preferable to use visible light curable, ultraviolet curable, or heat curable resin representatively. For example, a bisphenol-A liquid resin, a bisphenol-A solid resin, a bromine-containing epoxy resin, a bisphenol-F resin, a bisphenol-AD resin, a phenol resin, a cresol resin, a novolac resin, a cycloaliphatic epoxy resin, an Epi-Bis type epoxy resin, a glycidyl ester resin, a glycidyl amine-based resin, a heterocyclic epoxy resin, or a modified epoxy resin can be used.

Instead of the filler, nitrogen or the like may be encapsulated by sealing in a nitrogen atmosphere. In the case where light is extracted from a display device through the filler, the filler is required to transmit light. For example, a visible light curable epoxy resin, a UV curable epoxy resin, or a thermosetting epoxy resin may be used for the filler. Further, the filler may be dripped in a liquid state to fill the display device. When a hygroscopic substance such as a drying agent is used as the filler, or the filler is doped with a hygroscopic substance, higher moisture absorbing effect can be achieved and deterioration of elements can be prevented.

Note that the case where the light-emitting element is sealed with a glass substrate is described in this embodiment mode. Sealing treatment corresponds to treatment for protecting the light-emitting element from moisture, and any of the following methods is used: a method of mechanically sealing with a cover material, a method of sealing with a thermosetting resin or an ultraviolet curable resin, and a method of sealing with a thin film having high barrier capability, which is formed using metal oxide, nitride, or the like. As the cover material, glass, ceramics, a plastic, or metal can be used, but a material which transmits light is required to be used in a case where light is emitted to a cover material side. The cover material and the substrate over which the aforementioned light-emitting element is formed are attached to each other using a sealant such as a thermal curable resin or an ultraviolet curable resin. Then, the resin is cured by thermal treatment or ultraviolet irradiation treatment to form an enclosed space. It is also effective to provide an absorbent typified by barium oxide in this enclosed space. The absorbent material may be provided over the sealant or over a partition wall or a peripheral part so as not to block light emitted from the light-emitting element.

In addition, reflected light of light entering from outside may be blocked with the use of a retardation plate or a polarizing plate. An insulating layer serving as a partition may be colored and used as a black matrix. This partition can be formed by a droplet discharge method. Carbon black or the like may be mixed into a resin material such as polyimide, and a stack thereof may also be used. Further, a partition may also be formed by discharging different materials in the same region a plurality of times by a droplet discharge method. As the retardation film, a quarter wave plate and a half wave plate may be used and may be designed to be able to control light. As the structure, the element substrate, the light-emitting element, the sealing substrate (sealant), the retardation plates (a quarter wave plate and a half wave plate), and the polarizing plate are sequentially provided, and light emitted from the light-emitting element is transmitted therethrough and is emitted to the outside from the polarizing plate side. The phase difference plates and the polarizing plate may be provided on a side where light is emitted or may be provided on both sides in the case of a dual emission display device in which light is emitted from both the surfaces. In addition, an anti-reflection film may be provided over the outer sides of the polarizing plate. Accordingly, an image with higher resolution and precision can be displayed.

Although the display device of this embodiment mode is constructed of the circuits as described above, the present invention is not limited thereto. For example, IC chips may be mounted as the peripheral driver circuits by a COG method or a TAB method as described above. Moreover, a gate line driver circuit and a source line driver circuit may be provided in any number.

In the display device of the present invention, a driving method for an image display is not particularly limited, and a dot sequential driving method, a line sequential driving method, an area sequence driving method and the like may be used. Typically, the line sequential driving method is used, and a time division gray scale driving method or an area gray scale driving method may be appropriately used. Further, a video signal inputted to the source line of the display device may be either an analog signal or a digital signal. The driver circuit and the like may be appropriately designed in accordance with the video signal.

When the liquid composition including a function-layer-forming material is discharged to the opening that is subjected to the liquid repellent treatment selectively as described, the lyophilic region at the base of the opening is filled with the composition, and the composition does not flow over the partition of the liquid repellent region and does not flow out to the outside of the region where the function layer is to be formed. Thus, the function layer can be formed at a desired region where the function layer is to be formed in the opening.

Accordingly, the liquid repellent region can be formed selectively without using an expensive vacuum apparatus. Since both the liquid repellent region and the lyophic region can be formed using an organic material, the thickness of the regions is easily increased, and processability is high. Thus, the range of selection of shapes of the liquid repellent region and the lyophilic region is expanded, and the function layer having a variety of functions can be formed with high controllability.

Since expensive facilities such as a large vacuum apparatus can be reduced and a function layer having functionality which is used for a display element can be manufactured by a wet process, material use efficiency is higher, and reduction in cost and high productivity can be achieved. Thus, according to the present invention, highly reliable display devices and electronic devices can be manufactured at low cost with improved productivity.

This embodiment mode can be combined with Embodiment Mode 1 and Embodiment Mode 2 as appropriate.

Embodiment Mode 5

This embodiment mode will describe an example of a display device aimed at higher image quality and higher reliability, which can be manufactured at low cost with high productivity. More specifically, a light-emitting display device that uses a light-emitting element as a display element will be described. In this embodiment mode, a structure of a light-emitting element which can be applied as a display element of a display device of the present invention will be described with reference to FIGS. 16A to 16D.

FIGS. 16A to 16D each show an element structure of a light-emitting element, in which an EL layer 860 is interposed between a first electrode layer 870 and a second electrode layer 850. As shown in FIGS. 16A to 16D, the EL layer 860 includes a first layer 804, a second layer 803, and a third layer 802. In FIGS. 16A to 16D, the second layer 803 is a light-emitting layer, and the first layer 804 and the third layer 802 are function layers.

The first layer 804 has a function of transporting holes to the second layer 803. A hole injecting layer included in the first layer 804 of FIGS. 16A to 16D includes substances having a high hole injecting property. As a substance having a high hole injecting property, molybdenum oxide, vanadium oxide, ruthenium oxide, tungsten oxide, manganese oxide, or the like can be used. In addition, the first layer 804 can be formed using a phthalocyanine-based compound such as phthalocyanine (abbreviation: $H_2Pc$) or copper phthalocyanine (CuPc); an aromatic amine compound such as 4,4'-bis[N-(4-diphenylaminophenyl)-N-phenylamino]biphenyl (abbreviation: DPAB) or 4,4'-bis(N-{4-[N-(3-methylphenyl)-N-phenylamino]phenyl}-N-phenylamino)biphenyl (abbreviation: DNTPD); a high molecular compound such as poly(ethylenedioxythiophene)/poly(styrenesulfonate) (abbreviation: PEDOT/PSS); or the like.

Further, a composite material including an organic compound and an inorganic compound can be used for the hole injecting layer. In particular, the composite material including an organic compound and an inorganic compound showing an electron accepting property to the organic compound donates and accepts electrons between the organic compound and the inorganic compound, and the carrier density increases, which contributes to improvement of a hole injecting property and a hole transporting property.

Further, in the case where a composite material including an organic compound and an inorganic compound is used as the hole injecting layer, the hole injecting layer can form an ohmic contact with the electrode layer; therefore, a material of the electrode layer can be selected regardless of work function.

As the inorganic compound used for the composite material, an oxide of a transition metal is preferably used. In addition, an oxide of metals that belong to Group 4 to Group 8 of the periodic table can be given. Specifically, vanadium oxide, niobium oxide, tantalum oxide, chromium oxide, molybdenum oxide, tungsten oxide, manganese oxide, and rhenium oxide are preferable because they have high electron-accepting properties. Among them, molybdenum oxide is particularly preferable because it is stable in the atmosphere, low in hygroscopicity, and is easy to be handled.

As the organic compound used for the composite material, various compounds such as an aromatic amine compound, a carbazole derivative, aromatic hydrocarbon, and a high molecular compound (oligomer, dendrimer, polymer, or the like) can be used. The organic compound used for the composite material is preferably an organic compound having a high hole transporting property. Specifically, a substance having a hole mobility of $10^{-6}$ $cm^2/Vs$ or higher is preferably used. Further, other materials having a higher hole transporting property than an electron transporting property may be used. The organic compound that can be used for the composite material is specifically shown below.

For example, the following can be represented as the aromatic amine compound: N,N'-di(p-tolyl)-N,N'-diphenyl-p-phenylenediamine (abbreviation: DTDPPA); 4,4'-bis[N-(4-diphenylaminophenyl)-N-phenylamino]biphenyl (abbreviation: DPAB); 4,4'-bis(N-{4-[N'-(3-methylphenyl)-N-phenylamino]phenyl}-N-phenylamino)biphenyl (abbreviation: DNTPD); 1,3,5-tris[N-(4-diphenylaminophenyl)-N-phenylamino]benzene (abbreviation: DPA3B); and the like.

As the carbazole derivatives which can be used for the composite material, the following can be provided specifically: 3-[N-(9-phenylcarbazol-3-yl)-N-phenylamino]-9-phenylcarbazole (abbreviation: PCzPCA1); 3,6-bis[N-(9-phenylcarbazol-3-yl)-N-phenylamino]-9-phenylcarbazole (abbreviation: PCzPCA2); 3-[N-(1-naphtyl)-N-(9-phenylcarbazol-3-yl)amino]-9-phenylcarbazole (abbreviation: PCzPCN1); and the like.

Moreover, as the carbazole derivative which can be used for the composite material, the following can be given: 4,4'-di(N-carbazolyl)biphenyl (abbreviation: CBP); 1,3,5-tris[4-

(N-carbazolyl)phenyl]benzene (abbreviation: TCPB); 9-[4-(N-carbazolyl)]phenyl-10-phenylanthracene (abbreviation: CzPA); 1,4-bis[4-(N-carbazolyl)phenyl]-2,3,5,6-tetraphenylbenzene; or the like.

As the aromatic hydrocarbon which can be used for the composite material, the following can be given for example: 2-tert-butyl-9,10-di(2-naphthyl)anthracene (abbreviation: t-BuDNA); 2-tert-butyl-9,10-di(1-naphthyl)anthracene; 9,10-bis(3,5-diphenylphenyl)anthracene (abbreviation: DPPA); 2-tert-butyl-9,10-bis(4-phenylphenyl)anthracene (abbreviation: t-BuDBA); 9,10-di(2-naphthyl)anthracene (abbreviation: DNA); 9,10-diphenylanthracene (abbreviation: DPAnth); 2-tert-butylanthracene (abbreviation: t-BuAnth); 9,10-bis(4-methyl-1-naphthyl)anthracene (abbreviation: DMNA); 2-tert-butyl-9,10-bis[2-(1-naphthyl)phenyl]anthracene; 9,10-bis[2-(1-naphthyl)phenyl]anthracene; 2,3,6,7-tetramethyl-9,10-di(1-naphthyl)anthracene; 2,3,6,7-tetramethyl-9,10-di(2-naphthyl)anthracene; 9,9'-bianthryl; 10,10'-diphenyl-9,9'-bianthryl; 10,10'-bis(2-phenylphenyl)-9,9'-bianthryl; 10,10'-bis[(2,3,4,5,6-pentaphenyl)phenyl]-9,9'-bianthryl; anthracene; tetracene; rubrene; perylene; 2,5,8,11-tetra(tert-butyl)perylene; and the like. Besides these compounds, pentacene, coronene, or the like can also be used. In particular, an aromatic hydrocarbon which has a hole mobility of $1\times 10^{-6}$ cm$^2$/Vs or higher and which has 14 to 42 carbon atoms is more preferable.

The aromatic hydrocarbon which can be used for the composite material may have a vinyl skeleton. As the aromatic hydrocarbon having a vinyl group, the following are given for example: 4,4'-bis(2,2-diphenylvinyl)biphenyl (abbreviation: DPVBi); 9,10-bis[4-(2,2-diphenylvinyl)phenyl]anthracene (abbreviation: DPVPA); and the like.

Moreover, a high molecular compound such as poly(N-vinylcarbazole) (abbreviation: PVK) or poly(4-vinyltriphenylamine) (abbreviation: PVTPA) can also be used.

As a substance forming a hole transporting layer included in the first layer 804 of FIGS. 16A to 16D, a substance having a high hole transporting property, specifically, an aromatic amine compound (that is, a compound having a benzene ring-nitrogen bond) is preferable. As a material that is widely used, 4,4'-bis[N-(3-methylphenyl)-N-phenylamino]biphenyl, derivatives thereof such as 4,4'-bis[N-(1-naptyl)-N-phenylamino]biphenyl (hereinafter referred to as NPB), and star burst aromatic amine compounds such as 4,4',4''-tris(N,N-diphenyl-amino)triphenylamine, and 4,4',4''-tris[N-(3-methylphenyl)-N-phenylamino]triphenylamine can be given. These materials described here mainly are substances each having a hole mobility of $10^{-6}$ cm$^2$/Vs or higher. However, other materials than these compounds may also be used as long as the hole transporting properties thereof are higher than the electron transporting properties. The transporting layer is not limited to a single layer, and a mixed layer of the aforementioned substances, or a stacked layer which comprises two or more layers each including the aforementioned substance may be used.

The third layer 802 having a function of transporting and injecting electrons to the second layer 803. In FIGS. 16A to 16D, an electron transporting layer included in the third layer 802 is described. The electron transporting layer can be formed using a substance having a high electron transporting property. For example, a layer including a metal complex or the like having a quinoline or benzoquinoline skeleton, such as tris(8-quinolinolato)aluminum (abbreviation: Alq), tris(4-methyl-8-quinolinolato)aluminum (abbreviation: Almq$_3$), bis(10-hydroxybenzo[h]quinolinato)beryllium (abbreviation: BeBq$_2$), or bis(2-methyl-8-quinolinolato)(4-phenylphenolato)aluminum (abbreviation: BAlq) can be used. Alternatively, a metal complex or the like having an oxazole-based or thiazole-based ligand, such as bis[2-(2-hydroxyphenyl)benzoxazolato]zinc (abbreviation: Zn(BOX)$_2$) or bis[2-(2-hydroxyphenyl)-benzothiazolato]zinc (abbreviation: Zn(BTZ)$_2$) can be used. Besides the metal complexes, 2-(4-biphenylyl)-5-(4-tert-butylphenyl)-1,3,4-oxadiazole (abbreviation: PBD), 1,3-bis[5-(p-tert-butylphenyl)-1,3,4-oxadiazole-2-yl]benzene (abbreviation: OXD-7), 3-(4-biphenylyl)-4-phenyl-5-(4-tert-butylphenyl)-1,2,4-triazole (abbreviation: TAZ), bathophenanthroline (abbreviation: BPhen), bathocuproine (abbreviation: BCP), or the like can also be used. The substances described here mainly are substances each having an electron mobility of $10^{-6}$ cm$^2$/Vs or higher. The electron transporting layer may be formed using other materials than those described above as long as the materials have higher electron transporting properties than hole transporting properties. Furthermore, the electron transporting layer is not limited to a single layer, and two or more layers in which each layer is made of the aforementioned material may be stacked.

In FIGS. 16A to 16D, an electron injecting layer included in the third layer 802 is described. As the electron injecting layer, a substance having a high electron injecting property can be used. As the electron injecting layer, an alkali metal, an alkaline earth metal, or a compound thereof such as lithium fluoride (LiF), cesium fluoride (CsF), or calcium fluoride (CaF$_2$) may be used. Further, a layer of a substance having an electron transporting property, which contains alkali metals, alkaline earth metals, or compounds thereof such as Alq containing magnesium (Mg), may be used. It is preferable to use the layer which is made of a substance having an electron transporting property and contains an alkali metal or an alkaline earth metal as the electron injecting layer since electron injection from the electrode layer is efficiently performed.

Next, the second layer 803 which is a light-emitting layer is described. The light-emitting layer has a function of emitting light and includes an organic compound having a light-emitting property. The light-emitting layer may also include an inorganic compound. The light-emitting layer can be formed using a variety of light-emitting organic compounds and inorganic compounds. The thickness of the light-emitting layer is preferably about 10 to 100 nm.

As the organic compound used in the light-emitting layer is not particularly limited as long as it is an organic compound having a light-emitting property, and for example, the following can be given: 9,10-di(2-naphthyl)anthracene (abbreviation: DNA); 9,10-di(2-naphthyl)-2-tert-buthylanthracence (abbreviation: t-BuDNA); 4,4-bis(2,2-diphenylvinyl)biphenyl (abbreviation: DPVBi); coumarin 30; coumarin 6; coumarin 545; coumarin 545T; perylene; rubrene; periflanthene; 2,5,8,11-tetra(tert-butyl)perylene (abbreviation: TBP); 9,10-diphenylanthracene (abbreviation: DPA); 4-(dicyanomethylene)-2-methyl-6-[p-(dimethylamino)styryl]-4H-pyran (abbreviation: DCM1); 4-(dicyanomethylene)-2-methyl-6-[2-(julolidine-9-yl)ethenyl]-4H-pyran (abbreviation: DCM2); 4-(dicyanomethylene)-2,6-bis[p-(dimethylamino)styryl]-4H-pyran (abbreviation: BisDCM); and the like. In addition, the following compound capable of emitting phosphorescent light can also be used: bis[2-(4',6'-difluorophenyl)pyridinato-N,C$^{2'}$](picolinato)iridium (abbreviation: FIrpic); bis{2-[3',5'-bis(trifluoromethyl)phenyl]pyridinato-N,C$^{2'}$}(picolinato)iridium (abbreviation: Ir(CF$_3$ppy)$_2$(pic)); tris(2-phenylpyridinato-N,C$^{2'}$)iridium (abbreviation: Ir(ppy)$_3$); (acetylacetonato)bis(2-phenylpyridinato-N,C$^{2'}$)iridium (abbreviation: Ir(ppy)$_2$(acac)); (acetylacetonato)bis[2-(2'-thienyl)pyridinato-N,C$^{3'}$]iridium (abbreviation: Ir(thp)$_2$(acac)); (acetylacetonato)bis(2-phenylquinolinato-N,C$^{2'}$)iridium (abbreviation: Ir(pq)₂(acac)); (acetylacetonato)bis[2-(2'-benzothienyl)pyridinato-N,C³']iridium (abbreviation: Ir(btp)₂(acac)); and the like.

Further, a triplet excitation light-emitting material containing a metal complex or the like may be used for the light-emitting layer in addition to a singlet excitation light-emitting material. For example, among pixels emitting light of red, green, and blue, the pixel emitting light of red whose luminance is reduced by half in a relatively short time is formed using a triplet excitation light-emitting material and the other pixels are formed using a singlet excitation light-emitting material. A triplet excitation light-emitting material has a feature of favorable light-emitting efficiency and less power consumption to obtain the same luminance. That is, when a triplet excitation light-emitting material is used for a red pixel, only small amount of current needs to be supplied to a light-emitting element. Thus, the reliability can be improved. To reduce power consumption, the red light-emitting pixel and the green light-emitting pixel may be formed by the triplet excitation light-emitting material, and the blue light-emitting pixel may be formed by a single excitation light-emitting material. Low power consumption can be further achieved when a light-emitting element emits green light, which has high visibility to human eyes, is formed of a triplet excitation light-emitting material.

Furthermore, in addition to the aforementioned organic compounds emitting light, another organic compound may be added to the light-emitting element. As an organic compound that can be added, 4,4-bis(N-carbazolyl)biphenyl (abbreviation: CBP), 1,3,5-tris[4-(N-carbazolyl)phenyl]benzene (abbreviation: TCPB), or the like can be used, in addition to the aforementioned compound such as TDATA, MTDATA, m-MTDAB, TPD, NPB, DNTPD, TCTA, Alq₃, Almq₃, BeBq₂, BAlq, Zn(BOX)₂, Zn(BTZ)₂, BPhen, BCP, PBD, OXD-7, TPBI, TAZ, p-EtTAZ, DNA, t-BuDNA, or DPVBi. However, the organic compound is not limited to the above. Such organic compounds to be added other than the aforementioned organic compounds preferably has higher excitation energy than that of the aforementioned organic compound. A larger amount of the organic compounds are preferably added than the aforementioned organic compound in order that the added organic compound emits light efficiently, which makes it possible to prevent concentration quenching of the organic compound. Alternatively, the added organic compound emits light with the aforementioned organic compound, as another function, which makes it possible to emit light of white color.

The light-emitting layer may have a structure for performing color display by forming a light-emitting layer with a different light emission wavelength band for each pixel. Typically, light-emitting layers corresponding to each color of R (red), G (green), and B (blue) are formed. Also in this case, color purity can be improved and a pixel region can be prevented from having a mirror surface (reflection) by provision of a filter which transmits light of the emission wavelength range on the light-emission side of the pixel. By providing the filters, a circularly polarizing plate and the like which have conventionally been required can be omitted. As a result, loss of light emitted from the light-emitting layers can be eliminated. Further, change in color tone, which occurs when a pixel region (display screen) is obliquely seen, can be reduced.

Either a low-molecular organic light-emitting material or a high-molecular organic light-emitting material may be used for a material of the light-emitting layer. A high-molecular organic light-emitting material has high physical strength in comparison with a low-molecular material, and a durability of an element is high. In addition, manufacture of an element is relatively easy because a high-molecular organic light-emitting material can be formed by coating.

The color of light emission is determined depending on a material forming the light-emitting layer; therefore, a light-emitting element which emits light of a desired color can be formed by selecting an appropriate material for the light-emitting layer. As the high molecular electroluminescent material that can be used to form the light-emitting layer, a polyparaphenylene vinylene based material, a polyparaphenylene based material, a polythiophene based material, or a polyfluorene based material can be given.

As the polyparaphenylene vinylene-based material, a derivative of poly(paraphenylene vinylene) (PPV), poly(2,5-dialkoxy-1,4-phenylenevinylene) (RO-PPV), poly(2-(2'-ethyl-hexoxy)-5-methoxy-1,4-phenylenevinylene) (MEH-PPV), poly(2-dialkoxyphenyl)-1,4-phenylenevinylene) (ROPh-PPV), and the like can be used. As the polyparaphenylene-based material, a derivative of polyparaphenylene (PPP), poly(2,5-dialkoxy-1,4-phenylene) (RO-PPP), poly(2,5-dihexoxy-1,4-phenylene), and the like can be used. As the polythiophene-based material, a derivative of polythiophene (PT), poly(3-alkylthiophene) (PAT), poly(3-hexylthiophene) (PHT), poly(3-cyclohexylthiophene) (PCHT), poly(3-cyclohexyl-4-methylthiophene) (PCHMT), poly(3,4-dicyclohexylthiophene) (PDCHT), poly[3-(4-octylphenyl)-thiophene] (POPT), poly[3-(4-octylphenyl)-2,2-bithiophene] (PTOPT), and the like can be used. As the polyfluorene-based material, a derivative of polyfluorene (PF), poly(9,9-dialkylfluorene) (PDAF), poly(9,9-dioctylfluorene) (PDOF), and the like can be used.

The inorganic compound used for the light-emitting layer may be any inorganic compound as long as light emission of the organic compound is not easily quenched by the inorganic compound, and a variety of kinds of metal oxide and metal nitride can be used. In particular, metal oxide having a metal that belongs to Group 13 or 14 of the periodic table is preferable since light-emission of the organic compound is not easily quenched, and specifically, aluminum oxide, gallium oxide, silicon oxide, and germanium oxide are preferable. However, the second inorganic compound is not limited thereto.

Note that the light-emitting layer may be formed by stacking a plurality of layers each including a combination of the organic compound and the inorganic compound, which are described above, or may further include another organic compound or inorganic compound. The structure of the light-emitting layer can be changed, and modification thereof is possible without departing the spirit and scope of the present invention. For example, instead of providing a specific electron injecting region or light-emitting region, an electrode layer for injecting electrons may be provided or a light-emitting material may be dispersed in the layer.

When a forward bias voltage is applied to a light-emitting element formed of the above-mentioned material, the light-emitting element can emit light. A pixel of a display device which is formed using a light-emitting element can be driven by a passive matrix mode or an active matrix mode. In either mode, each pixel is made to emit light by applying a forward bias thereto in specific timing, and the pixel is in a non-light-emitting state for a certain period. The reliability of a light-emitting element can be improved by applying a reverse bias at the non-light-emitting time. In the light-emitting element, there is a deterioration mode in which emission intensity is decreased under a constant driving condition or a deterioration mode in which a non-light emitting region is enlarged in the pixel and luminance is apparently decreased. However, progression of deterioration can be slowed down by alternating current driving where bias is applied forwardly and reversely; thus, reliability of a light-emitting display device can be improved. In addition, either digital driving or analog driving can be employed.

Thus, a sealing substrate may be provided with a color filter (coloring layer). The color filter (coloring layer) can be formed by an evaporation method or a droplet-discharge method. With the use of the color filter (coloring layer), high-definition display can be performed. This is because a broad peak can be modified to be sharp in a light emission spectrum of each of RGB by the color filter (coloring layer).

Full color display can be achieved by forming a material exhibiting single color emission in combination with a color filter or a color conversion layer. For example, the color filter (coloring layer) or the color conversion layer may be formed over the sealing substrate and then attached to the element substrate.

It is needless to say that display of single color emission may also be performed. For example, an area color type display device can be formed by utilizing single color emission. A passive matrix display portion is suitable for the area color display device, and characters and symbols can be mainly displayed thereon.

Figure 16A:
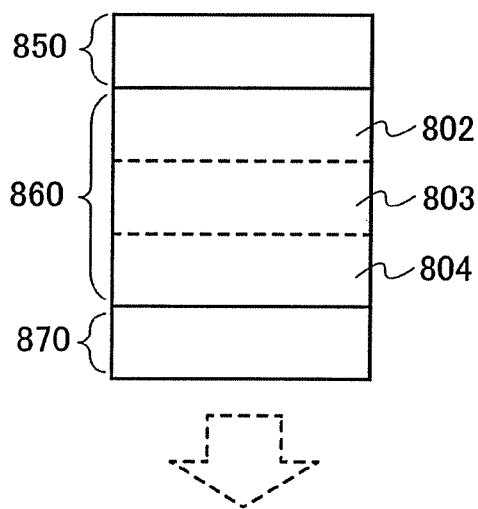
FIGS. 16A to 16D are cross-sectional views each illustrating a structure of a light-emitting element which can be applied to the present invention.
Figure 16B:
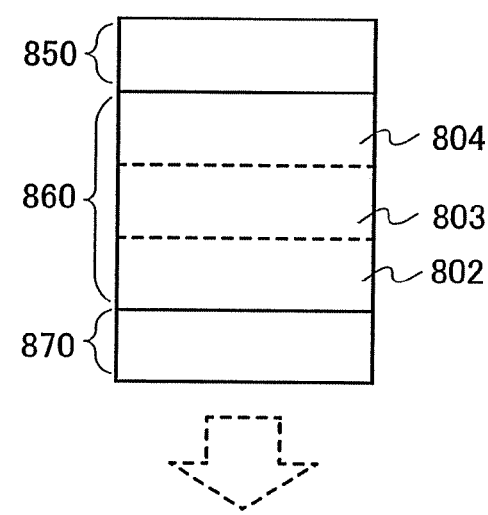

A material of each of the first electrode layer 870 and the second electrode layer 850 should be selected in consideration of a work function. Each of the first electrode layer 870 and the second electrode layer 850 can be either an anode (electrode layer at a high potential) or a cathode (electrode layer at a low potential) depending on the pixel structure. In the case where the polarity of a driving thin film transistor is a p-channel type, the first electrode layer 870 may serve as an anode and the second electrode layer 850 may serve as a cathode, as shown in FIG. 16A. In the case where the polarity of the driving thin film transistor is an n-channel type, the first electrode layer 870 may serve as a cathode and the second electrode layer 850 may serve as an anode, as shown in FIG. 16B. Materials that can be used for the first electrode layer 870 or the second electrode layer 850 will be described. It is preferable to use a material having a high work function (specifically, a material having a work function of 4.5 eV or higher) for one of the first electrode layer 870 and the second electrode layer 850, which serves as an anode, and a material having a low work function (specifically, a material having a work function of 3.5 eV or lower) for the other electrode layer which serves as a cathode. However, since the first layer 804 is excellent in a hole injecting property and a hole transporting property and the third layer 802 is excellent in an electron injecting property and an electron transporting property, there are few restrictions on the work function for both the first electrode layer 870 and the second electrode layer 850 and various materials can be used for them.

The light-emitting elements in FIGS. 16A and 16B each have a structure in which light is extracted from the first electrode layer 870 and thus, the second electrode layer 850 does not necessarily have a light-transmitting property. The second electrode layer 850 may be formed of a film mainly containing an element selected from titanium (Ti), nickel (Ni), tungsten (W), chromium (Cr), platinum (Pt), zinc (Zn), tin (Sn), indium (In), tantalum (Ta), aluminum (Al), copper (Cu), gold (Au), silver (Ag), magnesium (Mg), calcium (Ca), lithium (Li) or molybdenum (Mo), or an alloy material or a compound material containing any of those elements as its main component, such as titanium nitride, $TiSi_xN_y$, $WSi_x$, tungsten nitride, $WSi_xN_y$, or NbN; or a laminate thereof with a total thickness of 100 to 800 nm.

In addition, when the second electrode layer 850 is formed using a light-transmitting conductive material, like the material used for the first electrode layer 870, light is also extracted from the second electrode layer 850, and a dual emission mode can be obtained, in which light emitted from the light-emitting element is emitted to both the first electrode layer 870 side and the second electrode layer 850 side.

Note that the light-emitting element of the present invention can have variations by changing material types of the first electrode layer 870 and the second electrode layer 850.

FIG. 16B shows the case where the EL layer 860 is formed by stacking the third layer 802, the second layer 803, and the first layer 804 in that order from the first electrode layer 870 side.

Figure 16C:
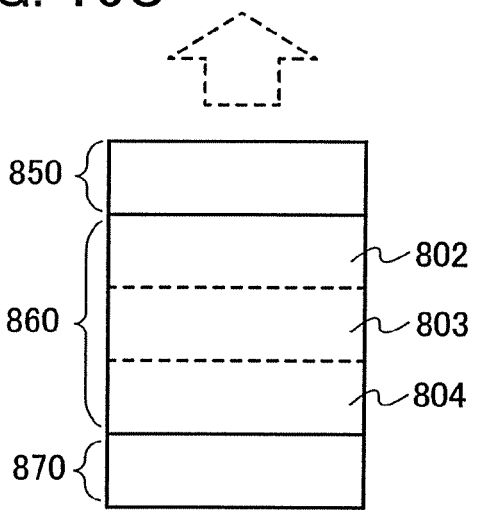
Figure 16D:
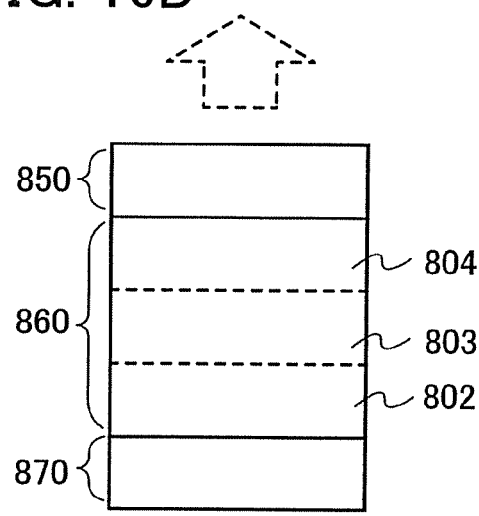

FIG. 16C shows a structure in which an electrode layer having reflectivity is used for the first electrode layer 870 and an electrode layer having a light-transmitting property is used for the second electrode layer 850 in FIG. 16A. Light emitted from the light-emitting element is reflected by the first electrode layer 870 but transmitted through the second electrode layer 850, and emitted to the outside. Similarly, FIG. 16D shows a structure in which an electrode layer having reflectivity is used for the first electrode layer 870 and an electrode layer having a light-transmitting property is used for the second electrode layer 850 in FIG. 16B. Light emitted from the light-emitting element is reflected by the first electrode layer 870 but transmitted through the second electrode layer 850, and emitted to the outside.

Further, a variety of methods can be used as a method for forming the EL layer 860 if an organic compound and an inorganic compound are mixed therein. For example, there is a co-evaporation method of evaporating both an organic compound and an inorganic compound by resistance heating. Alternatively, it is also possible to use a method of evaporating an organic compound by resistance heating, while at the same time evaporating an inorganic compound by electron beams (EB) so that the organic compound and the inorganic compound can be co-deposited. Furthermore, the methods also include a method of sputtering the inorganic compound while evaporating the organic compound by resistance heating to deposit the both at the same time. In addition, deposition may be performed by a wet process.

This embodiment mode can be freely combined with the other embodiment modes regarding a display device including a light-emitting element.

Embodiment Mode 6

This embodiment mode will describe an example of a display device aimed at higher image quality and higher reliability, which can be manufactured at low cost with high productivity. More specifically, a light-emitting display device that uses a light-emitting element as a display element will be described. In this embodiment mode, a structure of a light-emitting element which can be applied as a display element of a display device of the present invention will be described with reference to FIGS. 14A to 14C and FIGS. 15A to 15C.

Light-emitting elements which utilize electroluminescence are classified according to whether their light-emitting materials are an organic compound or an inorganic compound. In general, a light-emitting element whose light-emitting material is an organic compound is referred to as an organic EL element, while a light-emitting element whose light emitting material is an inorganic compound are referred to as an inorganic EL elements.

Inorganic EL elements are classified, according to their element structures, into a dispersed inorganic EL element and a thin-film inorganic EL element. The former and the latter are different in that the former has an electroluminescent layer where particles of a light-emitting material are dispersed in a binder whereas the latter has an electroluminescent layer formed of a thin film of a light-emitting material. However, the former and the latter have in common that electrons accelerated by a high electric field are necessary. Mechanisms for obtaining light emission are donor-acceptor recombination light emission, which utilizes a donor level and an acceptor level, and localized light emission, which utilizes inner-shell electron transition of a metal ion. In general, it is often the case that the dispersed inorganic EL element performs the donor-acceptor recombination light emission and the thin-film inorganic EL element performs the localized light emission.

A light-emitting material which can be used in the present invention includes a base material and an impurity element serving as a light-emitting center. Light emission of various colors can be obtained by changing impurity elements to be included.

As a base material for the light-emitting material, a sulfide, an oxide, or a nitride can be used. As sulfide, zinc sulfide (ZnS), cadmium sulfide (CdS), calcium sulfide (CaS), yttrium sulfide ($Y_2S_3$), gallium sulfide ($Ga_2S_3$), strontium sulfide (SrS), barium sulfide (BaS), or the like can be used, for example. The oxide may be, for example, zinc oxide (ZnO), yttrium oxide ($Y_2O_3$), or the like. Examples of nitride include aluminum nitride (AlN), gallium nitride (GaN), indium nitride (InN), and the like. Furthermore, as the base material used for the light-emitting material, zinc selenide (ZnSe), zinc telluride (ZnTe), or the like can also be used. Alternatively, a ternary mixed crystal such as calcium gallium sulfide ($CaGa_2S_4$), strontium gallium sulfide ($SrGa_2S_4$), or barium gallium sulfide ($BaGa_2S_4$) may also be used.

As a light-emitting center of localized type light emission, manganese (Mn), copper (Cu), samarium (Sm), terbium (Tb), erbium (Er), thulium (Tm), europium (Eu), cerium (Ce), praseodymium (Pr), or the like can be used. Note that a halogen element such as fluorine (F) or chlorine (Cl) may be added. A halogen element can serve as compensating charges.

On the other hand, as the light-emitting center of donor-acceptor recombination light emission, a light-emitting material which includes a first impurity element forming a donor level and a second impurity element forming an acceptor level can be used. As the first impurity element, fluorine (F), chlorine (Cl), aluminum (Al), or the like can be used, for example. Meanwhile, as the second impurity element, copper (Cu), silver (Ag) or the like can be used, for example.

The concentration of the impurity element may be 0.01 to 10 atom % with respect to the base material, and preferably in a range of 0.05 to 5 atom %.

In the case of a thin-film inorganic EL element, an electroluminescent layer is a layer including the above light-emitting material, which can be formed by a vacuum evaporation method such as a resistance heating evaporation method or an electron beam evaporation (EB evaporation) method, a physical vapor deposition (PVD) method such as a sputtering method, a chemical vapor deposition (CVD) method such as a metal organic CVD method or a low-pressure hydride transport CVD method, an atomic layer epitaxy (ALE) method, or the like.

Figure 14A:
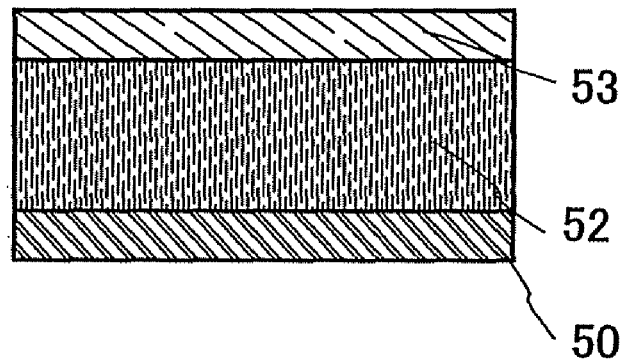
FIGS. 14A to 14C are cross-sectional views each illustrating a structure of a light-emitting element which can be applied to the present invention.
Figure 14B:
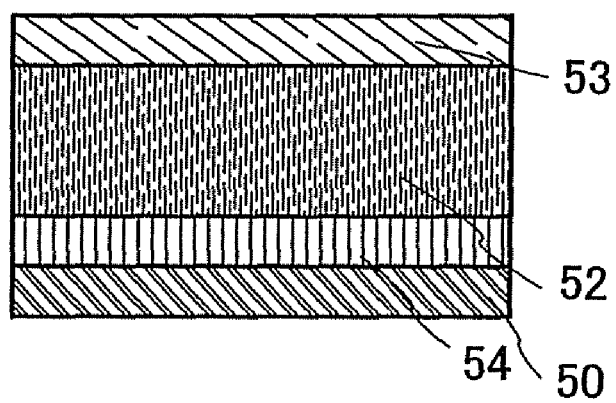
Figure 14C:
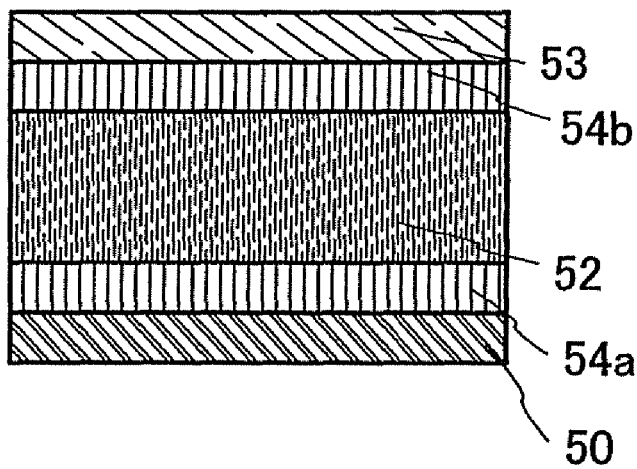

Each of FIGS. 14A to 14C shows an example of a thin-film type inorganic EL element which can be used as the light-emitting element. Each of the light-emitting elements shown in FIGS. 14A to 14C includes a first electrode layer 50, an electroluminescent layer 52, and a second electrode layer 53.

Each of the light-emitting elements shown in FIGS. 14B and 14C has a structure in which an insulating layer is provided between an electrode layer and an electroluminescent layer in the light-emitting element shown in FIG. 14A. The light-emitting element shown in FIG. 14B includes an insulating layer 54 between the first electrode layer 50 and the electroluminescent layer 52. The light-emitting element shown in FIG. 14C includes an insulating layer 54a between the first electrode layer 50 and the electroluminescent layer 52, and an insulating layer 54b between the second electrode layer 53 and the electroluminescent layer 52. Thus, the insulating layer may be provided between the electroluminescent layer and one of the electrode layers that sandwich the electroluminescent layer, or the insulating layers may be provided between the electroluminescent layer and the first electrode layer and between the electroluminescent layer and the second electrode layer. Moreover, the insulating layer may be a single layer or a stacked layer including a plurality of layers.

Although the insulating layer 54 in FIG. 14B is provided to be in contact with the first electrode layer 50, the insulating layer 54 may also be provided to be in contact with the second electrode layer 53 by reversing the order of the insulating layer and the electroluminescent layer.

In the case of a dispersion type inorganic EL element, an electroluminescent layer in a film state is formed by dispersing a light-emitting material in particles in binder. The binder is a substance for fixing particles of the light-emitting material in a dispersed state and keeping a shape as an electroluminescent layer. The light-emitting material is uniformly dispersed in the electroluminescent layer by the binder and fixed.

In a case of a dispersion type inorganic EL element, a method for forming the electroluminescent layer can be a droplet discharge method by which the electroluminescent layer can be selectively formed, a printing method (screen printing, offset printing, or the like), a coating method such as a spin coating method or the like, a dipping method, a dispenser method, or the like. The thickness is not particularly limited, but it is preferably in the range of 10 to 1000 nm. Further, in an electroluminescent layer including the light-emitting material and the binder, the ratio of the light-emitting material is preferably in a range of 50 to 80 wt % inclusive.

Figure 15A:
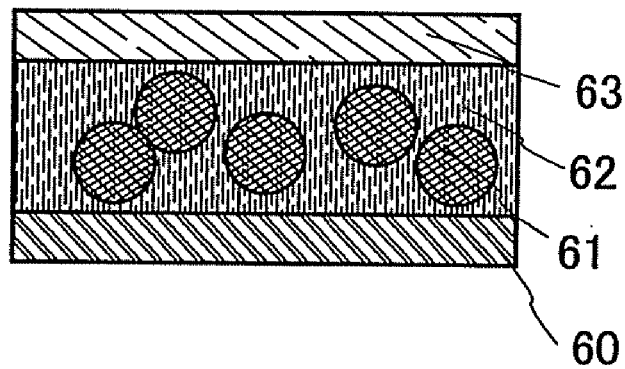
FIGS. 15A to 15C are cross-sectional views each illustrating a structure of a light-emitting element which can be applied to the present invention.
Figure 15B:
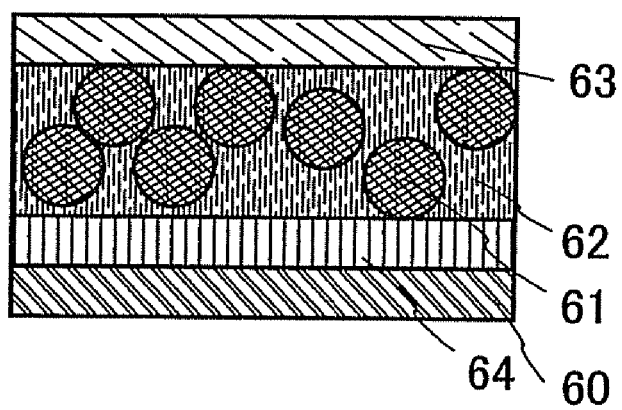
Figure 15C:
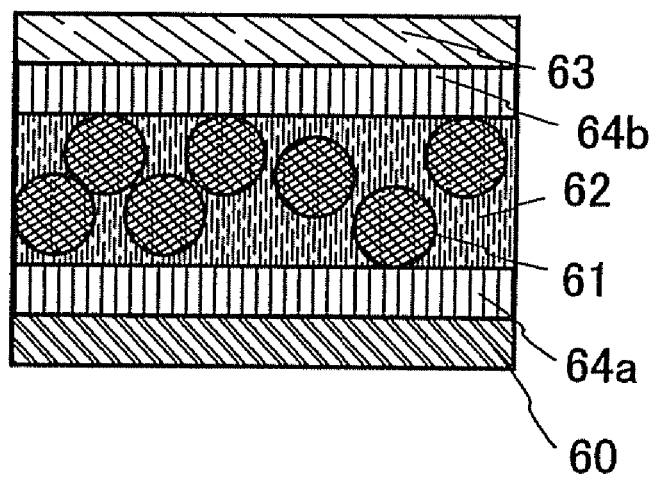

FIGS. 15A to 15C show examples of a dispersion-type inorganic EL element that can be used as a light-emitting element. A light-emitting element shown in FIG. 15A has a stacked structure including a first electrode layer 60, an electroluminescent layer 62, and a second electrode layer 63. The electroluminescent layer 62 includes a light-emitting material 61 fixed by a binder.

As the binder which can be used in this embodiment mode, an organic material or an inorganic material, or a mixed material of an organic material and an inorganic material can be used. As an organic material, the following resin materials can be used: a polymer with a relatively high dielectric constant such as a cyanoethyl cellulose-based resin, or a resin such as polyethylene, polypropylene, a polystyrene-based resin, a silicone resin, an epoxy resin, poly(vinylidene fluoride) resin, or the like. Alternatively, a heat resistant high molecular compound such as aromatic polyamide or polybenzimidazole, or a siloxane resin may be used. Alternatively, a resin material such as a vinyl resin like polyvinyl alcohol or polyvinylbutyral, a phenol resin, a novolac resin, an acrylic resin, a melamine resin, a urethane resin, or an oxazole resin (polybenzoxazole) may be used. The dielectric constant of the material can be controlled by mixing high-dielectricconstant microparticles of barium titanate ($BaTiO_3$), strontium titanate ($SrTiO_3$), or the like into such a resin as appropriate.

As an inorganic material included in the binder, a material selected from any of the following can be used: silicon oxide ($SiO_X$), silicon nitride ($SiN_X$), silicon containing oxygen and nitrogen, aluminum nitride (AlN), aluminum containing oxygen and nitrogen, aluminum oxide ($Al_2O_3$), titanium oxide ($TiO_2$), $BaTiO_3$, $SrTiO_3$, lead titanate ($PbTiO_3$), potassium niobate ($KNbO_3$), lead niobate ($PbNbO_3$), tantalum oxide ($Ta_2O_5$), barium tantalate ($BaTa_2O_6$), lithium tantalate ($LiTaO_3$), yttrium oxide ($Y_2O_3$), zirconium oxide ($ZrO_2$), or other substances containing an inorganic material. When a high-dielectric-constant inorganic material is mixed into an organic material (by doping or the like), it becomes possible to control the dielectric constant of the electroluminescent layer which contains a light-emitting material and a binder more efficiently, whereby the dielectric constant can be further increased. When a mixed layer of an inorganic material and an organic material is used for the binder to have a high dielectric constant, a higher electric charge can be induced with the light-emitting material.

Each of FIGS. 15B and 15C shows a structure in which an insulating layer is provided between the electrode layer and the electroluminescent layer in the light-emitting element shown in FIG. 15A. The light-emitting element shown in FIG. 15B includes an insulating layer 64 between the first electrode layer 60 and the electroluminescent layer 62. The light-emitting element shown in FIG. 15C includes an insulating layer 64a between the first electrode layer 60 and the electroluminescent layer 62, and an insulating layer 64b between the second electrode layer 63 and the electroluminescent layer 62. Thus, the insulating layer may be provided between the electroluminescent layer and one of the electrode layers that sandwich the electroluminescent layer, or the insulating layers may be provided between the electroluminescent layer and the first electrode layer and between the electroluminescent layer and the second electrode layer. Moreover, the insulating layer may be a single layer or a stacked layer including a plurality of layers.

In addition, although the insulating layer 64 is provided to be in contact with the first electrode layer 60 in FIG. 15B, the insulating layer 64 may also be provided to be in contact with the second electrode layer 63 by reversing the order of the insulating layer and the electroluminescent layer.

There is no particular limitation on the insulating layer 54 in FIGS. 14A to 14C and the insulating layer 64 in FIGS. 15A to 15C, but they preferably have high withstand voltage and are dense films. Further, the insulating layer preferably has high dielectric constant. For example, silicon oxide ($SiO_2$), yttrium oxide ($Y_2O_3$), titanium oxide ($TiO_2$), aluminum oxide ($Al_2O_3$), hafnium oxide ($HfO_2$), tantalum oxide ($Ta_2O_5$), barium titanate ($BaTiO_3$), strontium titanate ($SrTiO_3$), lead titanate ($PbTiO_3$), silicon nitride ($Si_3N_4$), zirconium oxide ($ZrO_2$), or the like, or a mixed film or a staked-layer film of two kinds or more thereof can be used. These insulating films can be formed by sputtering, evaporation, CVD, or the like. Further, it is also possible to form an insulating layer by dispersing particles of the materials in a binder. A binder material may be formed of a material that is similar to that of a binder included in the electroluminescent layer and by a method that is similar thereto. The thickness is not particularly limited, but it is preferably in the range of 10 to 1000 nm.

The light-emitting element of this embodiment emits light when voltage is applied between the pair of electrode layers interposing the electroluminescent layer. The light-emitting element of this embodiment can operate with either direct current driving or alternate current driving.

This embodiment mode can be combined with Embodiment Modes 1, 2, and 4 as appropriate.

Embodiment Mode 7

Figure 19:
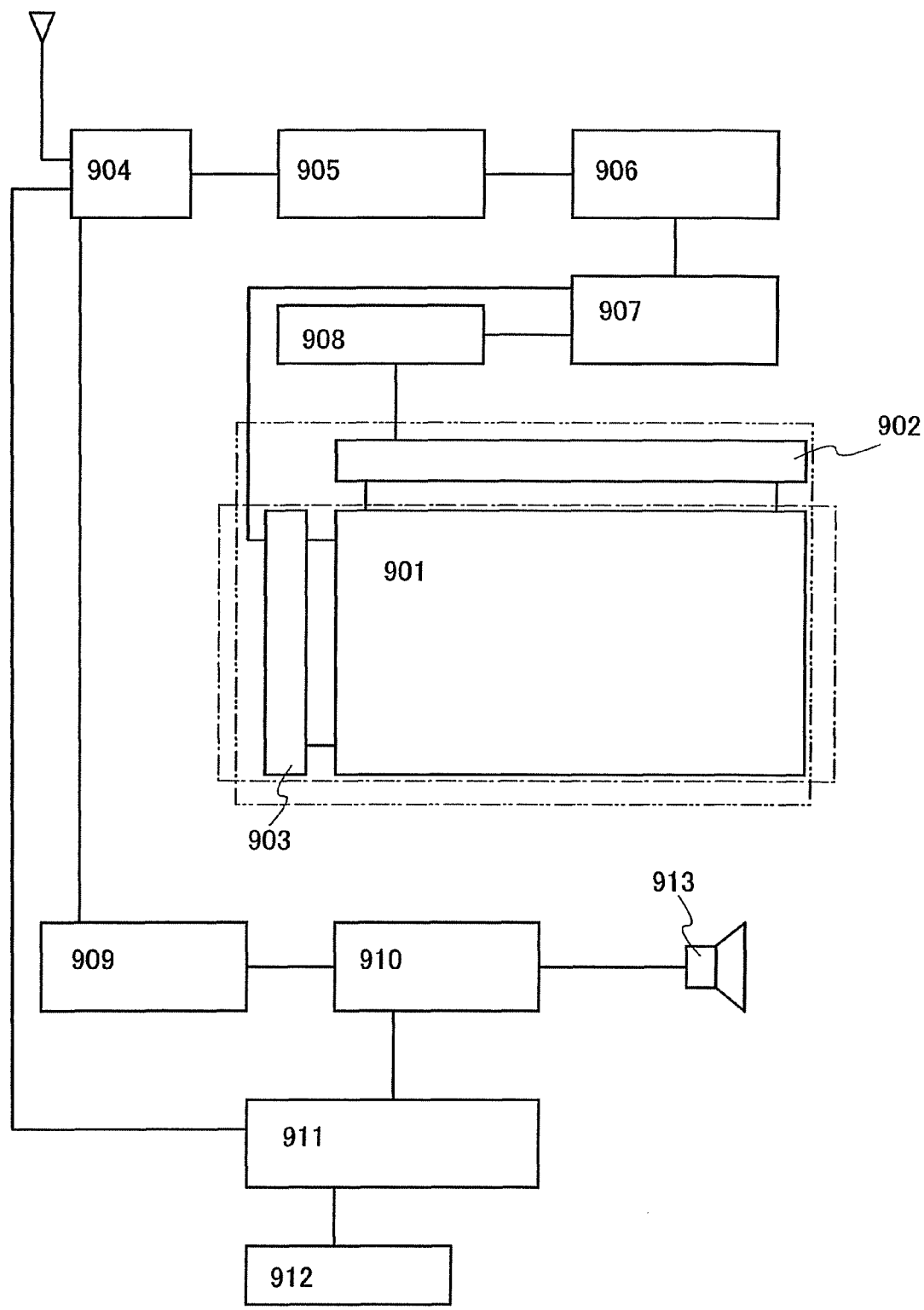
FIG. 19 is a block diagram illustrating a main structure of an electronic device to which the present invention is applied.

By a display device formed by the present invention, a television device (also, referred to as a television simply or a television receiver) can be completed. FIG. 19 is a block diagram showing main components of the television device.

Figure 17A:
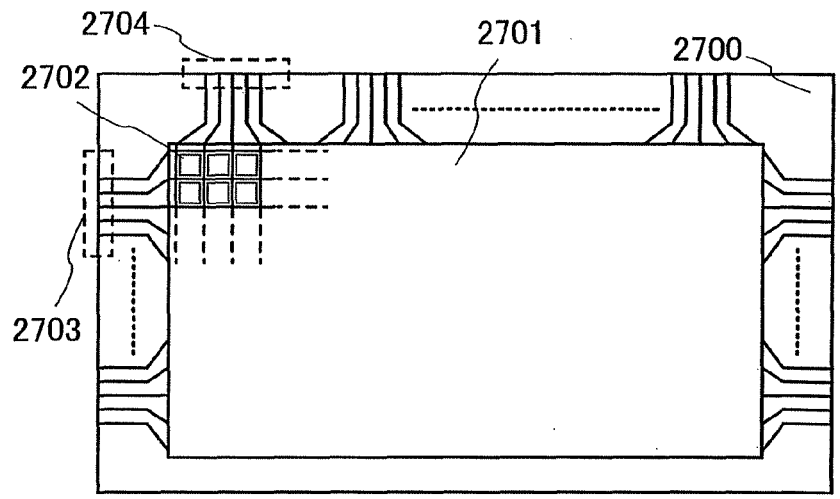
FIGS. 17A to 17C are plan views each illustrating a display device of the present invention.

FIG. 17A is a top view showing a structure of a display panel according to the present invention. A pixel portion 2701 in which pixels 2702 are arranged in matrix, a scan line input terminal 2703, and a signal line input terminal 2704 are formed over a substrate 2700 having an insulating surface. The number of pixels may be determined in accordance with various standards. In the case of an XGA full color display using RGB, the number of pixels may be 1024×768×3 (RGB). In the case of a UXGA full color display using RGB, the number of pixels may be 1600×1200×3 (RGB), and in the case of a full-spec high-definition full color display using RGB, it may be 1920×1080×3 (RGB).

The pixels 2702 are formed in matrix by intersections of scan lines extended from the scan line input terminal 2703 and signal lines extended from the signal line input terminal 2704. Each pixel in the pixel portion 2701 is provided with a switching element and an electrode layer used for a display element, which is connected to the switching element. A typical example of the switching element is a TFT. A gate electrode layer side of the TFT is connected to the scan line, and a source or drain side thereof is connected to the signal line, so that each pixel can be controlled independently by a signal inputted externally.

Figure 18A:
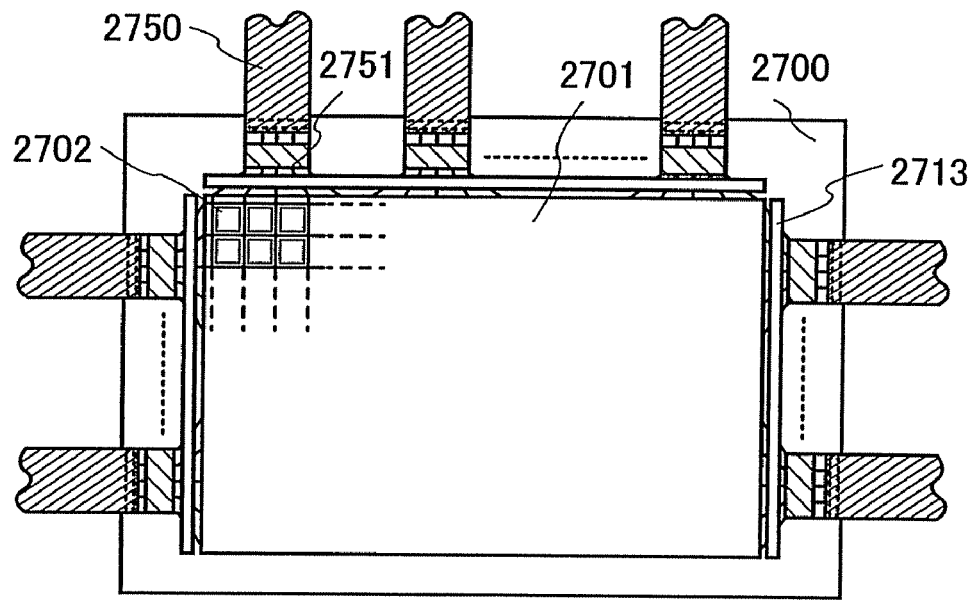
FIGS. 18A and 18B are plan views each illustrating a display device of the present invention.
Figure 18B:
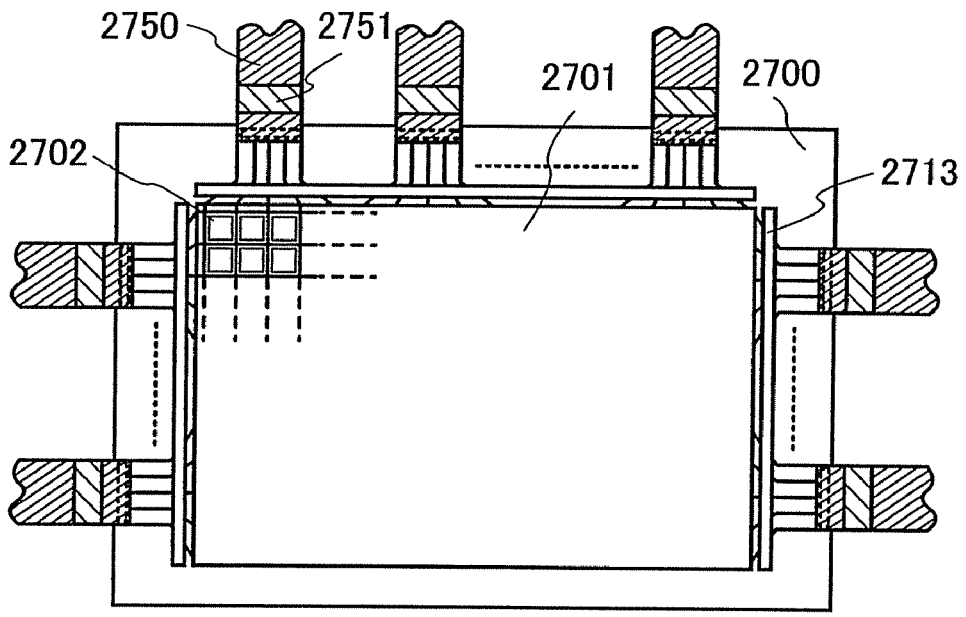

FIG. 17A shows a structure of a display panel in which a signal to be inputted to the scan line and the signal line is controlled by an external driver circuit. Alternatively, a driver IC 2751 may be mounted on the substrate 2700 by a COG (Chip On Glass) method as shown in FIG. 18A. As another mounting mode, a TAB (Tape Automated Bonding) method may be used as shown in FIG. 18B. The driver ICs may be that formed over a single crystal semiconductor substrate or may be a circuit which is formed using a TFT over a glass substrate. In each of FIGS. 18A and 18B, the driver IC 2751 is connected to an FPC (Flexible Printed Circuit) 2750. In each of FIGS. 18A and 18B, a protective circuit 2713 is formed over the substrate 2700.

Figure 17B:
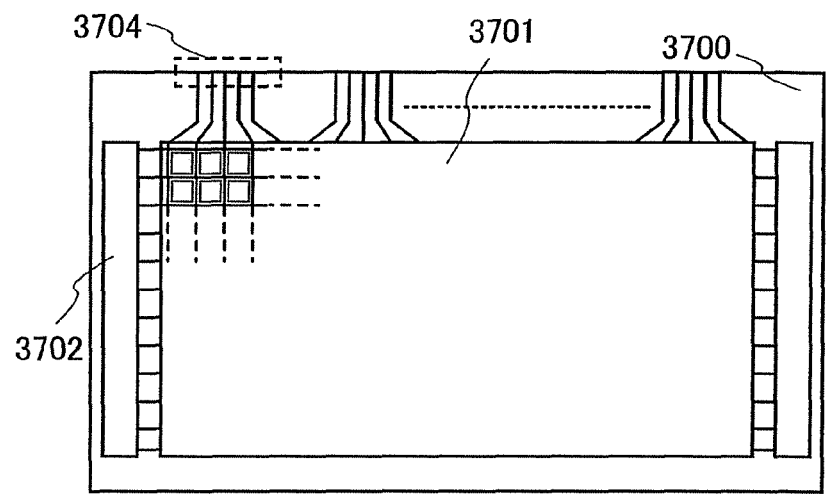

When a TFT provided in a pixel is formed of a crystalline semiconductor, a scan line driver circuit 3702 can be formed over a substrate 3700 as shown in FIG. 17B. In FIG. 17B, a pixel portion 3701 is controlled by an external driver circuit connected to a signal line input terminal 3704, similarly to FIG. 17A. In the case where a TFT provided in a pixel is formed using a polycrystalline (microcrystalline) semiconductor, a single crystal semiconductor, or the like with high mobility, a pixel portion 4701, a scan line driver circuit 4702, and a signal line driver circuit 4704 can be formed over a substrate 4700 as shown in FIG. 17C.

Figure 17C:
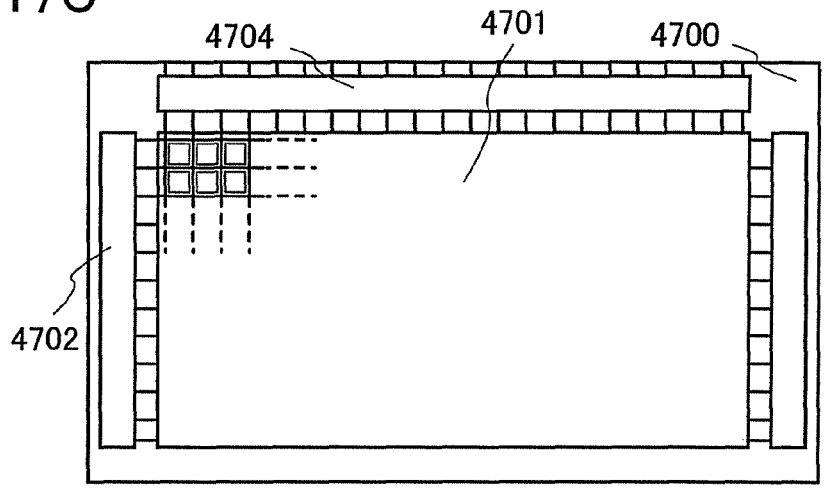

In FIG. 19, a display panel can be formed in any mode as follows: as the structure shown in FIG. 17A, only a pixel portion 901 is formed, and a scan line driver circuit 903 and a signal line driver circuit 902 are mounted by a TAB method as shown in FIG. 18B or by a COG method as shown in FIG. 18A; a TFT is formed, and a pixel portion 901 and a scan line driver circuit 903 are formed over a substrate, and a signal line driver circuit 902 is separately mounted as a driver IC as shown in FIG. 17B; a pixel portion 901, a signal line driver circuit 902, and a scan line driver circuit 903 are formed over one substrate as shown in FIG. 17C; and the like.

As another external circuit in FIG. 19, a video signal amplifier circuit 905 which amplifies a video signal among signals received by a tuner 904, a video signal processing circuit 906 which converts the signals outputted from the video signal amplifier circuit 905 into chrominance signals corresponding to colors of red, green, and blue, a control circuit 907 which converts the video signal into an input specification of the driver IC, and the like are provided on an input side of the video signal. The control circuit 907 outputs a signal to each of the scan line side and the signal line side. In the case of digital drive, a signal dividing circuit 908 may be provided on the signal line side and an input digital signal may be divided into m pieces and supplied.

Among signals received by the tuner 904, an audio signal is transmitted to an audio signal amplifier circuit 909, and the output thereof is supplied to a speaker 913 through an audio signal processing circuit 910. A control circuit 911 receives control information of a receiving station (reception frequency) or sound volume from an input portion 912 and transmits signals to the tuner 904 or the audio signal processing circuit 910.

Figure 6A:
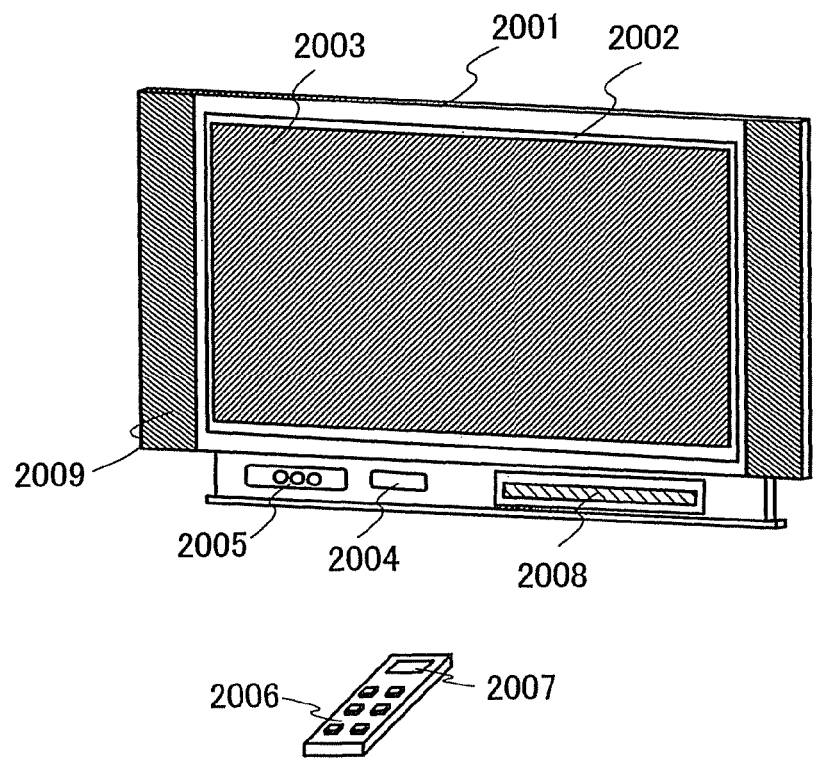
FIGS. 6A and 6B each illustrate an electronic device of the present invention.
Figure 6B:
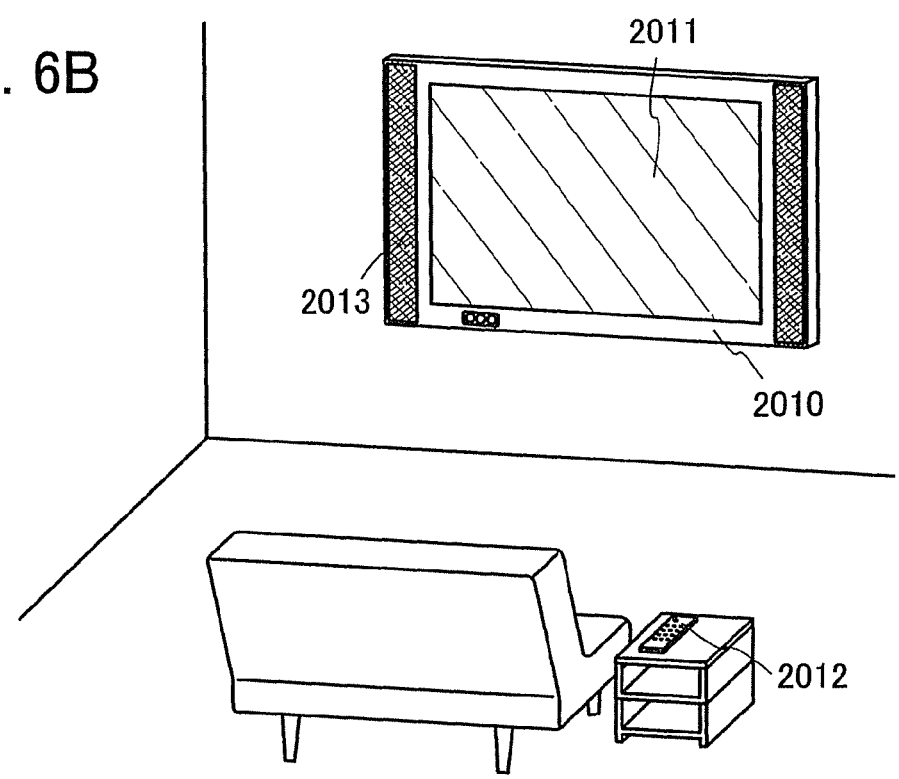

By incorporating these display modules as shown in FIGS. 6A and 6B, a television device can be completed. When a liquid crystal display module is used as a display module, a liquid crystal television set can be manufactured. When an EL display module is used, an EL television set can be manufactured. In FIG. 6A, a main screen 2003 is formed by a display module, and the main screen 2003 is also equipped with speakers 2009, operation switches, and the like as accessory equipment. Thus, a television device can be completed in accordance with the present invention.

A display panel 2002 is incorporated in a chassis 2001 and a receiver 2005 used to receive general TV broadcast and further, is connected to a communication network by wired or wireless connections via a modem 2004 so that one-way (from a sender to a receiver) or two-way (between a sender and a receiver or between receivers) information communication can be carried out. The television device can be operated by using a switch built in the chassis or a remote control unit 2006. A display portion 2007 for displaying output information may also be provided in the remote control unit 2006.

Further, the television device may include a sub-screen 2008 formed using a second display panel to display channels, volume, or the like, in addition to the main screen 2003. In this structure, both the main screen 2003 and the sub-screen 2008 can be formed using the liquid crystal display panel of the present invention. Alternatively, the main screen 2003 may be formed using an EL display panel having a wide viewing angle, and the sub-screen 2008 may be formed using a liquid crystal display panel capable of displaying images with less power consumption. In order to prioritize less power consumption, a structure in which the main screen 2003 is formed using a liquid crystal display panel, the sub-screen 2008 is formed using an EL display panel, and the sub-screen is able to turned on or off may also be employed. By the present invention, a highly reliable display device can be manufactured even with the use of such a large substrate, and many TFTs and electronic components.

FIG. 6B shows a television device having a large-sized display portion, for example, a 20 to 80-inch display portion. The television device includes a chassis 2010, a display portion 2011, a remote control device 2012 that is an operation portion, a speaker portion 2013, and the like. The present invention is applied to the display portion 2011. The television device shown in FIG. 6B is a wall-hanging type, and does not need a wide space where the television is set. Since an electrode layer used for a display element in accordance with the present invention can be formed by a wet process, even a television device having such a large display portion as in FIGS. 6A and 6B can be manufactured at low cost with high productivity.

Naturally, the present invention is not limited to the television device, and can be applied to various use applications as a large-sized display medium such as an information display board at a train station, an airport, or the like, or an advertisement display board on the street, as well as a monitor of a personal computer.

This embodiment mode can be combined with any of Embodiment Modes 1 to 6 as appropriate.

Embodiment Mode 8

Examples of electronic devices in accordance with the present invention are as follows: television devices (also referred to as simply a television, or a television receiver), cameras such as a digital camera and a digital video camera, portable information terminal devices such as a cellular phone device (simply also referred to as a cellular phone or a cell-phone) and a PDA, portable game machines, computer monitors, computers, sound reproducing devices such as car audio systems, image reproducing devices including a recording medium, such as a home-use game machine, and the like. In addition, the present invention can be applied to any gaming machine having a display device, such as a pachinko machine, a slot machine, a pinball machine, or a large-sized game machine. Specific examples are described with reference to FIGS. 12A to 12F.

Figure 12A:
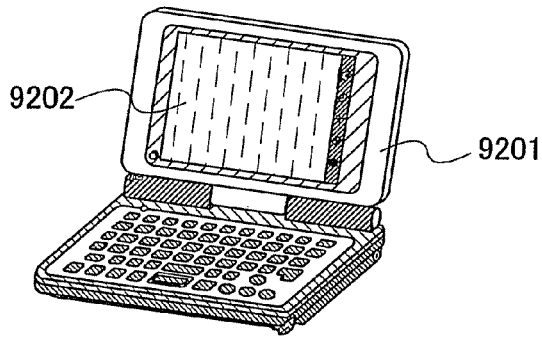
FIGS. 12A to 12F each illustrate an electronic device of the present invention.

A portable information terminal device shown in FIG. 12A includes a main body 9201, a display portion 9202, and the like. The display device of the present invention can be applied to the display portion 9202. As a result, a high-performance and high reliability portable information terminal device which can display a high-quality image can be provided.

Figure 12B:
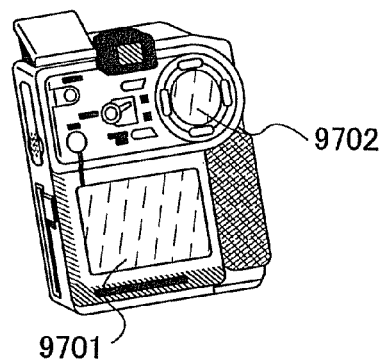

A digital video camera shown in FIG. 12B includes a display portion 9701, a display portion 9702, and the like. The display device of the present invention can be applied to the display portion 9701. As a result, a high-performance and high reliability digital video camera which can display a high-quality image can be provided.

Figure 12C:
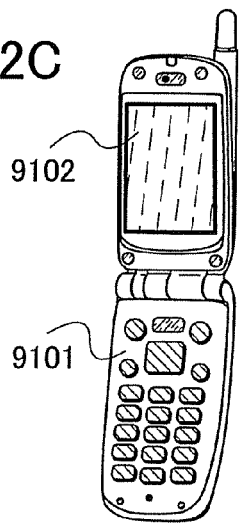

A cellular phone shown in FIG. 12C includes a main body 9101, a display portion 9102, and the like. The display device of the present invention can be applied to the display portion 9102. As a result, a high-performance and highly reliable cellular phone on which high quality images can be displayed can be provided.

Figure 12D:
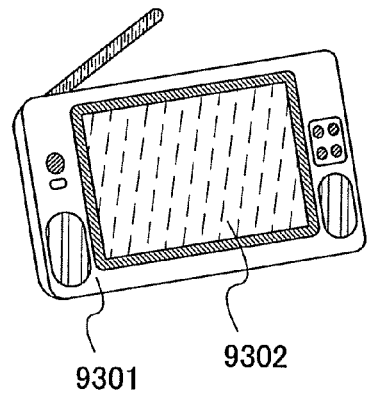

A portable television device shown in FIG. 12D includes a main body 9301, a display portion 9302, and the like. The display device of the present invention can be applied to the display portion 9302. As a result, a high-performance and high reliability portable television device which can display a high-quality image can be provided. The display device of the present invention can be applied to a wide range of television devices ranging from a small-sized television device mounted on a portable terminal such as a cellular phone, a medium-sized television device which can be carried, to a large-sized (for example, 40-inch or larger) television device.

Figure 12E:
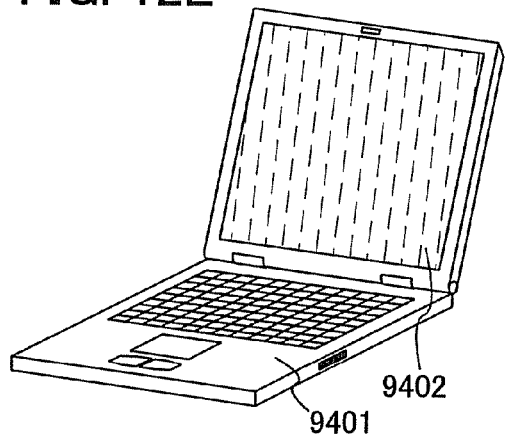

The portable computer shown in FIG. 12E includes a main body 9401, a display portion 9402, and the like. The display device of the present invention can be applied to the display portion 9402. As a result, a high-performance and highly reliable portable computer which can display high quality images can be provided.

Figure 12F:
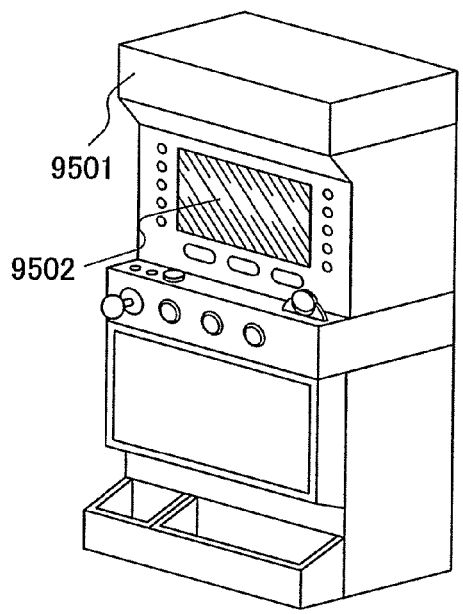

A slot machine shown in FIG. 12F includes a main body 9501, a display portion 9502, and the like. The display device of the present invention can be applied to the display portion 9502. As a result, a high-performance and high reliability slot machine which can display a high-quality image can be provided.

Further, a display device which uses a self-luminous display element (a light-emitting display device) according to the present invention can be used as a light device. The display device to which the present invention is applied can also be used as a small table lamp or a large-scale lighting system in a room. Further, the light-emitting display device of the present invention can also be used as the backlight of a liquid crystal display device. The light-emitting display device of the present invention is used as the backlight of the liquid crystal display device, so that the liquid crystal display device can achieve higher reliability. The light-emitting display device of the present invention is a plane-emission lighting system and can be increased in size. Therefore, it becomes possible to increase the size of a backlight and also a liquid crystal display device. Further, since the light-emitting display device of the present invention is thin, the liquid crystal display device can be made to be thin.

As described above, a high-performance and high reliability electronic device which can display a high-quality image can be provided by using the display device of the present invention.

This embodiment mode can be combined with any of Embodiment Modes 1 to 7 as appropriate.

Embodiment 1

In this embodiment, results obtained by evaluating change in liquid repellency at a surface of a layer including an organic compound by liquid repellent treatment is shown. The evaluation was performed by measurement of contact angles of pure water.

A polyimide film and an acrylic resin film were formed using polyimide and an acrylic resin, respectively, as organic compounds. The polyimide film was formed by applying polyimide by a spin coating method and then performing drying at 90° C. for 2 minutes and baking at 200° C. for 30 minutes. The acrylic resin film was formed by applying an acrylic resin by a spin coating method and then performing drying at 90° C. for 2 minutes.

Figure 20:
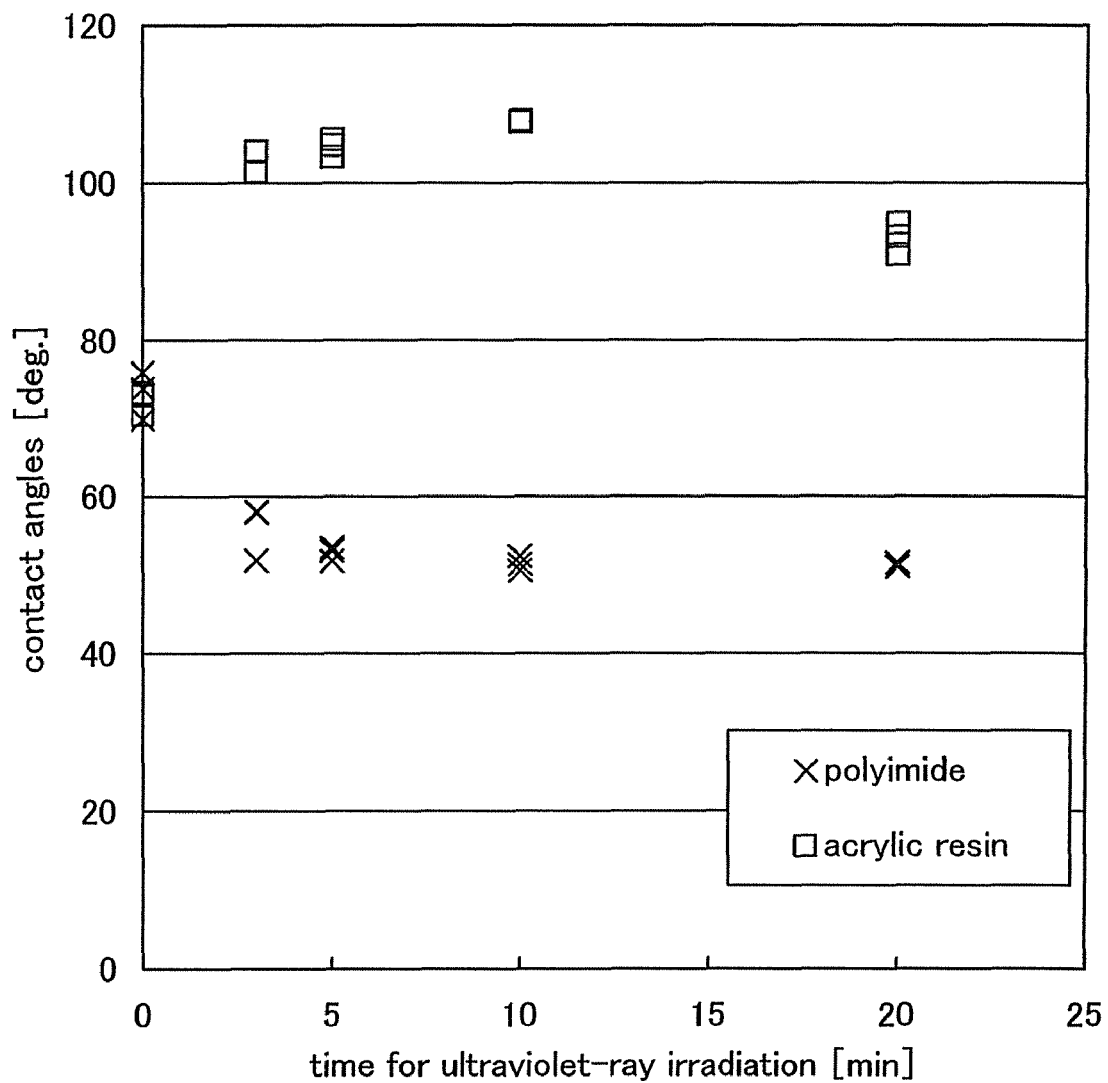
FIG. 20 is a graph showing a measurement result of contact angles in Embodiment 1.

The polyimide film and the acrylic resin film which had been formed were irradiated with an ultraviolet ray in the oxidative atmosphere, so that an FAS film was formed (by a gas phase method at 120° C. for 30 minutes in the nitrogen atmosphere as the film-formation conditions). The FAS film was dipped in hydrofluoroether and dipped in ethanol, and thereafter, contact angles of pure water with the surface were measured. The measurement of contact angles was performed using an FTÅ125 dynamic contact angle analyzer (manufactured by First Ten Ångstroms, Inc.). The time for ultraviolet-ray irradiation in the atmosphere containing oxygen were set for 3 minutes, 5 minutes, 10 minutes, and 20 minutes. The measurements were performed at three points in each condition of time. Note that ultraviolet-ray irradiation was performed in the ozone atmosphere as the atmosphere containing oxygen in this embodiment. FIG. 20 shows relations between contact angles and the time for the ultraviolet-ray irradiation of each of the polyimide film and the acrylic resin film on which liquid repellent treatment was performed.

In FIG. 20, contact angles on the surface of the polyimide film are indicated by x-shaped data markers, and contact angles on the surface of the acrylic resin film are indicated by square data markers. In the case where ultraviolet-ray irradiation in the atmosphere containing oxygen is not performed (that is, the time for ultraviolet-ray irradiation is 0 minute), contact angles on the surface of the polyimide film and contact angles on the surface of the acrylic resin film are approximately the same. In the case where the time for ultraviolet-ray irradiation is set for 3 minutes, 5 minutes, 10 minutes, and 20 minutes, the contact angle on the acrylic resin film increases by the ultraviolet-ray irradiation and the acrylic resin film has liquid repellency whereas the contact angle on the polyimide film decreases by the ultraviolet-ray irradiation and the polyimide film has a lyophilic property. As a result, it is found that there is a difference in the contact angles of about 40 degree between the surface of the acrylic resin film and the surface of the polyimide film by the liquid repellent treatment including the ultraviolet-ray irradiation.

From the above results, the following consideration can be obtained. An oxide layer is formed on each surface of the polyimide film and the acrylic resin film by the ultraviolet-ray irradiation in the atmosphere containing oxygen. In the polyimide which has a C—N bond or a C—O bond in the main chain, the bond at the C—N bond or the C—O bond is divided by the ultraviolet-ray irradiation, and an oxide layer of low molecules with a molecular weight of about 100 to 10000 is formed. A carbon fluoride layer is formed over the oxide layer of low molecules on the surface of the polyimide film. Because of low molecules, the oxide layer on the surface of the polyimide film is removed together with the carbon fluoride layer by the washing step using an organic solvent, whereby the fluorine density of the surface of the polyimide film is decreased, and the surface of the polyimide film has a lyophilic property. The fluorine density of the surface of the acrylic resin film is increased because the oxide layer on its surface has low solubility to the organic solvent used in the washing step, whereby the surface of the acrylic resin film can have higher liquid repellency. Accordingly, by the liquid repellent treatment of this embodiment, a difference can be made in liquid repellency between the acrylic resin film and the polyimide film.

According to the results of this embodiment, it was proved that the acrylic resin has higher liquid repellency than the polyimide which has a C—N bond or a C—O bond in the main chain by the liquid repellent treatment of the present invention. By performance of the liquid repellent treatment of the present invention in such a manner, regions which have different liquid repellency from each other can be formed using layers including organic compounds, and control of liquid repellency can be conducted.

Embodiment 2

In this embodiment, results obtained by evaluating surface conditions of a layer including an organic compound in each step of liquid repellent treatment which is performed on the layer including an organic compound is shown. The evaluation was performed by measurement using X-ray photoelectron spectroscopy (XPS).

As organic compounds, polyimide (samples A1 to A4) and acrylic resins (samples B1 to B4) were used. In conditions 1 to 4 as manufacturing conditions, quantitative analysis of elements on surfaces was performed by an XPS method after each of the following steps of conditions 1 to 4. The analysis depth was about 5 nm. The conditions 1 (A1 and B1) indicate surface states of the samples where films are formed by applying each resin material by a spin coating method and drying the material. The conditions 2 (A2 and B2) indicate surface states of the samples where films are formed by applying each resin material by a spin coating method and drying the material, and then the films are irradiated with an ultraviolet ray for 10 minutes in the atmosphere containing oxygen. The conditions 3 (A3 and B3) indicate surface state of the samples where films are formed by applying each resin material by a spin coating method and drying the material; the films are irradiated with an ultraviolet ray for 10 minutes in the atmosphere containing oxygen; an FAS film is formed over each layer (by a gas phase method at 120° C. for 30 minutes in the nitrogen atmosphere as the formation conditions); and the films provided with the FAS film are dipped in hydrofluoroether and then dipped in ethanol. The conditions 4 (A4 and B4) indicate surface states of the samples where films are formed by applying each resin material by a spin coating method and drying the material; and the films are irradiated with an ultraviolet ray for 10 minutes in the atmosphere containing oxygen, and dipped in ethanol. In this embodiment, ultraviolet-ray irradiation was performed in the ozone atmosphere as the atmosphere containing oxygen. Table 1 shows results of quantitative analysis of elements on the surfaces of the samples (the samples A1 to A4 and the samples B1 to B4).

TABLE 1

| samples | conditions | quantitative value (atomic %) | | | | | |
|---|---|---|---|---|---|---|---|
| | | C | O | N | F | Si | S |
| A1 | condition 1 | 72.1 | 17.9 | 3.6 | 5.8 | 0 | 0.6 |
| A2 | condition 2 | 54.9 | 31.6 | 4.6 | 7.9 | 0.2 | 0.8 |
| A3 | condition 3 | 64.4 | 21.5 | 4.5 | 9.1 | 0.1 | 0.4 |
| A4 | condition 4 | 67.2 | 21.3 | 3.9 | 7.1 | 0.1 | 0.4 |
| B1 | condition 1 | 71.8 | 25.8 | 1 | 1.4 | 0 | 0 |
| B2 | condition 2 | 60 | 36.9 | 2.2 | 0.4 | 0.4 | 0 |
| B3 | condition 3 | 56.2 | 26 | 0.8 | 16.2 | 0.8 | 0 |
| B4 | condition 4 | 62.5 | 36.3 | 1 | 0.2 | 0 | 0 |

According to Table 1, the following can be revealed. When the samples A 1 and B1 are compared with the samples A2 and B2, in both the polyimide (A2) and the acrylic resin (B2), the amount of oxygen is increased by the ultraviolet-ray irradiation in the atmosphere containing oxygen, and their surfaces are oxidized, so that an oxide layer is formed thereon. When the samples A2 and B2 are compared with the samples A4 and B4, by ethanol washing after the ultraviolet-ray irradiation in the atmosphere containing oxygen, an oxide layer of the polyimide (A4) is dissolved, and an oxide layer of the acrylic resin (B4) is not dissolved. When the samples A1 and B1 are compared with the samples A3 and B3, in accordance with the amount of fluorine, the amount of adsorption of an FAS to the acrylic resin (A3) is larger than that of an FAS to the polyimide (B3).

According to the above results, the following consideration can be obtained. The surfaces of the acrylic resin and the polyimide are oxidized by the ultraviolet-ray irradiation in the atmosphere containing oxygen, and an FAS containing carbon fluoride is adsorbed over each oxide layer. However, in the polyimide, the oxide layer is dissolved by ethanol washing; therefore, the FAS formed over the oxide layer is removed.

Accordingly, since a large quantity of the FAS containing carbon fluoride exhibiting liquid repellency is left over the surface of the acrylic resin, as compared with the polyimide which has a C—N bond or a C—O bond in the main chain, it was proved that the acrylic resin has higher liquid repellency.

By performance of the liquid repellent treatment of the present invention in such a manner, regions which have different liquid repellency from each other can be formed using layers including organic compounds, and control of liquid repellency can be conducted.

This application is based on Japanese Patent Application serial no. 2007-265334 filed with Japan Patent Office on Oct. 11, 2007, the entire contents of which are hereby incorporated by reference.

What is claimed is:

1. A method for manufacturing a display device comprising the steps of:
    forming a layer including a first organic compound;
    forming a layer including a second organic compound which has an opening over the layer including the first organic compound;
    irradiating the layer including the first organic compound and the layer including the second organic compound with light;
    forming a carbon fluoride layer over the layer including the first organic compound and the layer including the second organic compound after the irradiating step;
    removing the carbon fluoride layer over the layer including the first organic compound by using an organic solvent, wherein the carbon fluoride layer over the layer including the second organic compound remains; and
    forming a function layer by discharging a composition to the opening,
    wherein the first organic compound has a carbon-nitrogen bond or a carbon-oxygen bond in a main chain.

2. The method for manufacturing the display device according to claim 1, wherein the composition is a material for forming a coloring layer.

3. The method for manufacturing the display device according to claim 1, wherein the composition is a conductive material.

4. The method for manufacturing the display device according to claim 1, wherein the organic solvent is an alcohol.

5. A method for manufacturing a display device comprising the steps of
    forming a layer including a first organic compound;
    forming a layer including a second organic compound which has an opening over the layer including the first organic compound;
    irradiating the layer including the first organic compound and the layer including the second organic compound with light to form an oxide layer over the layer including the first organic compound and the layer including the second organic compound;
    forming a carbon fluoride layer over the oxide layer;
    removing the oxide layer and the carbon fluoride layer over the layer including the first organic compound by using an organic solvent, wherein the carbon fluoride layer over the layer including the second organic compound remains; and
    forming a function layer by discharging a composition to the opening,
    wherein the first organic compound has a carbon-nitrogen bond or a carbon-oxygen bond in a main chain.

6. The method for manufacturing the display device according to claim 5, wherein the composition is a material for forming a coloring layer.

7. The method for manufacturing the display device according to claim 5, wherein the composition is a conductive material.

8. The method for manufacturing the display device according to claim 5, wherein the organic solvent is an alcohol.

9. A method for manufacturing a display device comprising the steps of:
   forming a layer including a first organic compound;
   forming a layer including a second organic compound which has an opening over the layer including the first organic compound;
   irradiating the layer including the first organic compound and the layer including the second organic compound with light;
   forming a carbon fluoride layer over the layer including the first organic compound and the layer including the second organic compound after the irradiating step;
   removing the carbon fluoride layer selectively by using an organic solvent, wherein the carbon fluoride layer over the layer including the second organic compound remains; and
   forming a function layer by discharging a composition to the opening so that a top surface of the function layer is higher than a top surface of the layer including the second organic compound,
   wherein the first organic compound has a carbon-nitrogen bond or a carbon-oxygen bond in a main chain.

10. The method for manufacturing the display device according to claim 9, wherein the composition is a material for forming a coloring layer.

11. The method for manufacturing the display device according to claim 9, wherein the composition is a conductive material.

12. The method for manufacturing the display device according to claim 9, wherein the organic solvent is an alcohol.

13. A method for manufacturing a display device comprising the steps of:
   forming a layer including a first organic compound;
   forming a layer including a second organic compound which has an opening over the layer including the first organic compound;
   irradiating the layer including the first organic compound and the layer including the second organic compound with light to form an oxide layer over the layer including the first organic compound and the layer including the second organic compound;
   forming a carbon fluoride layer over the oxide layer;
   removing the oxide layer and the carbon fluoride layer selectively by using an organic solvent, wherein the carbon fluoride layer over the layer including the second organic compound remains; and
   forming a function layer by discharging a composition to the opening so that a top surface of the function layer is higher than a top surface of the layer including the second organic compound,
   wherein the first organic compound has a carbon-nitrogen bond or a carbon-oxygen bond in a main chain.

14. The method for manufacturing the display device according to claim 13, wherein the composition is a material for forming a coloring layer.

15. The method for manufacturing the display device according to claim 13, wherein the composition is a conductive material.

16. The method for manufacturing the display device according to claim 13, wherein the organic solvent is an alcohol.

17. The method for manufacturing the display device according to claim 1, wherein the light includes an ultraviolet ray, and the irradiating step is conducted in an oxygen atmosphere.

18. The method for manufacturing the display device according to claim 5, wherein the light includes an ultraviolet ray, and the irradiating step is conducted in an oxygen atmosphere.

19. The method for manufacturing the display device according to claim 9, wherein the light includes an ultraviolet ray, and the irradiating step is conducted in an oxygen atmosphere.

20. The method for manufacturing the display device according to claim 13, wherein the light includes an ultraviolet ray, and the irradiating step is conducted in an oxygen atmosphere.

* * * * *